United States Patent
Jun et al.

(10) Patent No.: US 8,378,708 B2
(45) Date of Patent: Feb. 19, 2013

(54) INSPECTING METHOD USING AN ELECTRO OPTICAL DETECTOR

(75) Inventors: Jin Kook Jun, Uiwang-si (KR); Hyung Il Jeon, Yongin-si (KR); Young Hoon Kim, Yongin-si (KR); Young Shik Park, Icheon-si (KR); Young Ryong Yoon, Yongin-si (KR); Myung Gi Seo, Icheon-si (KR); Dae Joong Yoon, Icheon-si (KR)

(73) Assignee: Okins Electronics Co., Ltd (KR)

( * ) Notice: Subject to any disclaimer, the term of this patent is extended or adjusted under 35 U.S.C. 154(b) by 653 days.

(21) Appl. No.: 12/443,793

(22) PCT Filed: Mar. 7, 2008

(86) PCT No.: PCT/KR2008/001311
§ 371 (c)(1),
(2), (4) Date: Mar. 8, 2010

(87) PCT Pub. No.: WO2008/126988
PCT Pub. Date: Oct. 23, 2008

(65) Prior Publication Data
US 2010/0177313 A1    Jul. 15, 2010

(30) Foreign Application Priority Data

| Apr. 17, 2007 | (KR) | 10-2007-0037317 |
| Jul. 4, 2007 | (KR) | 10-2007-0066928 |
| Jul. 4, 2007 | (KR) | 10-2007-0066929 |
| Jul. 19, 2007 | (KR) | 10-2007-0072046 |
| Nov. 26, 2007 | (KR) | 10-2007-0120673 |
| Nov. 26, 2007 | (KR) | 10-2007-0120674 |
| Dec. 13, 2007 | (KR) | 10-2007-0129657 |

(51) Int. Cl.
*G01R 31/02* (2006.01)

(52) U.S. Cl. ............... 324/762.01; 324/760.02; 324/500

(58) Field of Classification Search ........................ None
See application file for complete search history.

(56) References Cited

U.S. PATENT DOCUMENTS

| 5,260,818 | A | 11/1993 | Wu |
| 5,280,374 | A | 1/1994 | Nakai et al. |
| 5,406,213 | A | 4/1995 | Henley |
| 6,618,115 | B1 | 9/2003 | Hiroki |
| 7,659,947 | B2 * | 2/2010 | Arao .............................. 349/46 |
| 7,851,797 | B2 * | 12/2010 | Yamazaki et al. .............. 257/59 |

* cited by examiner

*Primary Examiner* — Jermele M Hollington
*Assistant Examiner* — Trung Nguyen
(74) *Attorney, Agent, or Firm* — The Farrell Law Firm, P.C.

(57) ABSTRACT

An inspecting method using an electro-optical detecting device is disclosed. The electro-optical detecting device includes: an upper substrate and a lower substrate; a nematic liquid crystal layer interposed between the upper substrate and the lower substrate; a transparent electrode interposed between the nematic liquid crystal layer and the upper substrate, the transparent electrode connected to a device under test (DUT) via a power supply; a polarizing plate located over the nematic liquid crystal layer; and a reflecting plate located under the nematic liquid crystal layer. A method using the electro-optical detecting device includes applying a voltage between the transparent electrode and the DUT to generate an electric field across the liquid crystal layer; illuminating the detector and capturing an image of the detector using the light reflected from the detector; and determining the DUT has some defects from the image of the detector by an abnormal electric field generated between the transparent electrode and the DUT.

24 Claims, 39 Drawing Sheets

BRIDGE BUMP

MISSING BUMP

BUMP SCRATCH

BUMP MISALIGNMENT $(W_1 > W_2)$ $(\ell_3 < \ell_1 < \ell_2)$ (m)

$(W_3 > W_4)$
$(\ell_9 < \ell_7 < \ell_8)$ (n)

$(W_5 > W_6)$
$(\ell_{15} < \ell_{13} < \ell_{14})$ (m')

(n')

INSPECTING METHOD USING AN ELECTRO OPTICAL DETECTOR

TECHNICAL FIELD

The present invention relates to an inspecting method using an electro-optic testing device, and more particularly to an inspecting method capable of optically determining an occurrence of an electrical error in a device under test (DUT).

BACKGROUND ART

In recent years, the appearance of small, multifunctional electronic parts of a device permitted the device to become smaller and have more functions.

Interconnects to apply electrical signal is to the electric parts became ultra-small correspondingly.

However, this reduction in size also caused a side effect on interconnects, such as open circuits, and increased the incidence of failure in the device.

Various devices and methods have been suggested to test defects on interconnects in devices, which occurs after the device has been manufactured.

Conventionally, optical microscopes have been commonly used to examine defects in a pattern. However, the optical microscope has a problem it may confuse defects in a pattern with contaminants residing on the surface of a DUT. Moreover, the DUT needs to be dismantled to detect inner defects.

Also, it takes fairly much time to perform a test since each of multiple circuit patterns should be examined by an operator, and the results of the test may change depending on the operator's skills.

U.S. Pat. No. 5,106,213 discloses a device for testing a flat display device using polymer dispersed liquid crystal (PDLC), which includes a reflecting film (not shown in drawings), a lower indium tin oxide (ITO) electrode (not shown in drawing), a PDLC electrode layer (not shown in drawings), and an upper ITO electrode (not shown in drawings) stacked in this order.

PDLC molecules are randomly arranged when no voltage is applied between the upper ITO electrode and the down ITO electrode. Accordingly, the incident light from the upper ITO electrode is dispersed at the upper ITO electrode.

When a voltage is applied between the upper ITO electrode and the lower ITO electrode, the PDLC molecules are uniformly arranged, and therefore, the incident light from the upper ITO electrode passes through the upper ITO electrode, the PDLC layer, and the lower ITO electrode in the order thereof, and then reflects by the reflecting layer.

It can be determined whether or not there are defects on each circuit corresponding to each pixel of a flat display device by the above operation principle.

The testing device is placed on the surface of a flat display device (not shown) on which a plurality of pixels are arranged in a matrix, as being spaced from the surface of the flat display device by a constant distance. A high level voltage is applied between the flat display device and the testing device.

No electric field is generated at the PDLC layer around a bad pixel region since a TFT corresponding to the bad pixel region does not have a good electrical property around the bad pixel region. As a result, the molecules in the PDLC layer a round the bad pixel region are not arranged in a uniform manner, and this leads to deterioration in reflectivity of the testing device around the bad pixel region.

On the contrary, a TFT corresponding to a normal pixel region has a good electrical property around the normal pixel region, and therefore, electric fields may be easily generated at the PDLC layer around the normal pixel region. Accordingly, the PDLC molecules are uniformly arranged around the normal pixel region and the reflectivity of the testing device increases around the normal pixel region.

A pre-installed charge-coupled device (CCD) camera generates an electrical signal corresponding to the intensity of light reflected by the testing device.

A pre-installed image processor converts the electrical signal transmitted from the CCD camera into an image.

However, it is necessary to keep the testing device spaced from the DUT, i.e. the flat display device, by several micrometers to make the PDLC molecules react with electric fields. Accordingly, the testing device could be damaged by minute particles residing on the flat display device.

In terms of a property of the PDLC, its lowered sensitivity causes a necessity of applying a high-level voltage between the flat display device and the testing device to compensate for it. And, the distance between the testing device and the flat display device needs to be small since a weak electric field is produced in spite of the application of a high-level voltage between the flat display device and the testing device. As a consequence, the testing device is damaged by minute particles residing on the flat display device because the distance between the testing device and the flat display device is narrow as described above.

DISCLOSURE

[Technical Problem]

An aspect of the present invention provides an inspecting method using a testing device that tests a defect on a DUT in an electro-optical manner.

Another aspect of the present invention provides an inspecting method using an electro-optical testing device having a good sensitivity against electric fields and a reduced self-defect rate.

Still another aspect of the present invention provides an inspecting method using a testing device capable of electro-optically testing electrical and structural defects in various devices.

[Technical Solution]

To solve the above technical problems the present invention provides an electro-optical test method using a detector including: an upper substrate and a lower substrate; a nematic liquid crystal layer interposed between the upper substrate and the lower substrate; a transparent electrode interposed between the nematic liquid crystal layer and the upper substrate, the transparent electrode connected to a crevice under test (DUT) via a power supply; a polarizing plate located over the nematic liquid crystal layer; and a reflecting plate located under the nematic liquid crystal layer.

In an aspect of the present invention, the method includes applying a voltage between the transparent electrode and the DUT to generate an electric field across the liquid crystal layer; illuminating the detector and capturing an image of the detector using the light reflected from the detector; and determining the DUT has some defects from the image of the detector by an abnormal electric field generated between the transparent electrode and the DUT.

According to an aspect of the present invention, it is possible to detect whether there are any defects on wires using the detector.

A method of examining the defects includes driving the liquid crystal molecules contained in a liquid crystal layer with an electric field generated between a DUT and the detector having the liquid crystal layer; illuminating the driven liquid crystal molecules; converting the light having passed through the liquid crystal molecules into electrical signals; and detecting whether there are any defects by comparing the electrical signals to each other. The detector may examine any defects on wires while moving in a first direction with respect to the DUT.

According to an aspect of the present invention, a ball grid array package may be examined using the detector.

A method of examining the defects on the ball grid array package includes applying a voltage between a transparent electrode and a probe unit connected to a solder bump; generating an electric field between the solder bump and the transparent electrode; illuminating with light the liquid crystal molecules driven by the electric field; capturing the light with a camera to convert into electrical signals converting the electrical signals into an image via digital signals; and determining at least one of height and shape of the solder bump through the image.

According to an aspect of the present invention, a circuit board may be examined using the detector.

A method of examining the defects on the circuit board includes loading on a test socket a circuit board having a plurality of contact pads connected to elements and a plurality of terminals connected to the contact pads via wires; loading the detector on the circuit plate; applying a test voltage to the terminals according to an examination order for the terminals applying a common voltage to the transparent electrode; and examining the wires in the circuit board using an image of the detector represented by an electric field generated between the transparent electrode and the contact pads.

According to an aspect of the present invention, a tester having a plurality of probing pins may be examined using the detector.

A method of examining the detector includes arranging the detector on the upper side of a tester having a plurality of probing pins; and generating an electric field between the probing pins and the transparent electrode to rotate the liquid crystal molecules contained in the liquid crystal layer. Locations corresponding to the probing pins may be represented on the detector by illuminating the liquid crystal molecules with the light passing through the detector.

[Advantageous Effects]

The testing device may maintain a constant distance between a detector and a DUT since it optically represents whether or not there are defects on the DUT using nematic liquid crystal with a good sensitivity against electric fields. Accordingly, it can be possible to prevent any damages to the surface of the detector that may occur due to the contact of the detector with the DUT.

Moreover, it can be possible to exactly determine whether or not there is a defect on a DUT, detect its location, and prevent any damages to the DUT since the defect is examined by comparing transmittances of light passing through the liquid crystal layer of the detector from a difference in electric field produced between the DUT and detector.

BEST MODE

Figure 1:
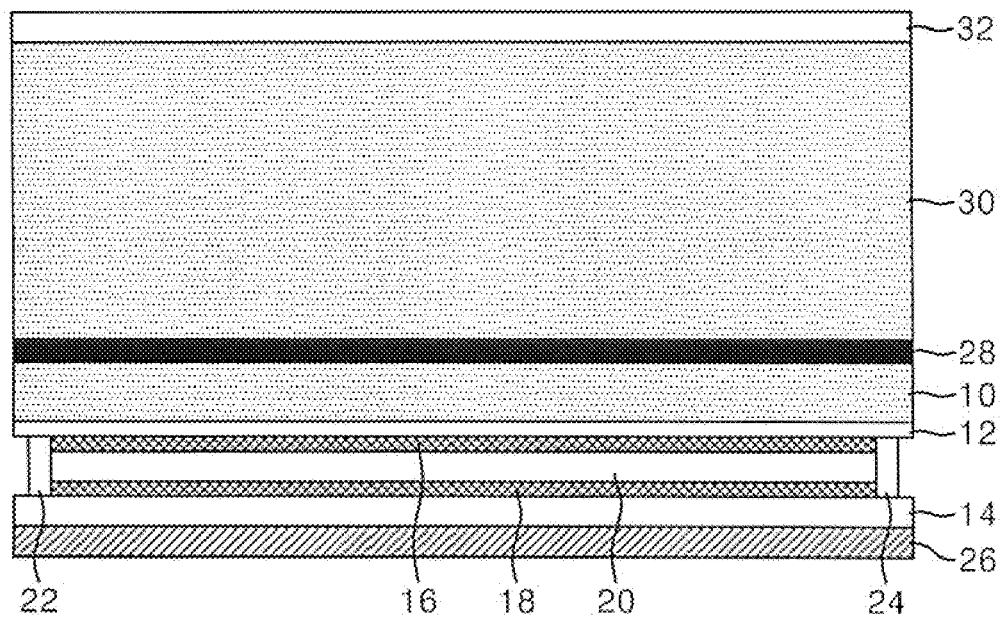
FIG. 1 is a cross sectional view of a detector included in an electro-optical testing device according to an exemplary embodiment of the present invention.

FIG. 1 is a cross sectional view of a detector included in an electro-optical testing device according to an exemplary embodiment of the present invention.

Referring to FIG. 1, the testing device includes a reflecting film 26, a lower substrate 14, a lower alignment film 18, a liquid crystal layer 20, an upper alignment film 16, a transparent electrode 12, and an upper substrate 10. The lower alignment film 18, the liquid crystal layer 20, and the upper alignment film 16 are sealed at their both sides.

A transparent block 30 is attached on the top surface of the upper substrate 10, with an attaching layer 28 interposed between the transparent block 30 and the upper substrate 10, and a polarizing plate 32 is disposed on the transparent block 30. Hereinafter, a method of manufacturing an electro-optic testing device will be described according to an exemplary embodiment of the present invention.

The transparent electrode 12 is deposited on a bottom surface of the upper substrate 10 by a thickness of about 400 Å using sputtering. The upper substrate 10 may be made of a glass substrate whose thickness is about 0.5 mm.

The transparent electrode 12 may include an indium tin oxide (ITO) film.

Figure 2:
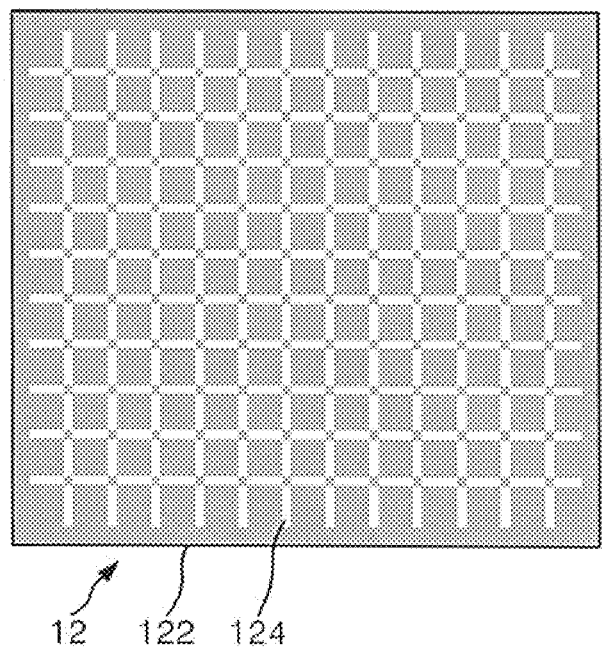
FIG. 2 is a view illustrating a transparent electrode according to an exemplary embodiment of the present invention.

Referring to FIG. 2, a plurality of rectangular pixels may be formed by performing a patterning process and an etching process on the transparent electrode 12. A size of each pixel may be 10×10 m, and an interval between two adjacent pixels may be about 5 μm.

The upper alignment film 16 is disposed on a bottom surface of the transparent electrode 12, and the lower alignment film 18 is disposed on a top surface of the lower substrate 14. The lower substrate 14 may be made of a glass substrate whose thickness is about 100 μm.

The upper alignment film 16 and the lower alignment film 18 may be formed of a polyimide film. The alignment films 16 and 18 may be missing from the periphery of the transparent electrode 12 and the lower substrate 14 for sealing.

The upper alignment film 16 and the lower alignment film 18 are rubbed. The films 16 and 18 may be rubbed at an angle of about 55 degrees for the maximum light efficiency.

The upper substrate 10 and the lower substrate 14 are arranged to face each other and spaced by a cell gap from each other. The liquid crystal layer 20 is arranged in the cell gap. A width of the cell gap may be around 3.9 μm, $\mathit{\Delta} \notin$ of the liquid crystal layer 20 about 8.8, and $\mathit{\Delta}$ n about 0.101. The liquid crystal layer 20 may include a nematic liquid crystal layer.

Both ends of the upper alignment film, 16 and lower alignment film 18 are sealed by sealants 22 and 24.

The lower substrate 14 is subject to a slimming process to have a thickness of 100 μm or less. The slimming process may include etching and polishing. The slimming process may be carried out to make the lower substrate 14 as thin as possible, or to let the lower substrate 14 have a thickness of about 80 taking into consideration any possibility of damage to the lower substrate 14 and the errors encountered in processes.

The reflecting film 26 is coated on a bottom surface of the lower substrate 14. The reflecting film 26 may reflect light having a specific wave length, for example, of about 66 nm.

Figure 3:
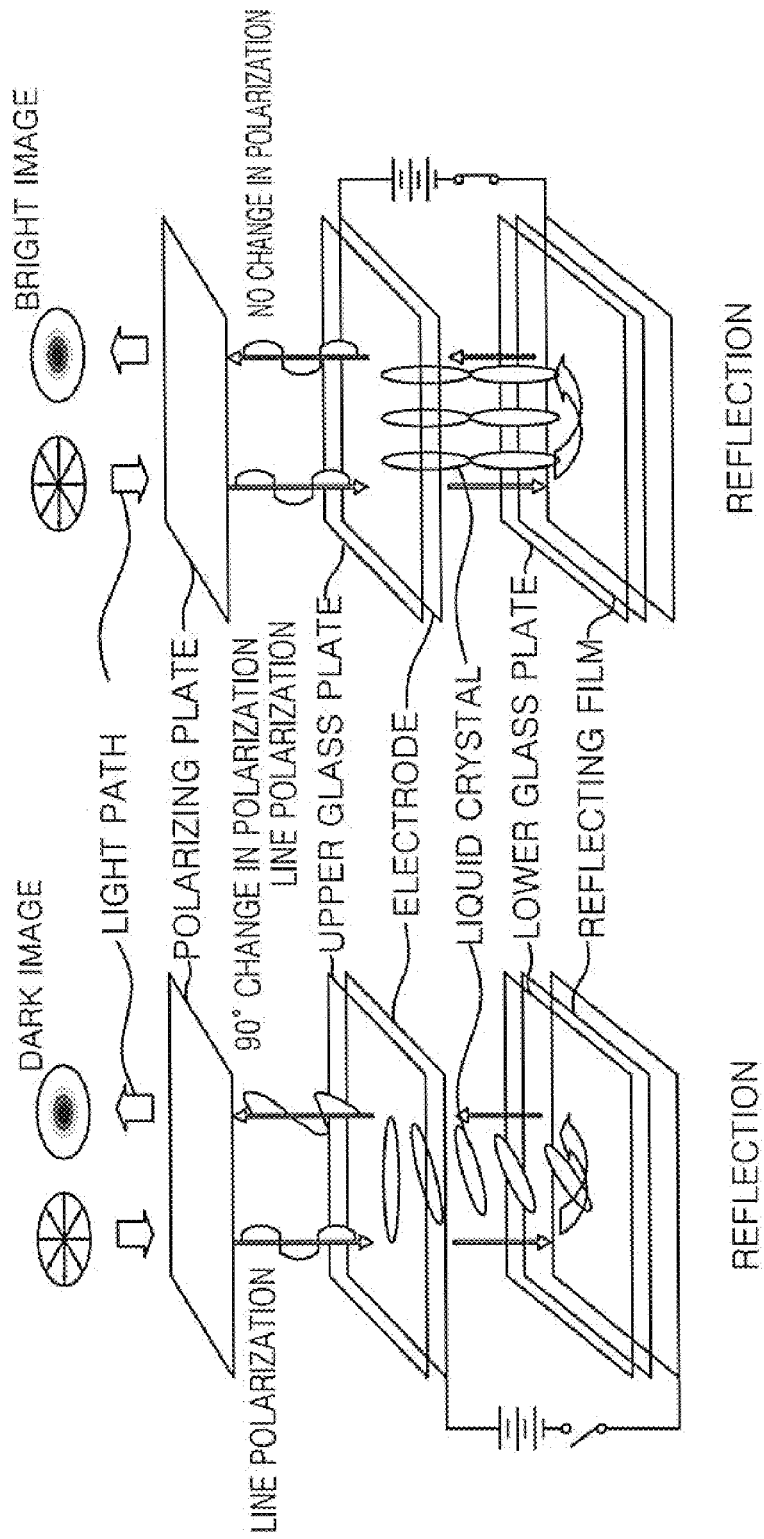
FIG. 3 is a view illustrating an operation principle of a detector included in a testing device according to an exemplary embodiment of the present invention.

FIG. 3 is a view illustrating an operation principle of a detector included in a testing device according to an exemplary embodiment of the present invention.

The left portion of FIG. 3 shows a behavior of liquid crystal molecules and a light path when no voltage is applied between the transparent electrode 12 and a flat display device for test, and the right portion when a voltage is applied between the transparent electrode 12 and the flat display device.

Referring to FIG. 3, the liquid crystal molecules maintain a twisted state and incident light can not pass through the polarizing plate 32. More specifically, the incident light passes through the liquid crystal layer 20 via the polarizing plate 32 and reflects by the reflecting film 26. The reflected light causes 90-degree change in polarization while passing through the liquid crystal layer 20 again, and there fore, the reflected light fails to pass through the polarizing plate 32.

If a voltage is applied between the transparent electrode 12 and the flat display device, liquid crystal molecules move and incident light and may pass through the polarizing plate 32.

Next, the light coming from the polarizing plate 32 passes through an optical device, is sensed by a CCD camera, and then image-processed by an image processor. A user can visually evaluate whether or not there are defects in a DUT, for example, pixels or TFTs included in a flat display device for test, from an image corresponding to the image-processed signal that appears on the screen.

Figure 4:
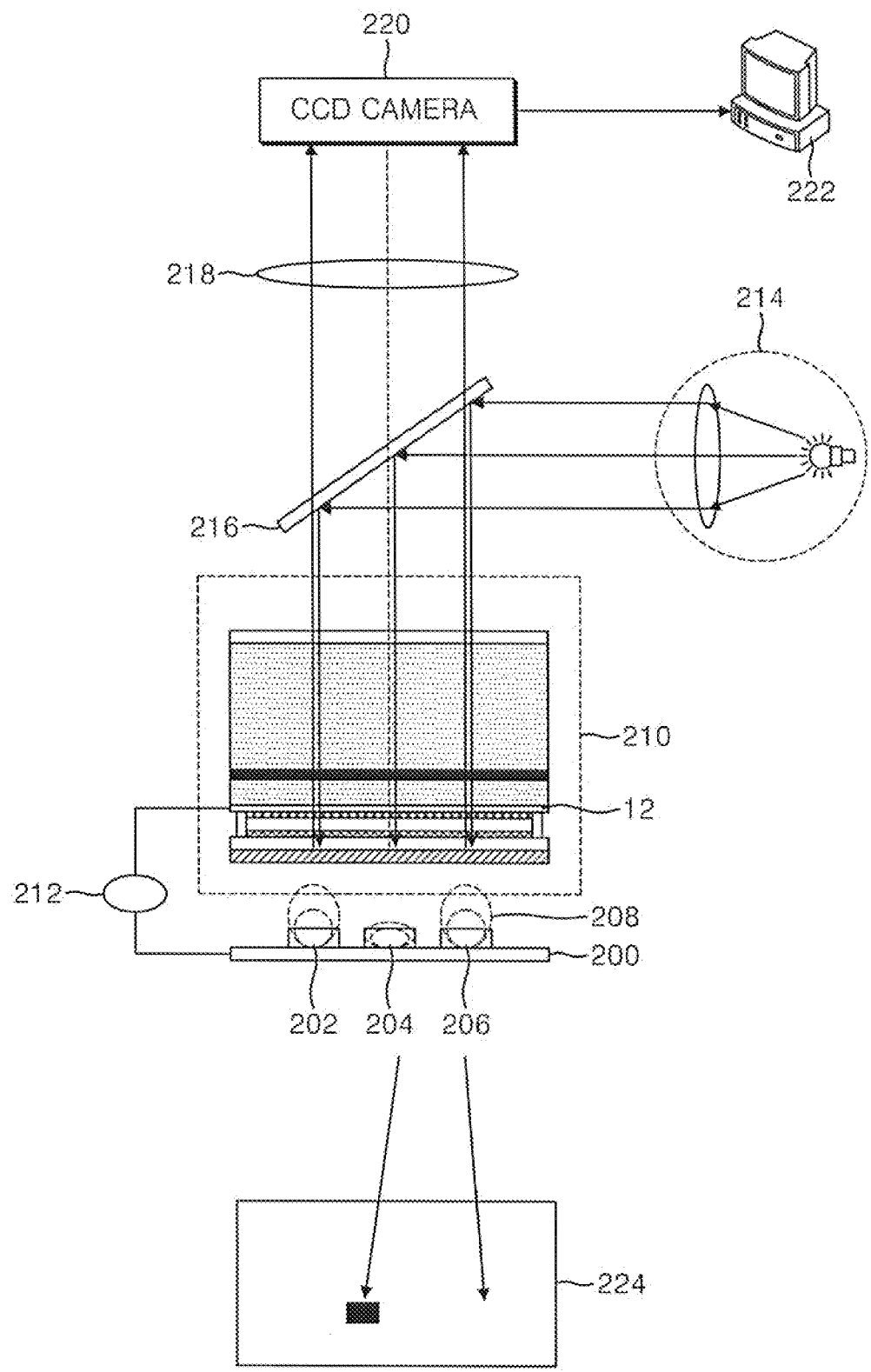
FIG. 4 is a view illustrating an electro-optical testing device according to an exemplary embodiment of the present invention.

FIG. 4 is a view illustrating an electro-optical testing device according to an exemplary embodiment of the present invention.

Referring to FIG. 1, a power supply 212 is connected between the transparent electrode 12 of a detector 210 and a pixel electrode of a flat display device 200. The power supply 212 supplies any one of a direct current (DC) voltage, an alternating-current (AC) voltage, and a pulse between the transparent electrode 12 and the pixel electrode to generate an electric field between the two electrodes.

Then, a plurality of TFTs each corresponding to each of a plurality of pixels 202, 204, and 206 arranged on the flat display device 200 are driven. The detector 210 is arranged over a surface of the flat display device 200.

As a consequence, an electric field 208 is generated between the detector 210 and each of the pixels 202, 201, and 206. A defective pixel generates an electric field different from those of the other normal pixels.

Such a difference in electric field causes a difference in reflectivity of light beams coming from a light source 214 via beam splitter 216. The light beams reflected by the detector 210 pass through a telecentric lens 218 to a CCD camera 220.

The CCD camera 220 includes a CCD element (not shown), an amplifier (not shown), and an analogue/digital (A/D) converter (not shown). The CCD element converts the light beams into electrical analogue signals. The amplifier amplifies the electrical analogue signals. The A/D converter converts the amplified electrical analogue signals into digital signals. The digital signals are transmitted to the image processor 222.

The image processor 222 performs a voltage-image process on the digital signals and, if the result of the voltage-image process has a value larger than a prescribed value, considers it as an occurrence of a had pixel, and displays the result on a screen 224.

Figure 5:
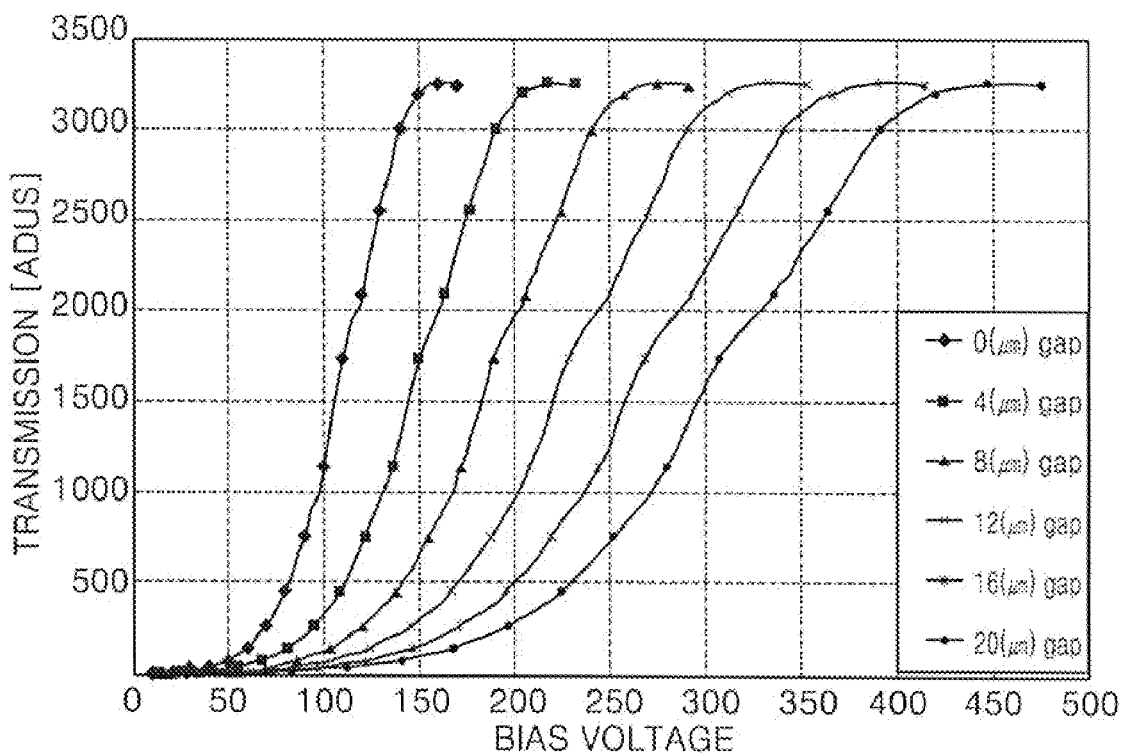
FIGS. 5 and 6 are a graph illustrating a transmittance of a detector employing PDLC according to the prior art and a graph illustrating a transmittance of a detector according to an exemplary embodiment of the present invention, respectively.
Figure 6:
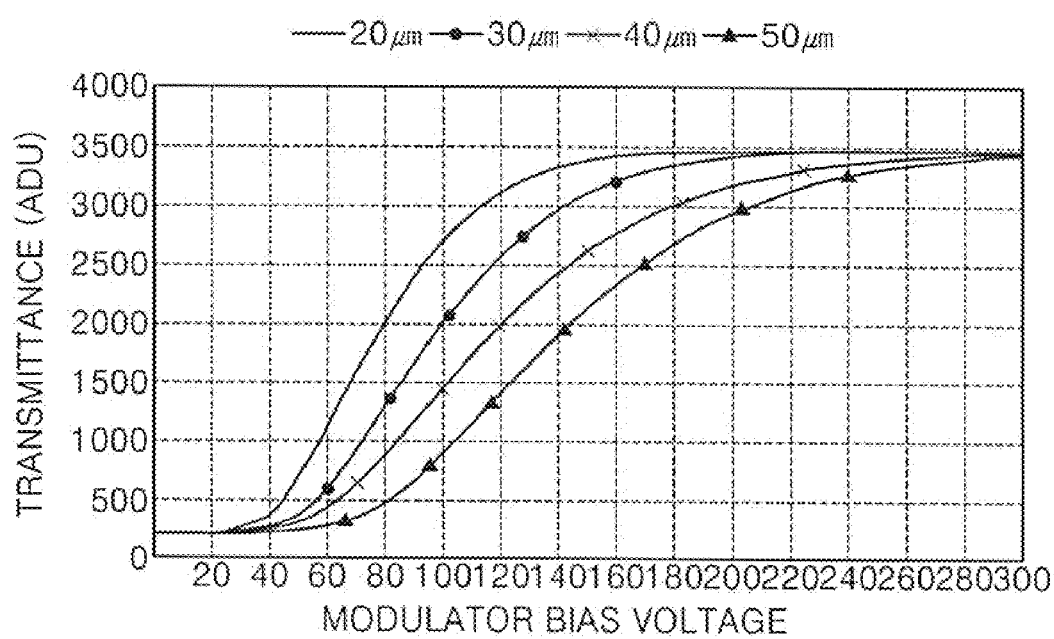

FIGS. 5 and 6 are a graph illustrating a transmittance of a detector employing PDLC according to the prior art and a graph illustrating a transmittance of a detector according to an exemplary embodiment of the present invention, respectively.

Horizontal axis refers to bias voltage applied between the detector 210 and the DUT, and vertical axis refers to transmittance. The transmittance was measured relative to the applied voltage, while a gap between the DUT and the detector 210 is adjusted.

It can be seen from FIG. 5 that the conventional detector employing PDLC has a transmittance of about 100 ADU when a voltage of about 200V is applied between the detector and the DUT while the gap is about 12 μm.

It can be seen from FIG. 6 that the detector of the present invention has a transmittance of about 27.5 ADU when a voltage of about 100V is applied between the detector and the DUT while the gap is about 20 μm. This result shows that the detector of the present invention has a transmittance higher than that of the prior art even though the gap between the DUT and the detector is larger than that of the conventional detector.

[Mode for Invention]

The electro-optic testing device may be utilized to examine the state of circuits or terminals included in various devices, examine the power supplying state of a device and parts that have ends permitting them to be connected to a power supply, and determine the shape and location of the ends.

Figure 7:
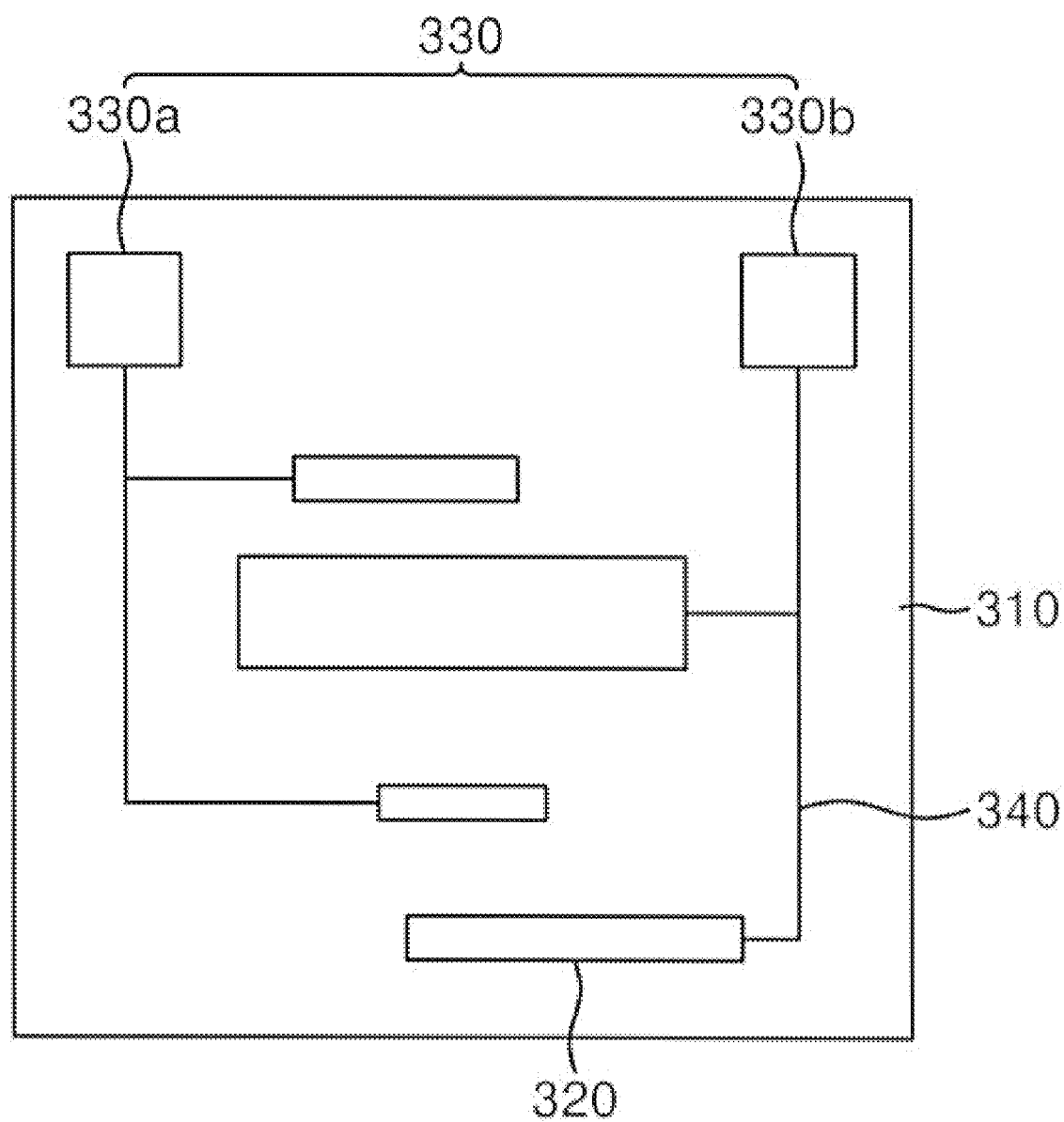
FIG. 7 is a view illustrating a structure of a printed circuit board (PCB) examined by a testing device according to an exemplary embodiment of the present invention.

FIG. 7 is a view illustrating a structure of a printed circuit board (PCB) examined by a testing device according to an exemplary embodiment of the present invention.

Referring to FIG. 7, the printed circuit board includes a board 310, a plurality of circuit patterns 320, and a contact terminal 330. The circuit patterns 320 are arranged on the board 310, and electronic elements are soldered on the circuit patterns 320. The contact terminal 330 is positioned near an edge of the board 310 and electrically connected to the circuit patterns 320. The contact terminal 330 may be provided in pair, for example, a first contact terminal 330a and a second contact terminal 330b as shown in FIG. 7.

The first contact terminal 330a may be connected to odd-numbered circuit patterns 320, the second contact terminal 330b to even-numbered circuit patterns 320, and vice versa.

This connection may minimize interference between electric fields produced from two adjacent circuit patterns 320.

More specifically, after a bias voltage has been applied to the odd-numbered circuit patterns 320, another bias voltage is applied to the even-numbered circuit patterns 320 in order to minimize the interference of electric field that could be occurring between an odd-numbered circuit pattern 320 and its adjacent even-numbered circuit pattern 320.

Figure 8:
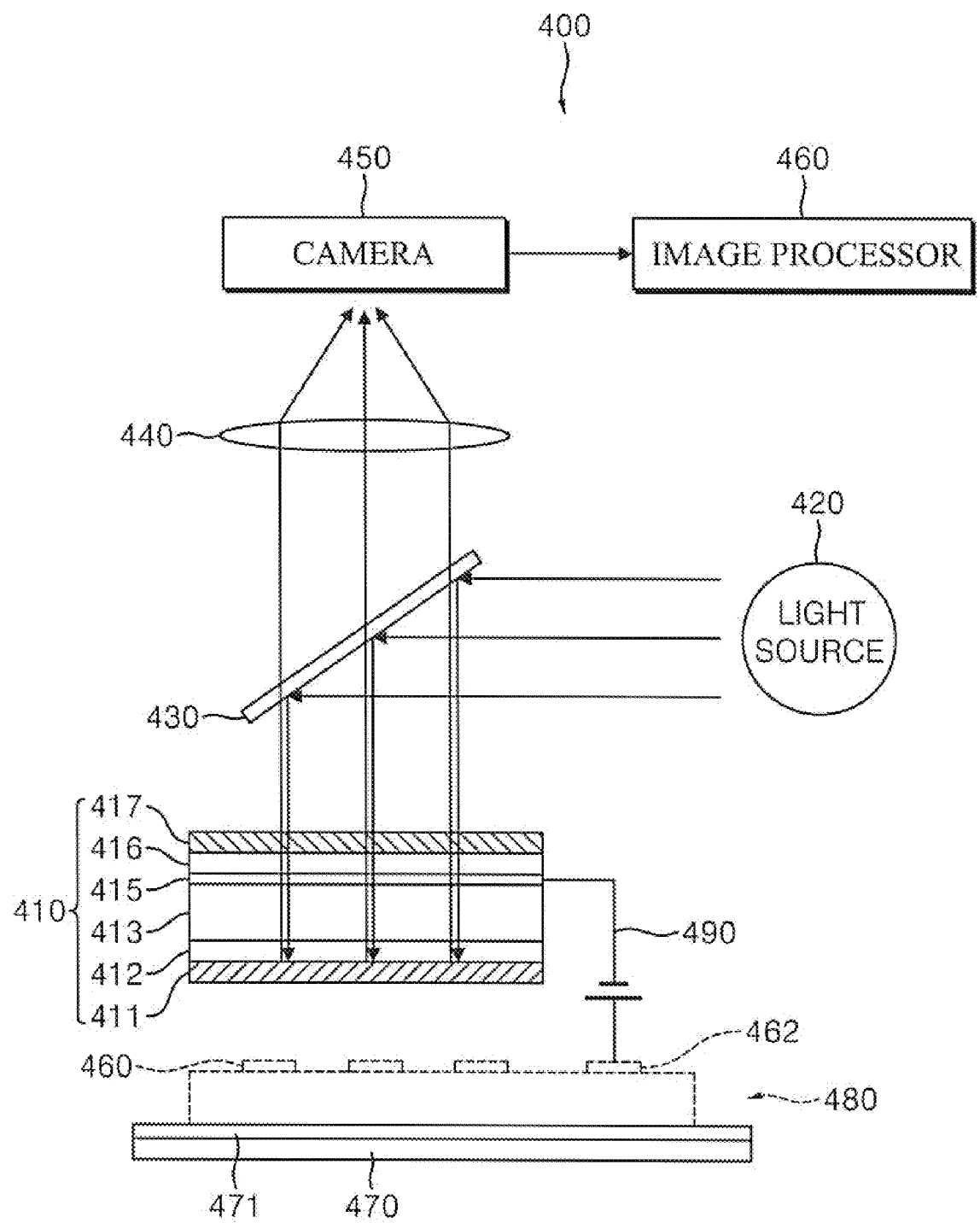
FIG. 8 is a view illustrating a PCB testing device and its driving principle according to a first exemplary embodiment of the present invention.

FIG. 8 is a view illustrating a PCB testing device and its driving principle according to a first exemplary embodiment of the present invention.

Referring to FIG. 8, the PCB testing device 400 includes a stage 470 on which a printed circuit board 480 is placed; a detector 110; a power supply 490 generating an electric field between the printed circuit board 480 and the detector 410; and a light source 420 emitting light.

The power supply 490 may supply a DC voltage, an AC voltage, or a pulse voltage between the printed circuit board 480 and the detector 410 to produce an electric field between them.

The testing device 400 may further include a beam splitter 430, a lens 440, and an image processor 460.

A plane electrode 471 may be arranged on the stage 470.

The detector 410 is located over the printed circuit board 480. The detector 410 includes an upper substrate 416, a lower substrate 412, a liquid crystal layer 413 interposed between the upper substrate 116 and the lower substrate 112, a transparent electrode 415 interposed between the upper substrate 416 and the liquid crystal layer 113, and a polarizing plate 417 arranged on the upper substrate 416.

The detector 410 may further include a reflecting plate 411 in a case where light is directed from the light source 420 located over the detector toward the detector 410. The reflecting plate 411 may be positioned on the bottom surface of the lower substrate 412.

An alignment layer (not shown), which has been rubbed at a prescribed direction, may be arranged on each of top and bottom surfaces of the liquid crystal layer 413 to determine the alignment of liquid crystal molecules (not shown).

The liquid crystal may include nematic liquid crystal whose molecules may be driven with a lower voltage. The liquid crystal molecules may be driven in a twisted nematic (TN) mode, a super twisted nematic (STN) mode, an in-plane switching (IPS) mode, a vertical alignment (VA) mode, and an optically compensated bend (OCB) mode.

The liquid crystal molecules are driven by an electric field applied to them to shift the traveling direction of the light coming into the liquid crystal layer 413.

The transparent electrode 415 is connected to a contact terminal 162 or the plane electrode 471 via the power supply 490 to cause an electric field to be produced across the liquid crystal layer 413. The power supply 490 supplies any one of a DC voltage, an AC voltage, and a pulse voltage to the contact terminal 462 and the plane electrode 471 to generate an electric field across the liquid crystal layer 413.

Figure 9:
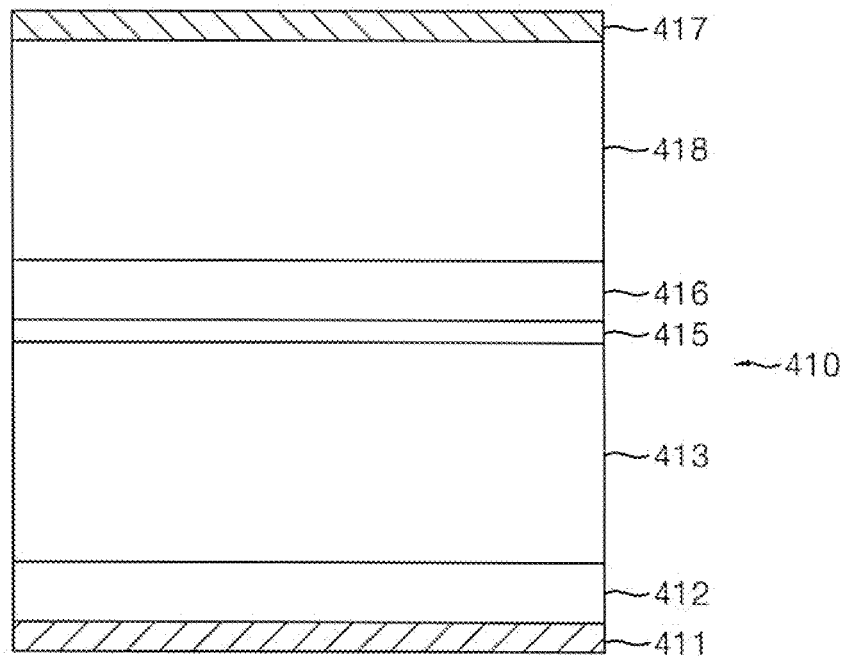
FIGS. 9 and 10 are views illustrating detectors included in testing devices according to an exemplary embodiment of the present invention.
Figure 10:
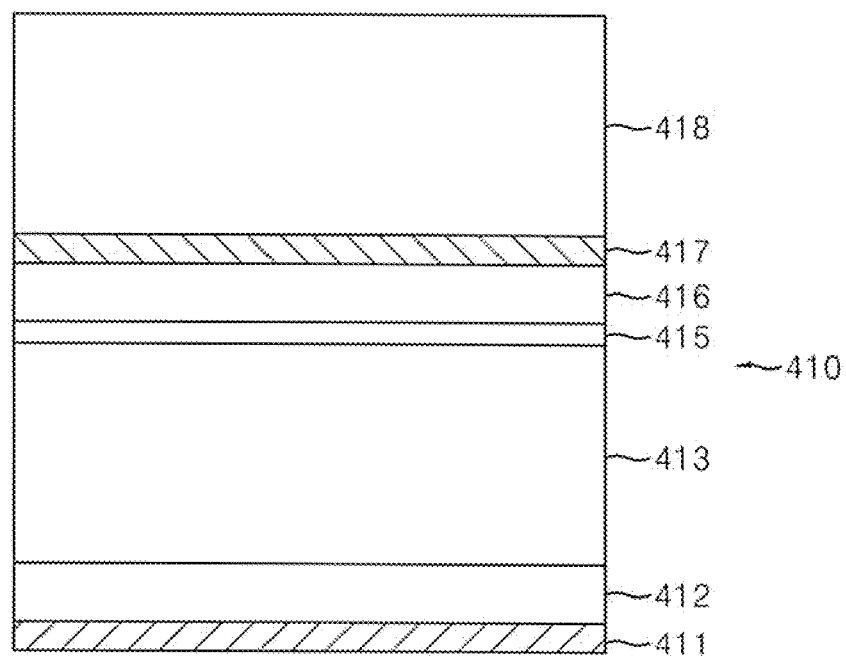

FIGS. 9 and 10 are views illustrating detectors included in testing devices according to an exemplary embodiment of the present invention.

Referring to FIGS. 9 and 10, the detector 410 may further include a g lass block 418 between the upper substrate 416 and the polarizing plate 417 or on the polarizing plate 417 in order to support the detector 410.

The upper substrate 416, the lower substrate 412, and the liquid crystal layer 4113 are very thin in thickness and easy to be deformed by an external impact.

The glass block 418 needs to be slightly chick to prevent such a de format ion.

Figure 11:
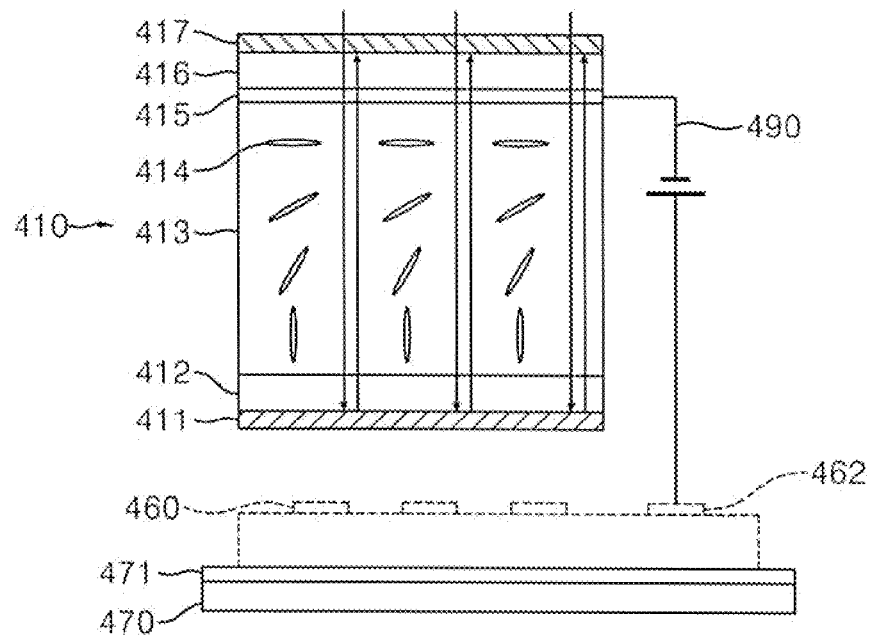
FIG. 11 is a view illustrating a printed circuit board and a detector that are not connected to each other via a power supply according to an exemplary embodiment of the present invention.

FIG. 11 is a view illustrating a printed circuit board and a detector that are not connected to each other via a power supply according to an exemplary embodiment of the present invention.

Referring to FIG. 11, the liquid crystal molecules 414 are twisted to have a phase delay of about λ/4.

If the liquid crystal layer 413 is illuminated with light in this state, the light is incident onto the polarizing plate 417 in parallel with an optical axis of the polarizing plate 417 and phase-delayed at λ/4 by the liquid crystal molecules 414. Then, the light is reflected by the reflecting plate 1411 toward the polarizing plate 417 and phase-delayed again at λ/4 by the liquid crystal molecules 414.

The light thusly phase-delayed by total λ/2 becomes vertical to the optical axis of the polarizing plate 417 when arriving at the polarizing plate 417, and therefore, it ends up not passing through the polarizing plate 417.

Figure 12:
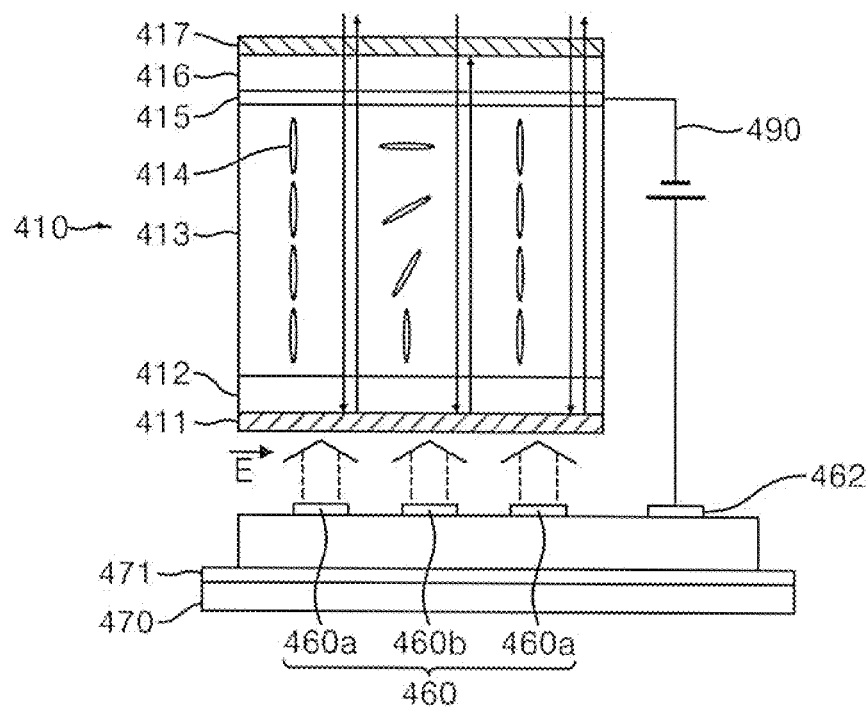
FIGS. 12 and 13 are views illustrating a method of testing a printed circuit board according to a first exemplary embodiment of the present invention.
Figure 13:
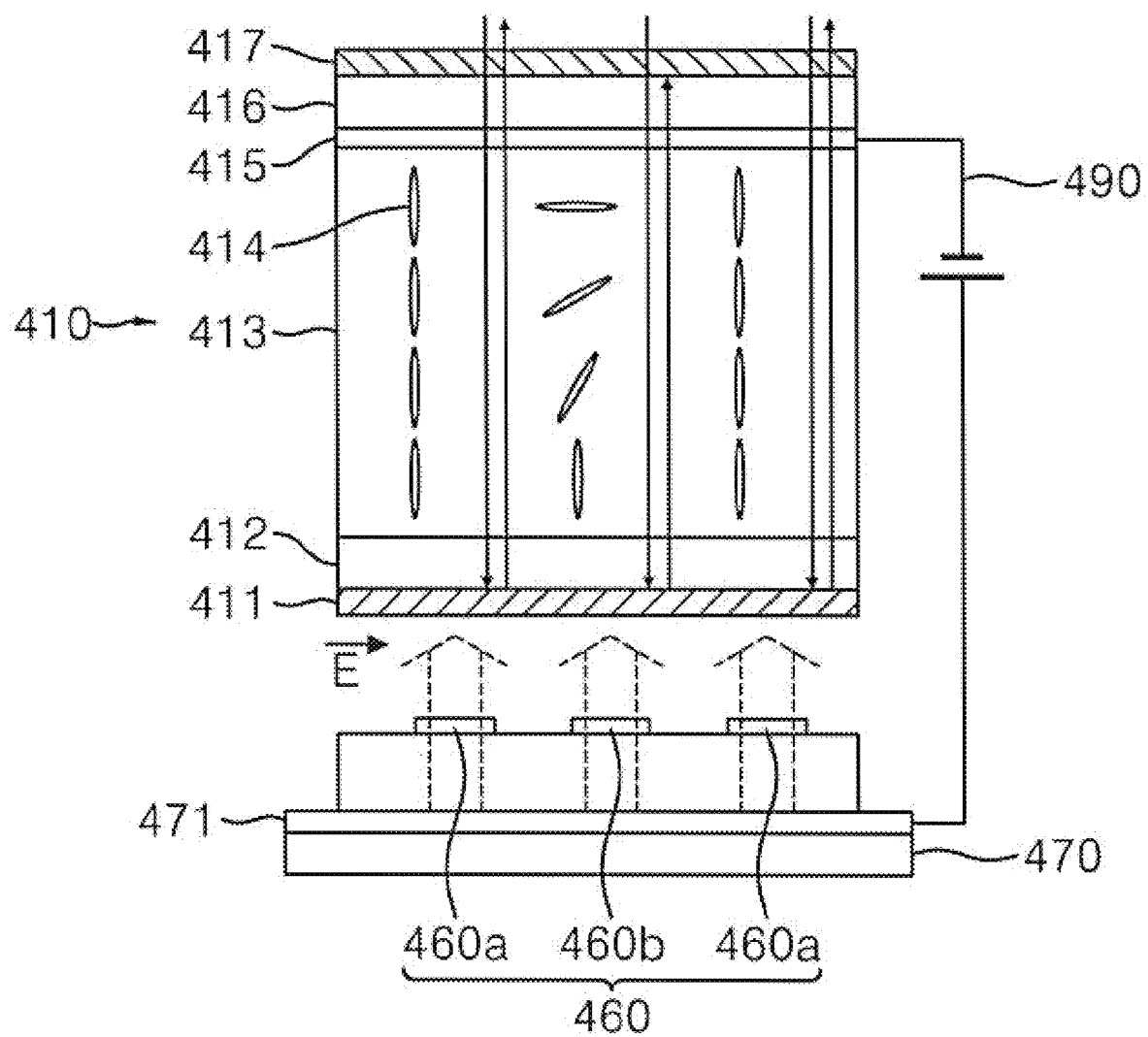

FIGS. 12 and 13 are views illustrating a method of testing a printed circuit board according to a first exemplary embodiment of the present invention.

Referring to FIGS. 12 and 13, when a power supply 490 supplies a bias voltage between a transparent electrode 115 of a detector 410 and a contact terminal 462 or plane electrode 471, an electric field is generated between a circuit pattern 460 and the transparent electrode 415. The power supply 490 may supply any one of a DC voltage, an AC voltage, and a pulse voltage.

An electric field generated across a normal circuit pattern 460a is different from that generated across a had circuit pattern 460b, and this difference causes a difference in driving of the liquid crystal molecules 414.

The electric field produced between the normal circuit pattern 160a and the transparent electrode 416 allows the liquid crystal molecules to be aligned from the twisted direction to a vertical direction.

The electric field produced between the transparent electrode 416 and the bad circuit pattern 460b caused by open circuit or short circuit can mitigate twisting of the liquid crystal molecules but not allow the liquid crystal molecules to be aligned from the twisted direction to a vertical direction.

If the liquid crystal molecules 414 are vertically aligned, then the light incident onto the liquid crystal layer 413 is reflected by the reflecting plate 411 to be parallel with the optical axis of the polarizing plate 417 without any phase delay, so that the light may pass through the polarizing plate 417.

Accordingly the light incident onto the liquid crystal layer 413 located over the normal circuit pattern 460a is reflected by the reflecting plate 411 and directed outwards via the polarizing plate 417, however, the light incident onto the liquid crystal layer 413 located over the bad circuit pattern 460b is reflected by the polarizing plate 417 not to pass through the polarizing plate 117.

The camera 450 is placed over the detector 410 to convert the light coming from the detector 110 into electrical signals.

The beam splitter 430, located between the detector 410 and the camera 450, reflects the light coming from the light source 420 toward the detector 410 and transmits the light reflected by the detector 410.

The lens 440, located between the detector 410 and the camera 450, collects the light reflected by the detector 410 into the camera 450.

The image processor 460 processes the electrical signals supplied from the camera 450 with an image processing scheme, and compares the resultant values with each other in an automatic or manual way.

The PCB testing device 400 determines whether or not there is a defect on the printed circuit board 480 by following methods.

An electric field is generated between the printed circuit board 180 and the detector 110 by the power supply 190. The power supply 490 may supply any one of a DC voltage, an AC voltage, and a pulse voltage between the printed circuit board 480 and the detector 410. The generated electric field is different in value according to, whether it originates from the normal circuit pattern 460a or the bad circuit pattern 460b, and the liquid crystal molecules are driven differently depending on the value.

That is, the liquid crystal molecules 414 located over the normal circuit pattern 460a are vertically aligned and the liquid crystal molecules 414 located over the bad circuit pattern 460 are aligned in a twisted manner but less twisted than the initial twisted state.

The light source 420 radiates light toward the detector 410.

The light is reflected by the reflecting plate 411 and directed back to the polarizing plate 417.

Some of the reflected light passing through the liquid crystal molecules 414 located over the normal circuit pattern 460a passes through the polarizing plate 417 without any phase delay.

The other of the reflected light passing through the liquid crystal molecules 414 located over the had circuit pattern 460b can not pass through the polarizing plate 417 due to a phase delay causing the light to be parallel with an optical axis of the polarizing plate 417.

The light having passed through the polarizing plate 417 is collected by the lens 440, converted by the camera 450 into electrical signals, and read by the image processor 460.

It can be determined whether or not there is a defect, such as open circuit or short circuit, in the circuit pattern 460 based on the read result.

The detector 410 is located close to the printed circuit board 180 to enable the liquid crystal molecules strongly affected by electric fields generated by the power supply.

Figure 14:
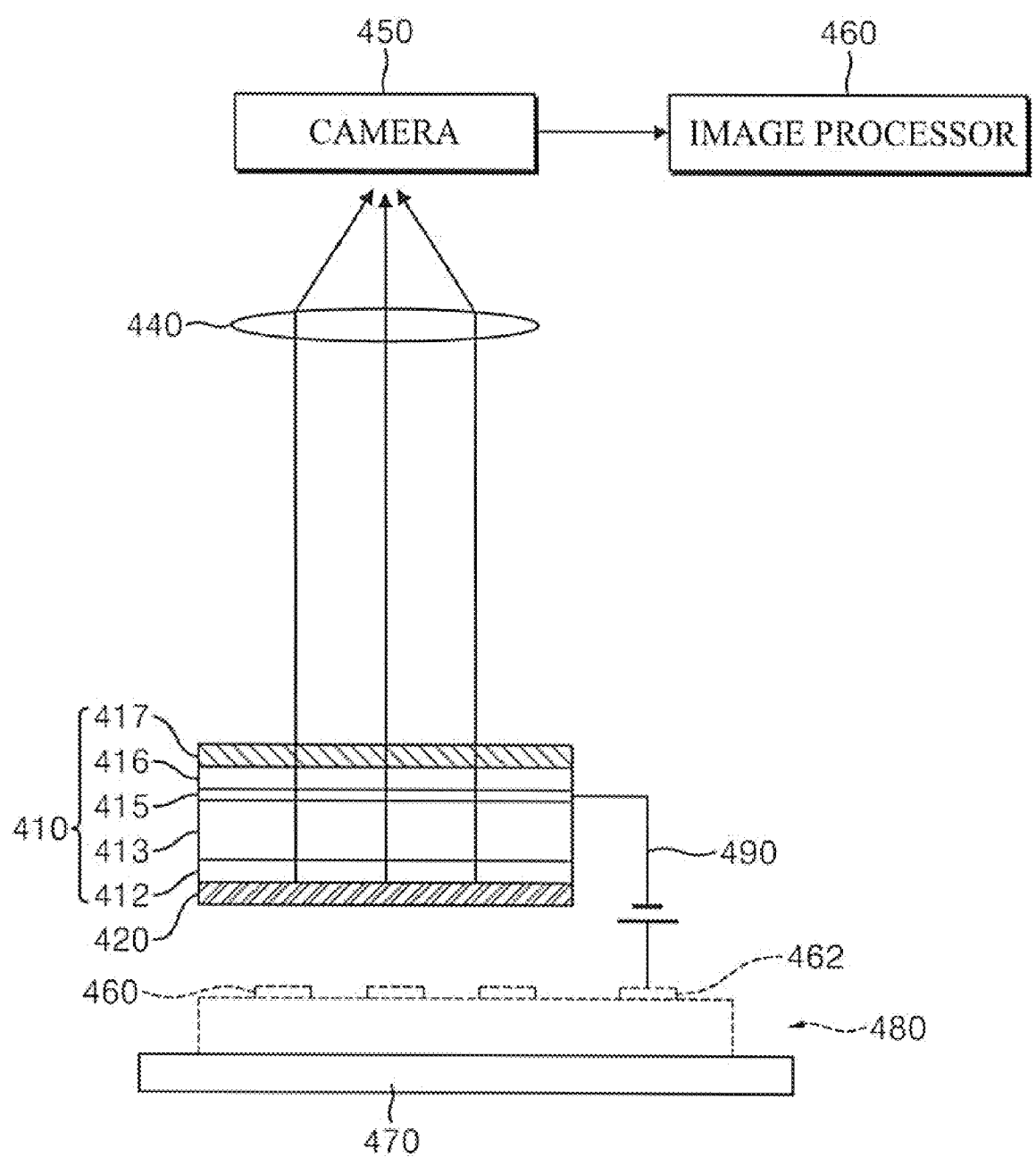
FIG. 14 is a view illustrating a PCB testing device according to a second exemplary embodiment of the present invention.

FIG. 14 is a view illustrating a PCB testing device according to a second exemplary embodiment of the present invention.

Referring to FIG. 14, the PCB testing device includes a stage 470 on which a printed circuit board 480 is placed, a detector 410, a power supply 490, a light source 420, and a camera 450.

The detector 410 is located over the printed circuit board 180. The detector 410 includes an upper substrate 416, a lower substrate 412, a liquid crystal layer 413 interposed between the upper substrate 416 and the lower substrate 412, a transparent electrode 415 interposed between the upper substrate 416 and the liquid crystal layer 113, and a polarizing plate 4117 arranged on the upper substrate 416.

The liquid crystal molecules contained in the liquid crystal layer 413 may have a phase delay of λ/2.

The power supply 490 supplies a bias voltage between the transparent electrode 415 and the printed circuit board 480. The power supply 490 may supply a DC voltage, an AC voltage, or a pulse voltage between the printed circuit board 480 and the detector 410 to produce an electric field.

The light source 420, located below the lower substrate 412, radiates light toward the liquid crystal layer 413 located over the lower substrate 412.

In this embodiment, there is required no reflecting plate, such as the reflecting plate 411 described in the first exemplary embodiment.

The detecting method according to the second embodiment includes applying a bias voltage between the transparent electrode 415 and the printed circuit board 480 by the power supply 490. The power supply 490 may supply a DC voltage an AC voltage, or a pulse voltage between the printed circuit board 480 and the detector 410 to produce an electric field.

If an electric field is generated between the circuit patterns 460 and the liquid crystal layer 413 by the application of the bias voltage, then the liquid id crystal molecules 114 alter their alignment or orientation.

At this time the liquid crystal molecules located over the normal 1 circuit pattern 460a are vertically aligned, and the liquid crystal molecules located over the bad circuit pattern 460b are aligned in a twisted manner.

The light source 420 radiates light toward the liquid crystal molecules.

Then, the light propagates a long an optical axis formed by the liquid crystal molecules and reaches the polarizing plate 417 located on the liquid crystal layer 413.

Some of the light having reached the polarizing plate 417 via the liquid crystal molecules located over the normal Circuit pattern 460a has the same optical axis as that of the polarizing plate 417, and therefore, it can pass through the polarizing plate 417.

The other of the light passing through the liquid crystal molecules 414 located over the bad circuit pattern 460b can not pass through the polarizing plate 417 due to a phase delay causing the light to be perpendicular to an optical axis of the polarizing plate 417.

The light having passed through the polarizing plate 417 is converted into electrical signals by the camera 450.

The electrical signals are displayed as an image by the image processor 460 to read the state of the circuit patterns 460 may be read.

It can be electrically determined whether or not there is a defect in the circuit patterns 460 by the above method.

Figure 15:
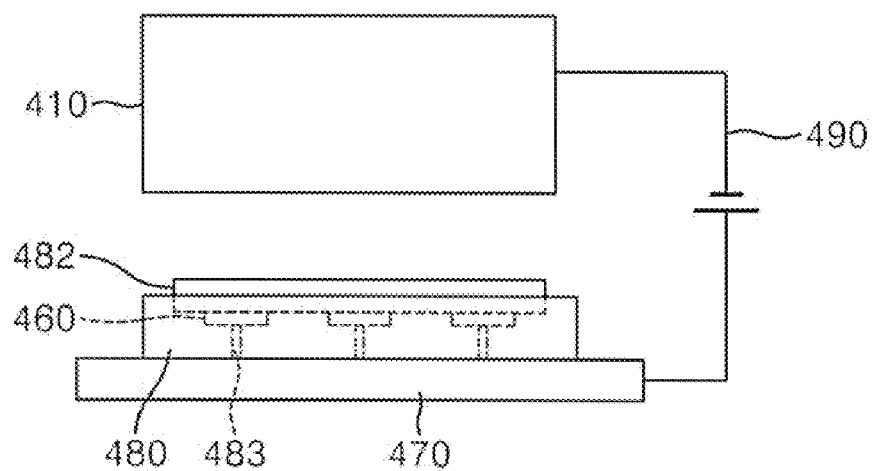
FIGS. 15 and 16 are views illustrating a PCB testing device according to a third exemplary embodiment of the present invention.
Figure 16:
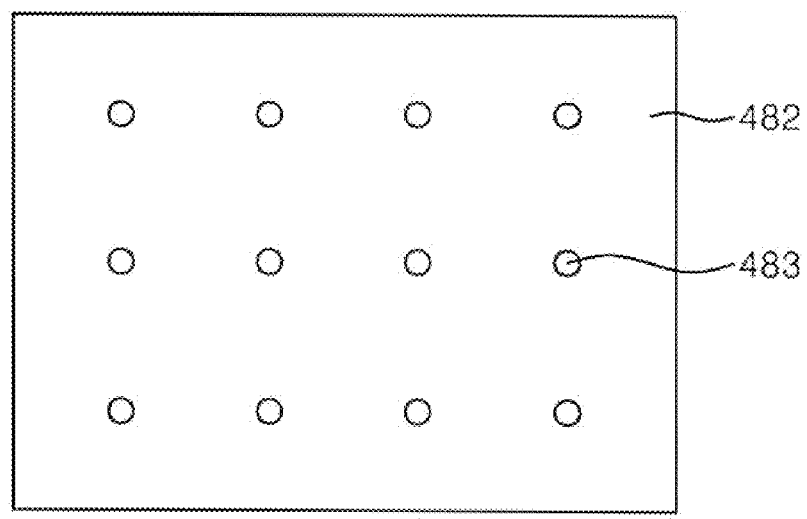

FIGS. 15 and 16 are views illustrating a PCB testing device according to a third exemplary embodiment of the present invention.

Referring to FIGS. 15 and 16, the detector 410 is connected to the stage 470 via the power supply 490. A socket 482 is provided on the stage 470, which is connected to a plurality of circuit patterns 460 arranged in the printed circuit board 480.

Each socket 482 has a plurality of contact pins 483.

The contact pins 483 are in contact with the circuit patterns 460 of the printed circuit board 480 under test to allow a bias voltage to be applied between the detector 410 and the printed circuit board 480.

The contact pins 483 respectively are connected to the power supply 490 independently from each other, so that each bias voltage is applied separately. The power supply 490 may supply a DC voltage, an AC voltage, or a pulse voltage between the printed circuit board 480 and the detector 410 to produce an electric field.

The separate application of the bias voltage may reduce errors occurring due to interference between electric fields that can be produced when the bias voltage is applied to the contact pins 483 at the same time.

The simultaneous application of a bias voltage to adjacent contact pins 483 may be prevented by taking turn to apply a bias voltage between adjacent contact pins 483. By doing so, interference between electric fields may be minimized.

The PCB testing device according to the present invention uses an electrical method, and therefore, may solve the problems that can rise at the conventional optical detecting method.

Figure 17:
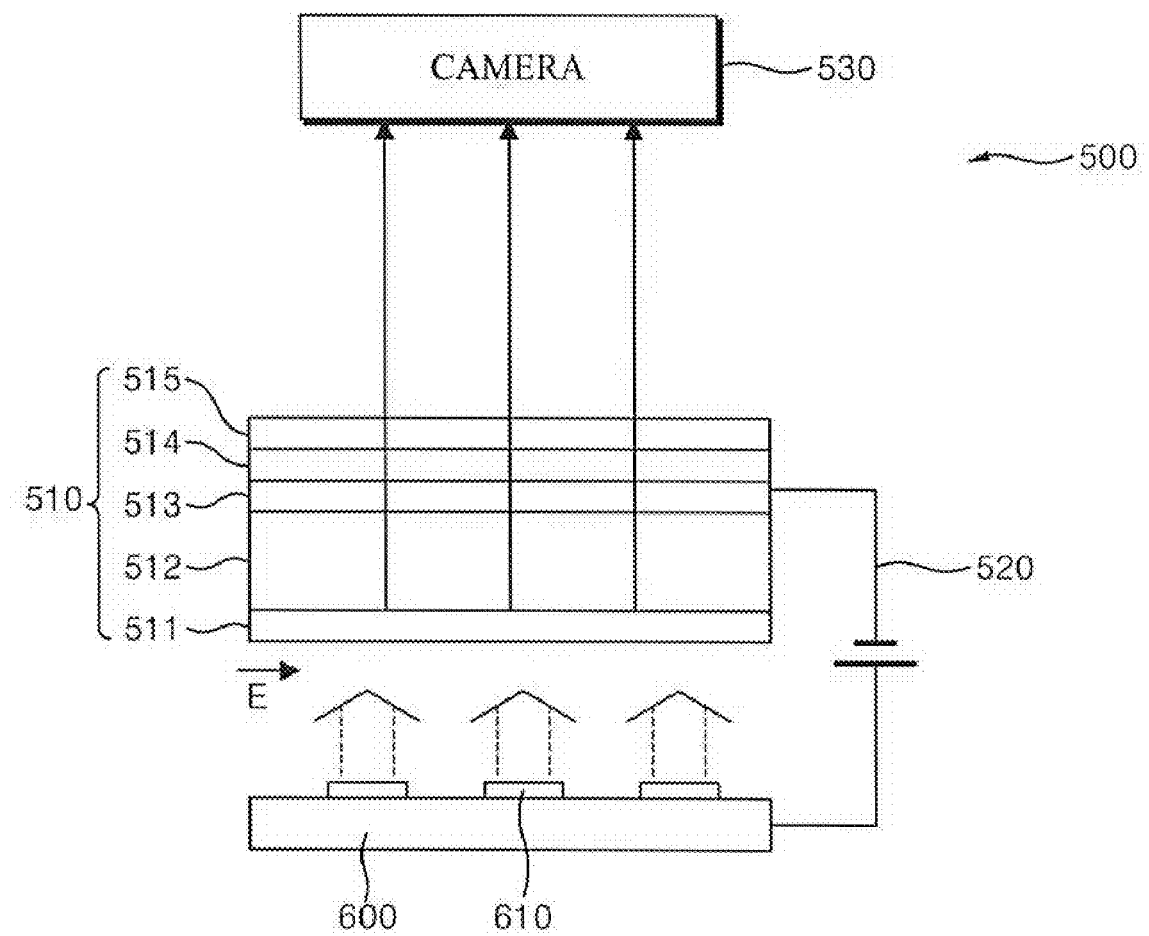
FIG. 17 is a view illustrating a wire testing device according to a fourth exemplary embodiment of the present invention.

Referring to FIG. 17, the wire defect detection device 500 may include a detector 510, a power supply 520, and a camera 530.

The detector 510 may include a liquid crystal layer 512 arranged between an upper substrate 514 and a lower substrate 511 and a transparent electrode 513 arranged between the upper substrate 514 and the liquid crystal layer 512.

A polarizing plate 515 may be further provided on the upper substrate 514.

An alignment layer (not shown), which is rubbed at a prescribed direction, may be arranged on each of top and bottom surfaces of the liquid crystal layer 512 to determine the alignment of liquid crystal molecules (not shown).

The liquid crystal may include nematic liquid crystal that may be driven with a lower voltage. The liquid crystal molecules may be driven in a twisted nematic (TN) mode, a super twisted nematic (STN) mode, an in-plane compensated bend (OCB) mode.

The transparent electrode 513 may be connected to a test electrode (not shown) that has been connected to wires (not shown) of a DUT 600 via the power supply 520. The power supply 520 may supply a DC voltage, an AC voltage, or a pulse voltage between the DUT 600 and the transparent electrode 513.

More specifically, the power supply 520 has two electrodes, one of which is connected to the transparent electrode 513 and the other is connected to the test electrode of the DUT 600.

The camera 530, located over the detector 510, may convert optical signals received from the detector 510 into electrical signals.

The power supply 520 is connected between the test electrode of the DUT 600 and the transparent electrode 513 to detect any defects in the DUT 600, i.e. wire 610, by the wire defect testing device 500.

In this case, an electric field generated between the wire 610 and the transparent electrode 513 may vary with the state of the wire 610.

That is, when being put in an abnormal state, such as short circuit, open circuit, deformation, etc., the wire 610 can change in intensity or orientation of the electric field to be different front that of other normal wires.

This may also cause a difference in the driving of the liquid crystal molecules.

At this time, the radiation of light toward the liquid crystal molecules may permit the state of the wire 610 to be acquired by the camera 530 as an optical image of the detector 510.

The optical image acquired by the camera 530 is converted into electrical signals that serve as a criterion for determining the state of the wire 610.

That is, it can be possible to determine whether or not there are any defects by comparing the converted electrical signals to each other or comparing the converted electrical signals with electrical signals in a normal state. For example, if the electrical signals A, B, C, and D have the results as follows: A=1, B=0, C=1, and D=1, the electrical signals A, C, and D that have the same values are determined to be normal, and the electrical signal B that has the different value from those of the other electrical signals A, C, and D is determined to be bad.

Figure 18:
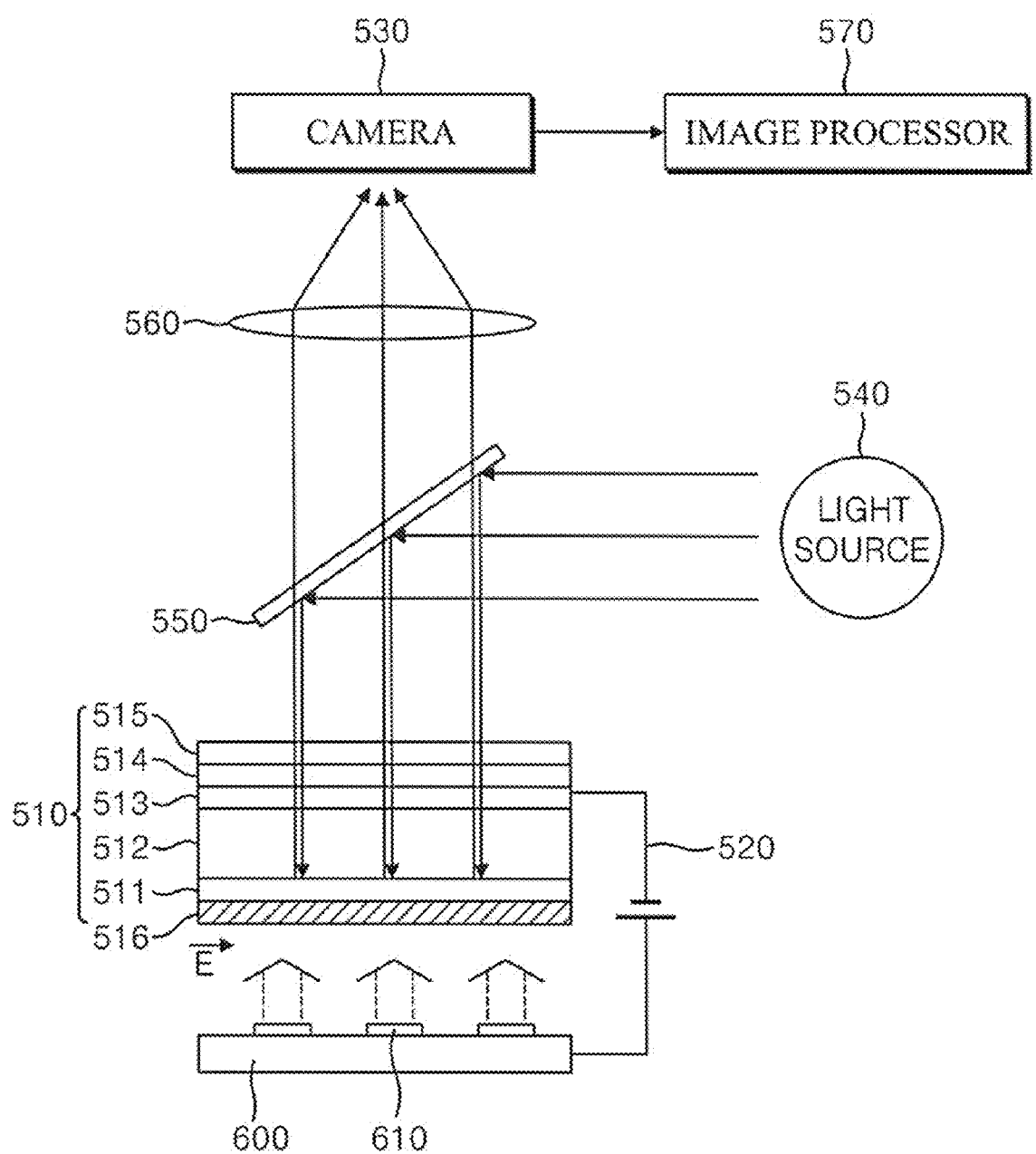
FIG. 18 is a view illustrating a wire testing device according to a fifth exemplary embodiment of the present invention.

FIG. 18 is a view illustrating a wire testing device according to a which exemplary embodiment of the present invention. Referring to FIG. 18, the wire defect detection device 500 may include a detector 510, a power supply 520, a light source 540, and a camera 530.

The detector 510 includes an upper substrate 514 and a lower substrate 511.

A liquid crystal layer 512 is located between the upper substrate 514 and the lower substrate 511, and a transparent electrode 513 is located between the upper substrate 514 and the liquid crystal layer 512.

One electrode of the power supply 520 is connected to the detector 510 and the other is connected to a DUT 600.

More specifically, a first electrode of the power supply 520 may be connected to the transparent electrode 513 and a second electrode of the power supply 520 may be connected to a test electrode (not shown) that is electrically connected to a wire 610 of the DUT 600.

The detector 510 may further include a polarizing place 515 on the upper substrate 514 and a reflecting plate 516 on a bottom surface of the lower substrate 511.

Light emitted from the light source 540 passes through the polarizing plate 515 and liquid crystal layer 512, and reflects by the reflecting plate 516 via the liquid crystal layer 512 and the polarizing plate 515 back to the camera 530.

The testing device 500 may include a beam splitter 550 for separating a path of light incident onto the detector 510 from a path of light reflected by the detector 510.

The beam splitter 550 may be designed so that one of the incident light and the reflected light is totally reflected and the other is transmitted.

The beam splitter 550 may be located over the detector 510.

The beam splitter 550 reflects the light incident from the light source 540 toward the detector 510 and directs the light reflected by the detector 510 toward the camera 530.

A lens 560 may be further provided between the detector 510 and the camera 530, which may be connected to an image processor 570 for converting electrical signals into images.

The image processor 570 performs an image process on the imaged of the detector 510 captured by the camera 530 to be capable of determining whether or not there are defects.

The image processor 570 may determine whether or not there are defects by comparing the processed images to each other automatically by a defect determination program embedded in the image processor 570 or manually by a viewer's eyes.

For example, if the electrical signals A, B, C, and D have the results as follows: A=1, B=0. C=1, and D=1, the electrical signals A, C, and D that have the same values are determined to be normal, and the electrical signal B that has the different value from those of the other electrical signals A, C, and D is determined to be bad.

Figure 19:
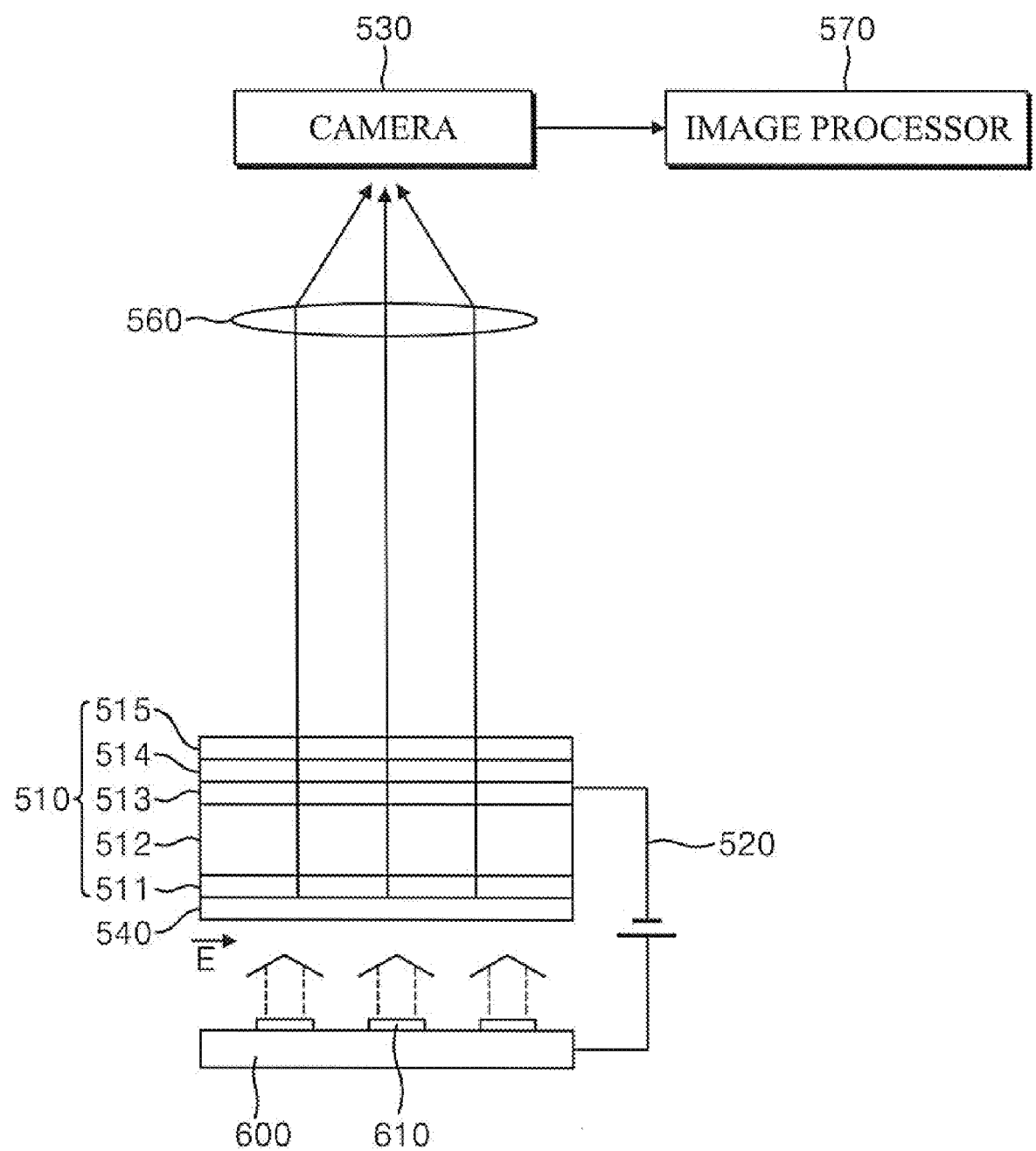
FIG. 19 is a view illustrating a wire testing device according to a sixth exemplary embodiment of the present invention.

FIG. 19 is a view illustrating a wire testing device according to a sixth exemplary embodiment of the present invention.

Referring to FIG. 19, the wire defect detection device 500 may include a detector 510, a power supply 520, a light source 540, and a camera 530.

The detector 510 includes an upper substrate 514 and a lower substrate 511.

A liquid crystal layer 512 is located between the upper substrate 514 and the lower substrate 511, and a transparent electrode 513 is located between the upper substrate 514 and the liquid crystal layer 513.

Two electrodes of the power supply 520 are connected to the detector 510 and a DUT 600 respectively.

More specifically, a first electrode of the power supply 520 may be connected to the transparent electrode 513 and a second electrode of the power supply 520 may be connected to a test electrode (not shown) that is electrically connected to a wire 610 of the DUT 600.

A polarizing plate 515 may be further provided on the upper substrate 514.

The light source 540 is located under the detector 510. Light emitted from the light source 540 goes through the liquid crystal layer 512 and the polarizing place 515 to the camera 530.

A lens 560 may be further provided between the detector 510 and the camera 530. The camera 530 may be connected to an image processor 570 that may convert electrical signals into an image.

The image processor 570 image-processes an image captured by the camera 530 in an image processing scheme and compares the results with each other automatically or manually to determine whether or not there are any defects on DUT.

Figure 20:
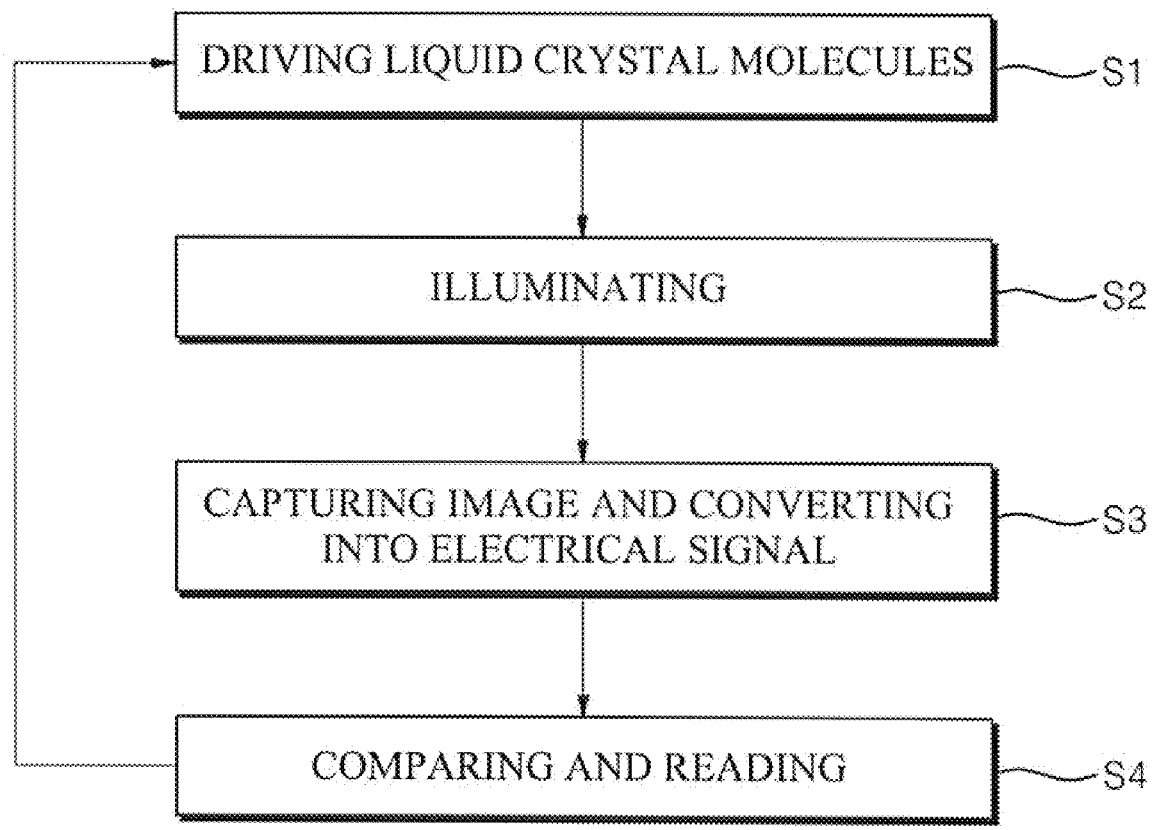
FIG. 20 is a flow chart illustrating a method of testing a defect in a wire according to an exemplary embodiment of the present invention.

FIG. 20 is a flow chart illustrating a method of testing a defect in a wire according to an exemplary embodiment of the present invention.

Referring to FIG. 20, the method may include the steps of driving liquid crystal molecules (S1), radiating light (S2), capturing an image and converting the captured image into electrical signals (S3), and comparing the electrical signals and determining whether there are any defects (S4).

The step S1 may be performed by applying a bias voltage between a DUT and the wire defect testing device shown in FIG. 2.

More specifically, a power supply is connected between a transparent electrode of a detector and a test electrode connected to a wire of the DUT. The power supply generates an electric field between the DUT and a liquid crystal layer to drive liquid crystal molecules in the liquid crystal layer.

In a case where it is determined whether or not there are defects in a specific part of the DUT, for example whose wires are arranged in the direction of X axis, liquid crystal molecules corresponding to each wire may be separately driven while the detector axially moves in the direction of X axis a long which wires are arranged.

The step S2 includes illuminating the liquid crystal molecules driven by the electric fields, making the light propagate a long an aligned direction of the liquid crystal molecules, and transmitting the light outside the detector.

This is performed to optically represent the generation of each electric field corresponding to each wire and difference in driving of the liquid crystal molecules depending on the state of wires of the DUT.

The step S3 captures an image from the light transmitted according to the alignment of driven liquid crystal molecules with a camera and converts the image into electrical signals.

The step S4 compares the converted electrical signals to each other or predetermined normal values. For example, if the electrical signals A, B, C, and D have the results as follows: A=1, B=0, C=1, and D=1, the electrical signals A, C, and D that have the same values are determined to be normal, and the electrical signal B that has the different value from those of the other electrical signals A, C and D is determined to be had.

The step S4 may include image-processing the electrical signals and comparing the resultant signals to each other to find defective wires.

The comparison between the image processed signals may be also performed by comparing the image processed signals to each other or normal values.

It can be seen what defects have occurred to the wires by testing the defects on the wires of the DUT through the above steps.

That is, in a case where here there are some defects on the wires, such as open circuit and deformation of the wires, the generation of electric fields may fail or generated electric fields may be weak near the part of wires with such defects, which in turn may lower the transmittance of light emanating toward the liquid crystal layer to be lower than that of the normal wires.

On the contrary, in a case where there is short circuits in wires, an electric field larger than those of the normal wires may be generated, which may increase the transmittance of the light emanating toward the liquid crystal layer to be higher value than that of the normal wires.

The above case has been provided only for an example, and other cases are also possible.

When a defective wire has been found by the above method, the defective wire can be divided into several parts, each with a constant interval so as to find the exact location where the defect occurred.

Performing the above method on each part of the defective wire may provide the exact location of the defect since the defective part will cause abnormal electric fields.

At this time, the detector may move in the direction perpendicular to a direction for finding the wire where a defect originally occurred, i.e. in the direction of Y axis.

That is to separately test the divided parts

This method may find an exact location of a defective wire as well as the occurrence of the defective wire because of being capable of generating an electric field while moving the detector in the directions of X and Y axes with respect to a DUT.

A coordinate of the defective part may be known from a coordinate of the detector moving over each part of a wire.

This method may also find any other defects besides short circuits or open circuits.

In addition, the method may prevent any damages that can be caused by a probe like in the prior art, because it uses an optical or electrical method of producing an electric field between the DUT and the testing device.

Figure 21:
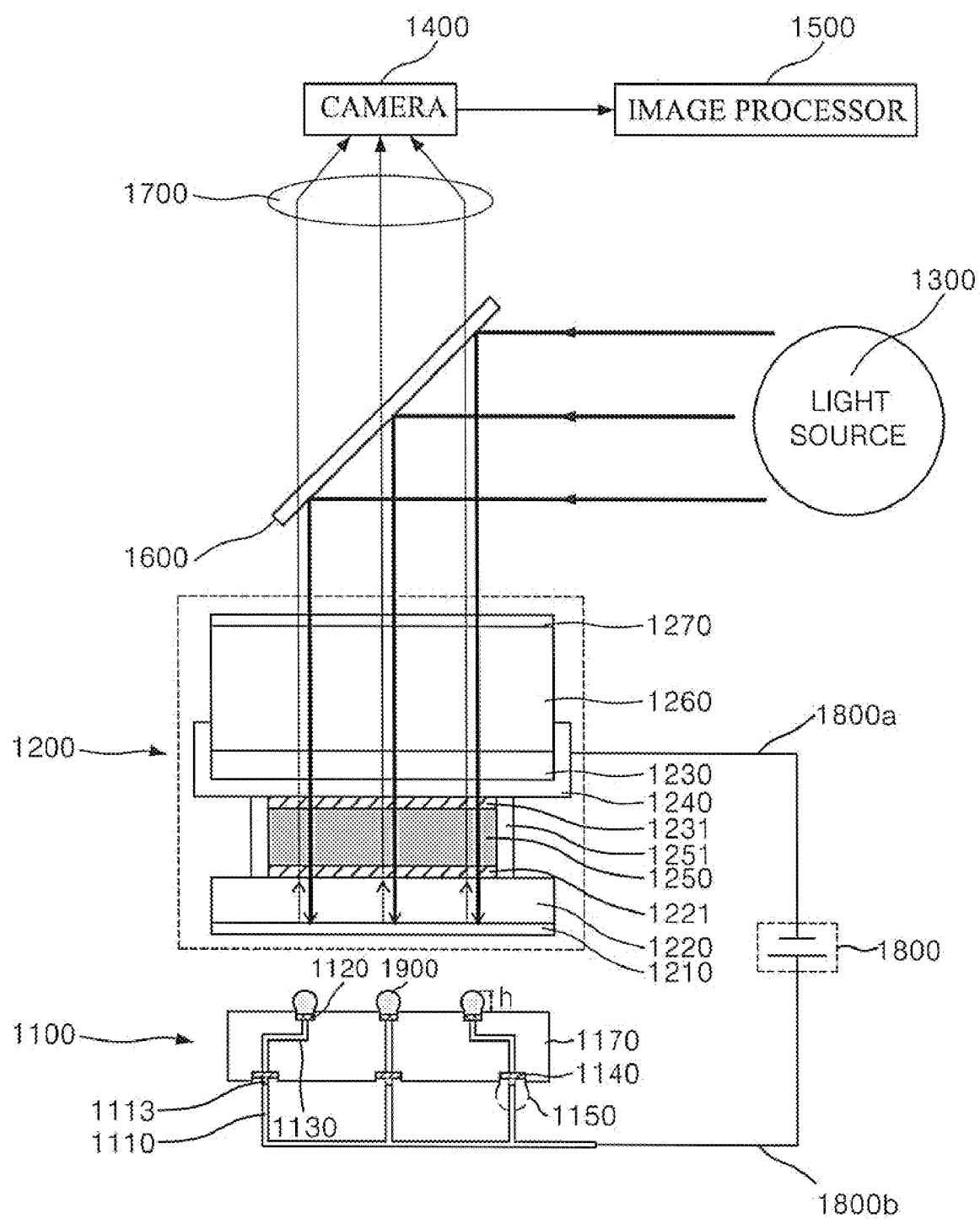
FIG. 21 is a view illustrating a ball grid array package detecting device according to a seventh exemplary embodiment of the present invention.

FIG. 21 is a view illustrating a ball grid array package detecting device according to a seventh exemplary embodiment of the present invention.

Referring to FIG. 21, the ball grid array package testing device may include a probe unit 1100, a detector 1200, a light source 1300, a camera 1400, and an image processor 1500.

The probe unit 1100 may include plural probing members 1110 that are spaced from each other by a prescribed distance equal to that of between wires of the DUT. The probe unit 1100 may further include a terminal 1140 that is in electrical contact with each probing member 1110. The terminal 1140 is to be attached to a solder ball 1150. The terminal 1140, provided on a rear surface of a printed circuit board 1170, may be connected to a wire 1130 that transmits an electrical signal to a contact pad 1120 contacting a solder bump 1900. Accordingly, the terminal 1140 is electrically connected to the wire 1130 of the ball grid array package through the plural probing members 1110. An upper part of the probing member 1110 may be formed of conductive silicon 1113. The conductive silicon 1113, with compressive elasticity, may prevent the probing member 1110 from contacting only a specific part of the DUT, i.e. may bring the probing member 1110 in complete contact with the DUT when the DUT fails to be in a parallel alignment with the probe in it 1100.

The detector 1200, located on the probe unit 1100, may be electrically connected to the probing member 1110. The detector 1200 may include a reflecting plate 1210, a lower substrate 1220, an upper substrate 1230, a transparent electrode 1240, a liquid crystal layer 1250, a transparent block 1260, and a polarizing plate 1270.

The reflecting plate 1210 reflects incident light upwards. A specific material may be coated on the surface of the reflecting plate 1210, which reflects a specific wavelength of light.

The lower substrate 1220, located on the reflecting plate 1210, may be made of a transparent material such as glass or plastic.

The upper substrate 1230 may be formed to face the lower substrate 1220. The upper substrate 1230 may be made of the same material as that of the lower substrate 1220. An alignment layer may be further provided between the lower substrate 1220 and the upper substrate 1230. The alignment layer may include a first alignment layer 1221 rubbed on the lower substrate 1220 and a second alignment layer 1231 rubbed on the upper substrate 1230 to have the different alignment angle from that of the first alignment layer 1221. The alignment layer determines an initial aligning direction of liquid crystal molecules. The alignment layer may be generally made of an organic material in such as a polyimide-based material, for example, polyimide that can be vertically aligned.

The transparent electrode 1240 may be arranged between the upper substrate 1230 and the second alignment layer 1231.

The transparent electrode 1240 may cover the entire surface of the upper substrate 1230 and may be constituted of a plurality of rectangular pixels arranged in a matrix form where an edge of a pixel is connected to an edge of an adjacent pixel. This pixel-structure may improve the resolution of detection. The transparent electrode 1240 may be made of a transparent metal such as indium tin oxide (ITO) and indium zinc oxide (IZO).

The liquid crystal layer 1250 may be arranged between the first alignment layer 1221 and the second alignment layer 1231. The liquid crystal may include nematic liquid crystal that may be driven with a lower voltage. The liquid crystal molecules may be driven in a twisted nematic (TN) mode a super twisted nematic (STN) mode, an in-plane switching (IPS) mode, a vertical alignment (VA) mode, and an optically compensated bend (OCB) mode.

And a sealant 1251 may be further provided to seal the periphery of the liquid crystal layer 1250 between the upper substrate 1230 and the lower substrate 1220. Such a sealant 1251 functions to form a gap for injecting liquid crystal and prevent the leakage of the injected liquid crystal. The sealant 1251 may be sealed on either the upper substrate 1230 or the lower substrate 1220.

The transparent block 120 is stacked on the upper substrate 1230 to constantly maintain the evenness and uniformity of the detector 1200 according to external impacts or environment. The transparent block 1260 may hie attached to the upper substrate 1230 by an adhesive such as epoxy.

The polarizing plate 1270 is arranged between the light source 1300 and the liquid crystal layer 1250. The polarizing plate 1270 transmits only the light vibrating in a specific direction and may control the amount of the transmitted light according to polarizing degree of the incident light.

The light source 1300 may be provided in single or plural, and the light source 1300 is located over the detector 1200 to illuminate the detector 1200. The light emitted from the light source 1300 is reflected by the beam splitter 1600 toward the detector 1200.

The beam splitter 1600, located over the detector 1200, reflects one of the incident light and the reflected light and transmits the other. For example, the beam splitter 1600 may reflect the light emitted from the light source 1300 toward the detector 1200 and transmit light from the detector 1200 to the camera 1700. Accordingly, there could take place a difference in the amount of light between the light having passed through the beam splitter 1600 and the light not having passed through the beam splitter 1600.

The camera 1700, located over the detector 1200, may include a CCD (Charged Coupled Diode) camera. The camera 1700 may convert image signals received from the detector 1200 into electrical signals and image-process the electrical signals to determine whether or not there are electrical errors.

A lens 1700 may be further provided between the detector 1200 and the camera 1700.

The lens 1700 may include a telecentric lens, and the lens 1700 collects the light so that the light is fitful to the size of a CCD element included in the camera 1400. The camera 1400 converts the light into electrical analogue signals, amplifies the analogue signals, converts the amplified analogue signals into digital signals, and transmits the digital signals to the image processor 1500.

The image processor 1500 connected to the camera 1700 converts the digital signals transmitted from the camera 1700 into other ones using a voltage image processing scheme. More specifically, the digital signals are image-processed by an image processing scheme, and the height and shape of the solder pump 1900 are measured by automatically and manually comparing the image processed signals to each other. A power supply 1800 may be further provided to supply electricity to the probe unit 1100 and detector 1200.

More specifically, the power supply 1800 may include a first electrode 1800a connected to the transparent electrode 1210 located in the detector 1200 and a second electrode 1800b connected to the probing member 1110 of the probe no it 1100. Accordingly, a voltage is app lied by the power supply 1800 to the liquid crystal through the transparent electrode 1210. The power supplied from the power supply 1800 may include any one of a DC voltage, an AC voltage, and a pulse voltage.

Figure 22:
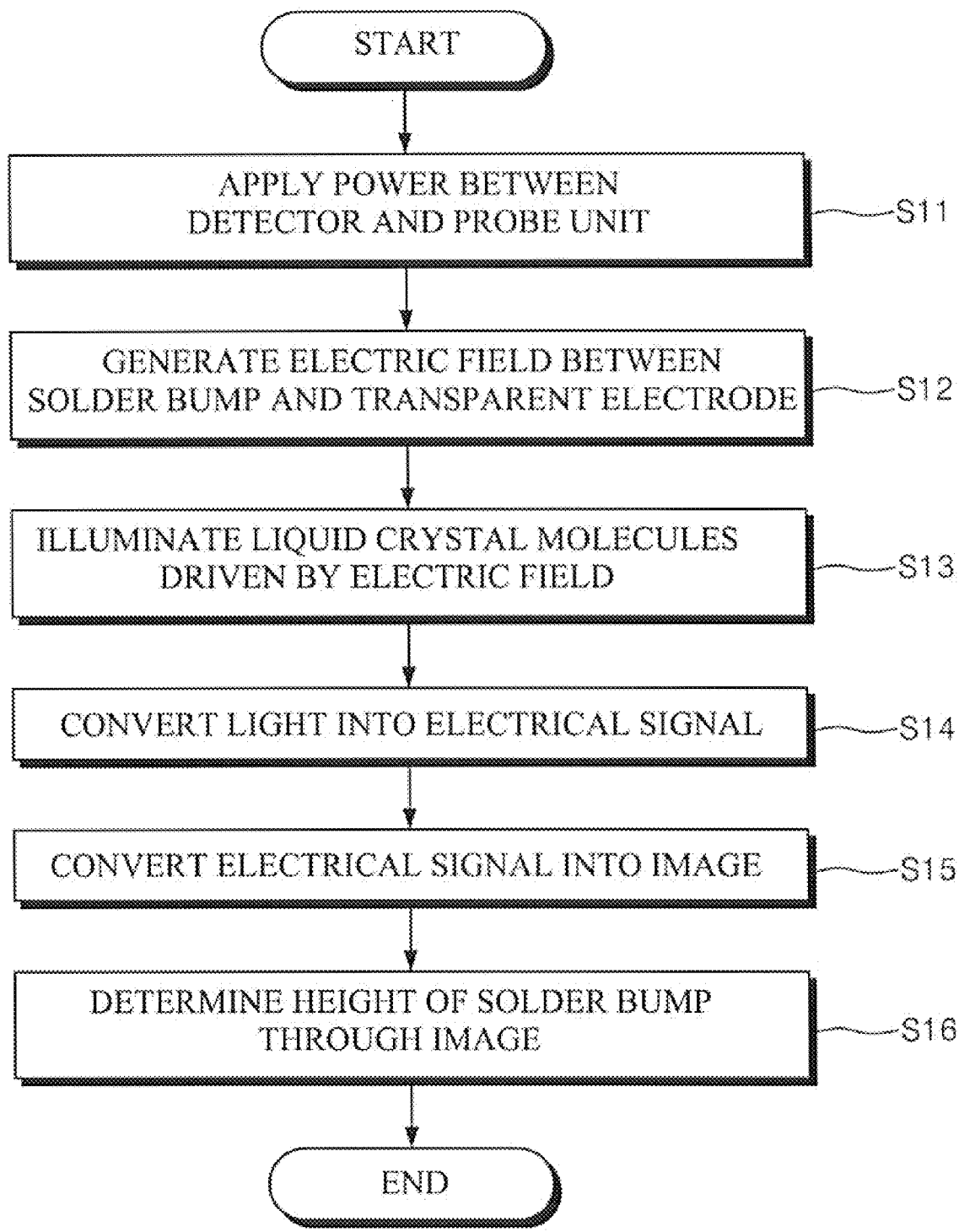
FIG. 22 is a flow chart illustrating a method of measuring the height of a solder bump according to an exemplary embodiment of the present invention.

FIG. 22 is a flow chart illustrating a method of measuring the height of a solder bump according to an exemplary embodiment of the present invention.

Referring to FIG. 22, a method of measuring the height of the solder bumper includes applying power to the detector and the probe unit (step S11).

Power (bias voltage) is applied to the probe unit connected to the soldier bumper under test and the transparent electrode included in the detector.

An electric field is generated between the solder bumper and the transparent electrode (step S12).

A bias voltage is applied by the power supply between the transparent electrode and the probing member to generate an electric field between the solder bumper electrically connected to the probing member and the transparent electrode.

The liquid crystal molecules are driven by the electric field. The electric field alters the twist of the liquid crystal molecules to change the brightness of incident light passing through the liquid crystal molecules according to the height of the solder bumper.

If there are abnormal solder bumpers, which have the different height from the others, or there is incompleteness in attachment between the solder bumper and the contact pad of the printed circuit board, a discrepancy may take place between the electric field values of the normal solder bumpers and the electric field values felt by the liquid crystal molecules.

As the abnormal solder bumper is located closer or farther to the liquid crystal layer than to the normal solder bumper, the strength of electric field weakens correspondingly, which may cause a difference in the magnitude of the electric field felt by the liquid crystal molecules.

This difference in the magnitude of the electric field may cause a difference in driving of the liquid crystal molecules corresponding to each solder bumper.

The liquid crystal molecules driven by the electric field are illuminated with light (step S13).

The transmittance of light passing through the liquid crystal layer may vary with the electric field. The light may be different in the intensity or wavelength according to the alignment of liquid crystal molecules when reaching the polarizing plate.

The light is converted into electrical signals (step S14).

The light passes from the polarizing plate through the beam splitter to the camera. The camera converts the light into electrical signals.

The electrical signals are converted into an image (step S15).

The electrical signals acquired by the camera are analogue signals, and these analogue signals are amplified by an amplifier and then converted into digital signals. The digital signals thusly acquired may be different from each other according to the difference in driving of the liquid crystal molecules. The intensity of brightness measured is processed by the image processor.

The height of the solder bumper is measured from the image (step S16).

The height and shape of the solder bumper may be measured by comparing the images converted by the image processor to each other.

Figure 23:
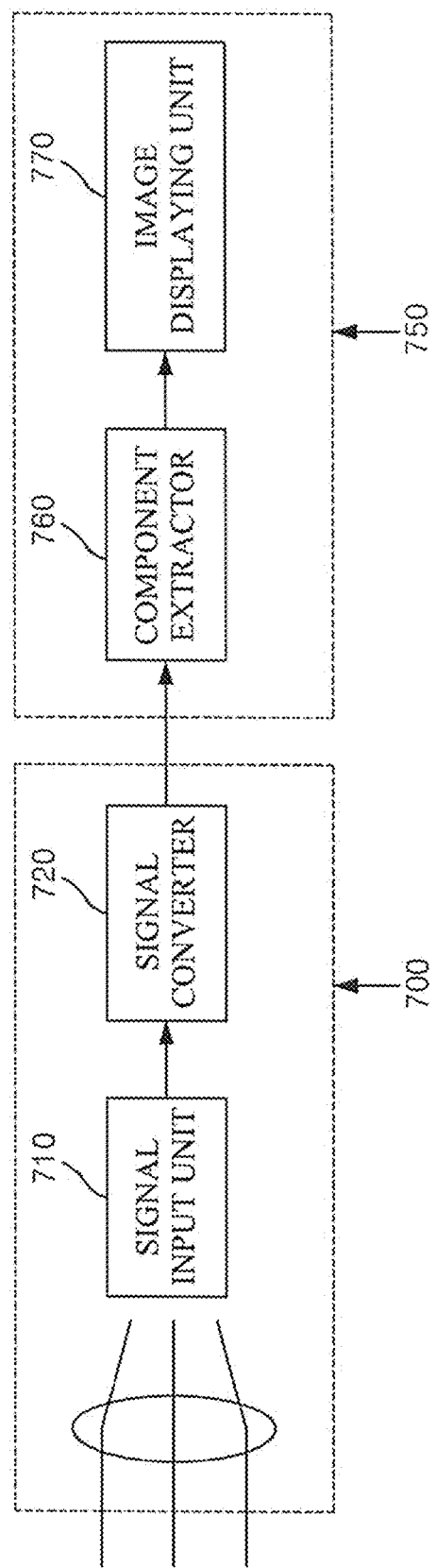
FIG. 23 is a view illustrating a data process according to an exemplary embodiment of the present invention.

FIG. 23 is a view illustrating a data process according to an exemplary embodiment of the present invention.

Referring to FIG. 23, a lens of a camera, located before a signal input unit 710, may adjust the amount of light passing through a polarizing plate into the signal input unit 710. Accordingly, an image of a DUT is transmitted to the signal input unit 710 through the lens.

The signal input unit 710 converts the image of the DUT having passed through the lens into electrical signals and the electrical signals are amplified by the amplifier. The electrical signals outputted from the signal input unit 710 are analogue signals determined according to the brightness and color values of the image.

The signal converter 720 may convert the analogue signals outputted from the signal input unit 710 into digital image signals. The analogue image signal is separated into a brightness component and a chrominance component by the signal converter 720 before being digitalized. This process may be also handled by the image sensor.

The component extractor 760 may adjust data values converted into digital image signals. The data converted into digital image signals have only a part of the ranges of brightness and the chrominance. The brightness and the chrominance of an image expressed as 8 bits may have a level between 0 and 255. The digital image signals passing through the signal converter 720 uses only the brightness and chrominance owned by a part of the entire signals. Accordingly, the digital image signals entering into the component extractor 760 are converted so that the color value has a level between 0 and 255. The process of converting the brightness and color tone of digital image signals is performed by a microprocessor included in the component extractor 760.

To reduce unnecessary operations, a converting cable may be provided, which contains the levels of brightness and color tone ranging from 0 to 255.

The digital image signals having passed through the above process are displayed by the image displaying unit 770.

Figure 24:
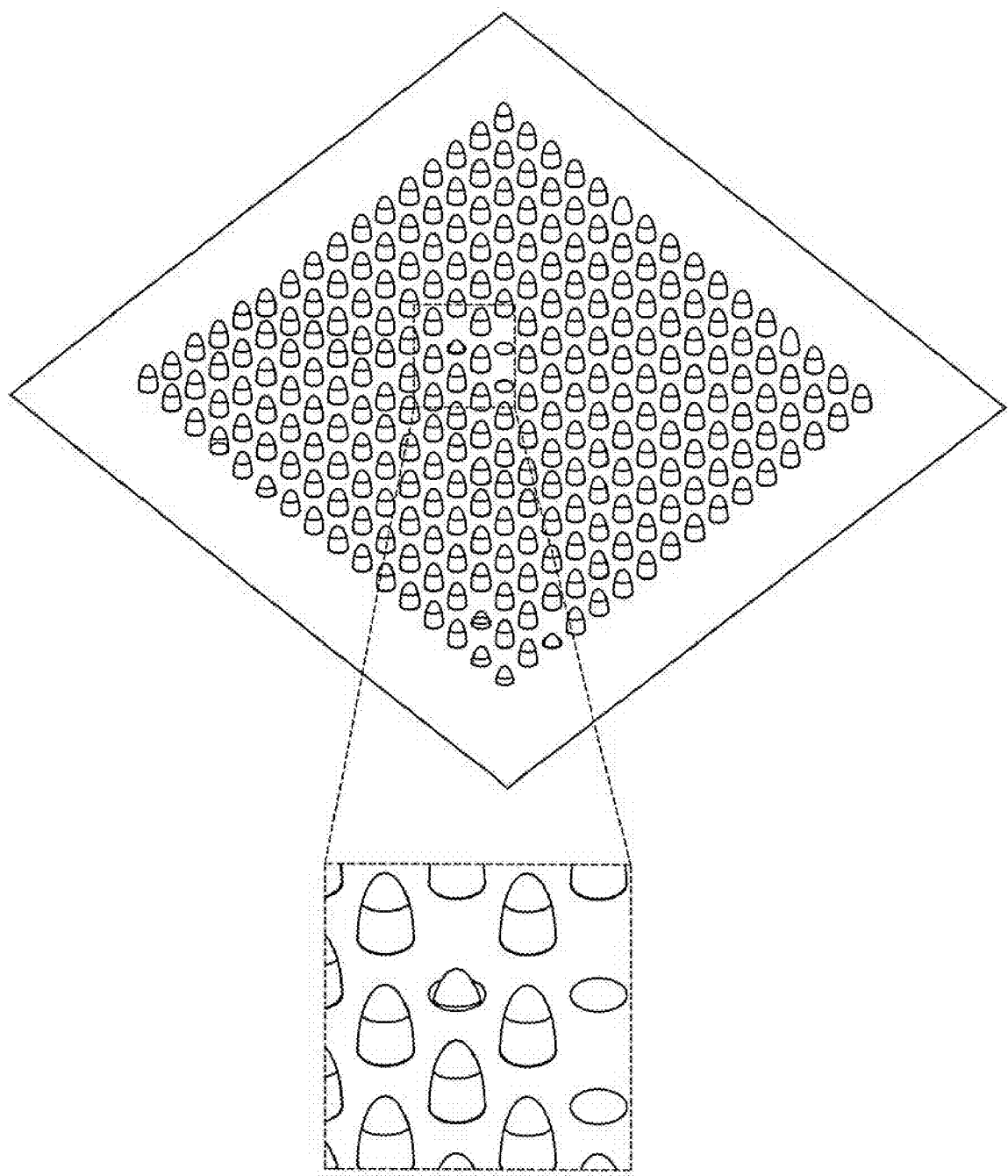
FIG. 24 is a view illustrating a height of a solder bump measured by a ball grid array package testing device according to an exemplary embodiment of the present invention.

FIG. 24 is a view illustrating a height of a solder bump measured by a ball grid array package testing device according to an exemplary embodiment of the present invention.

Referring to FIG. 24, the shape of the solder bumper expressed by the image processor may be represented as a gray value with a level ranging from 0 and 255. For example, as the level of brightness becomes close to '0'. it darkens, and as the level of brightness becomes close to '255' it brightens. The height of the solder bumper may be exactly measured by yielding a three dimension image with reference to the intensity and distribution of the brightness.

Figure 25:
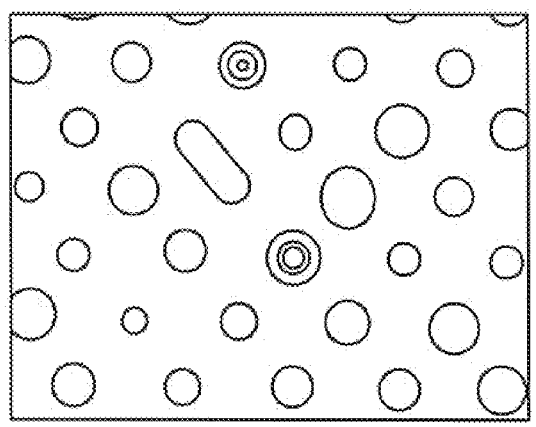
FIG. 25 is a view illustrating defects rising at a solder bumper measured by a ball grid array package testing device.
Figure 25:
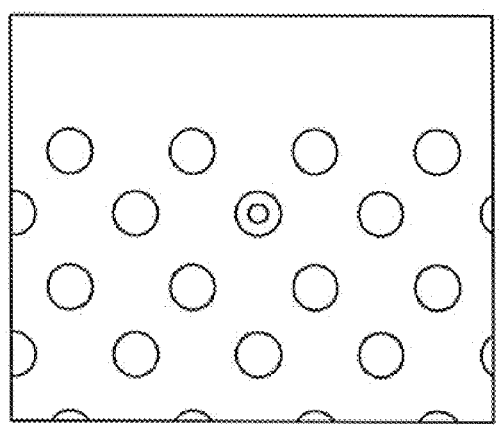
Figure 25:
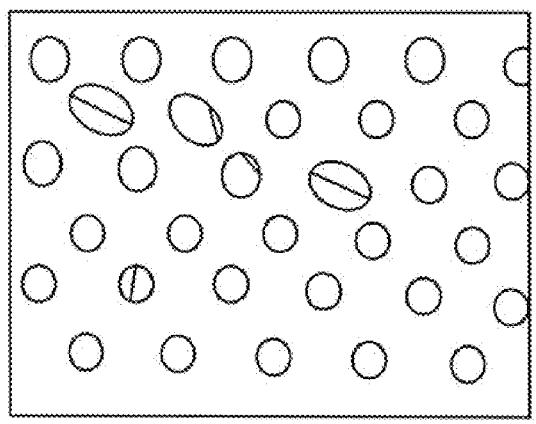
Figure 25:
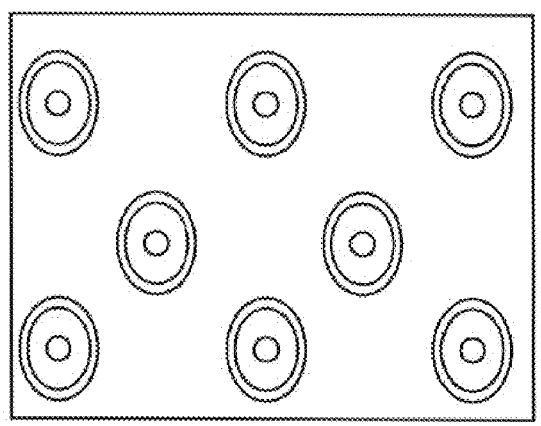

FIG. 25 is a view illustrating defects rising at a solder bumper measured by a ball grid array package testing device.

Referring to FIG. 25, the ball grid array package testing device of the present invention may determine whether or not there are any defects with reference to the shape of the solder bumper, as well as the height of the solder bumper.

The bridge bump shown in FIG. 25 represents defects caused by connection of one solder bumper to another. The distance between solder bumps is smaller than the distance between terminals provided to mount solder balls contacting the upper surface of the printed circuit board in the ball grid array package. Accordingly, the solder bump is attached to its neighboring solder bump by molecular attraction or shaped as a dumbbell due to defects caused during a mask process.

"Missing bump" refers to a defect where no image is displayed with respect to a solder bump because the solder bump is absent at a site where the solder bumper is necessarily located. The solder bump should be formed to be electrically connected in a one-to-one manner to a wire coupled with a terminal. Accordingly, no electric fields are generated upon examination since the solder bump is not located at the site where the solder bump is necessarily located. Accordingly, the site is represented in black, where the light does not pass through the liquid crystal.

"Bump scratch" refers to a defect including scratches on the surface of the solder bump. If there are scratches on the top surface of the solder bump, the area of the surface with the scratches becomes lower in height than the other areas of the surface. The electric field generated at the area with the scratches is different from the electric field generated at the normal area, and therefore, the scratches may cause a difference in brightness between the normal area and the abnormal area with scratches.

"Bump misalignment" refers to a defect caused by the misalignment between the contact pad formed on the printed circuit board and the location of the solder bump. Upon forming of solder bump, the midpoint of the solder bump should be aligned to the midpoint of the contact pad connected to the wire. However, when a misalignment takes place between the solder bump and the wire due to external factors, for example, vibrations occurring during manufacturing processes, although the electrical connections can be established between the solder bumper and the wire, the intensity of electric field becomes weak, thus causing the images to be blurred.

The defects of the solder bumper may be exactly measured by yielding a three-dimension image with reference to the intensity and distribution of the brightness.

Other defects can be measured using the testing device of the present invention.

Structural defects in wiring formed on the printed circuit board of the ball grid array package can be measured by exchanging the probing members of the probe unit. The structural defects may include. For example, open circuits or short circuits that may occur during manufacturing process of the printed circuit board.

In the normal printed circuit board, the contact pad and the terminal should be electrically connected or disconnected to/from each other by wiring according to the designed circuits. However, if an open circuit occurs in wires, then electrical connection between the terminal and solder pump is broken. A short circuit occurring in the wires may change the voltage applied to another contact pad other than the contact pad under test. These structural defects can be detected by applying a voltage to each of terminals formed on the printed circuit board in row or column directions, or by simultaneously applying a voltage to grouped terminals.

The measurement of the height and shape of the solder ball and the detection of the short and open circuits may be performed independently or in combination of at least two detections or measurements.

Figure 26:
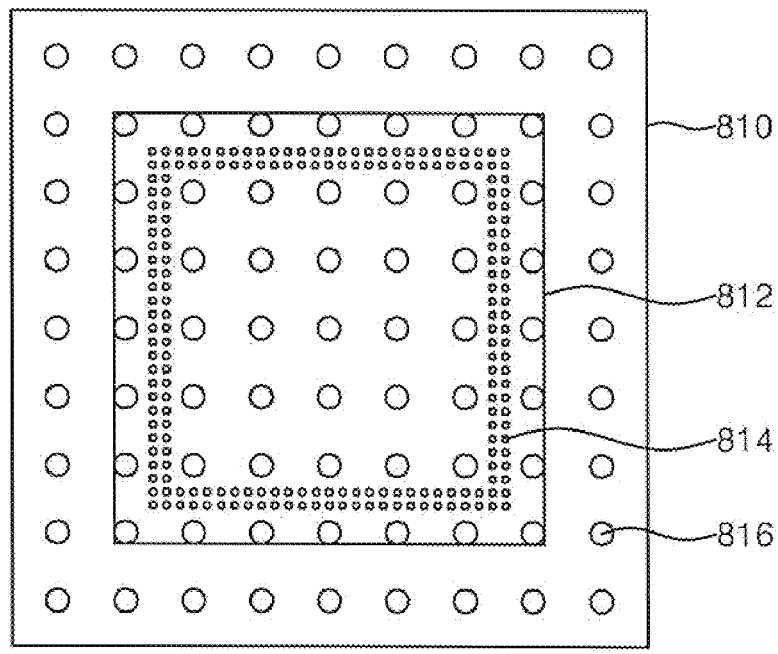
FIGS. 26 and 27 are plan views illustrating normal BGA packages.
Figure 27:
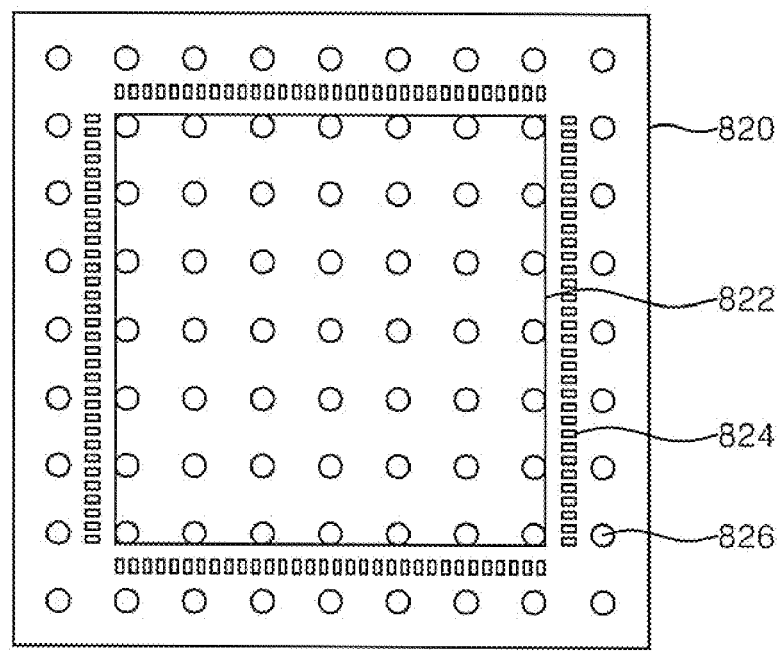

FIGS. 26 and 27 are plan views illustrating normal BGA packages.

Figure 28:
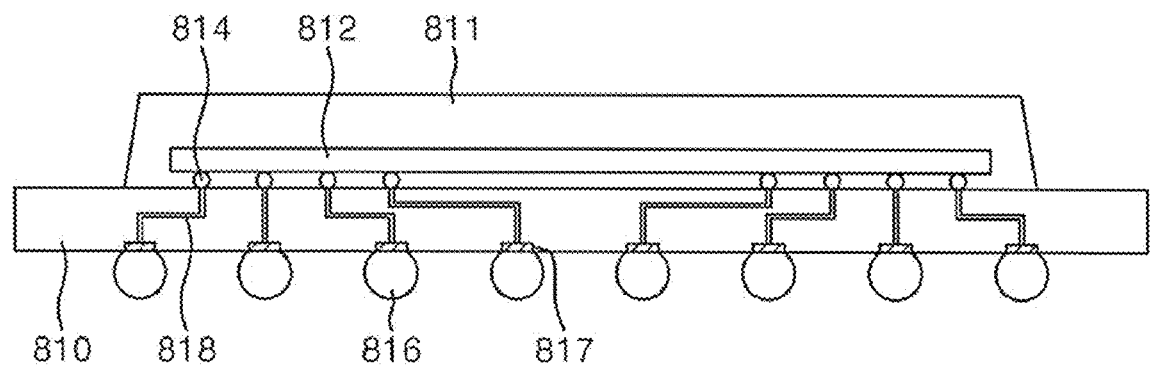
FIGS. 28 and 29 are cross sectional views of the BGA packages shown in FIGS. 26 and 27, respectively.
Figure 29:
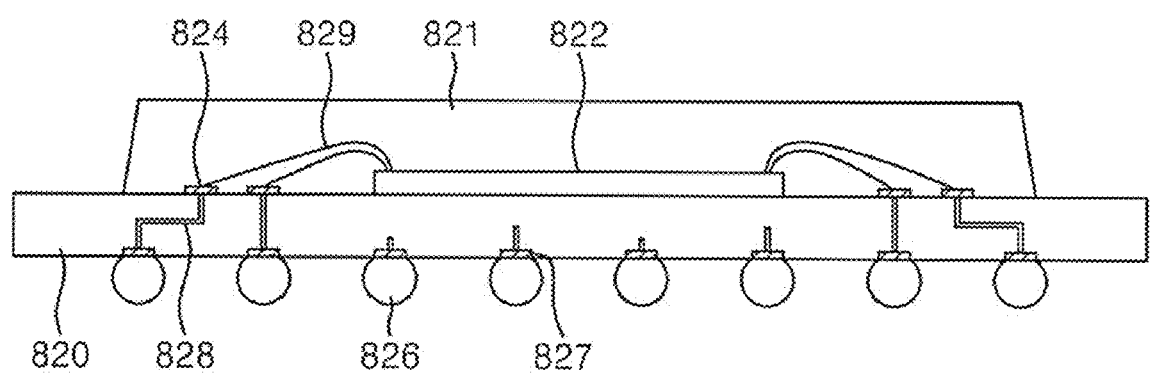

FIGS. 28 and 29 are cross sectional views of the BGA packages shown in FIGS. 26 and 27, respectively.

Referring to FIGS. 26 and 28, the BGA package includes a circuit board 810 and a semiconductor chip 812 mounted on the circuit board 810. The semiconductor chip 812 is sea led on the circuit board 810 by a molding compound 821 such as epoxy molding compound ("EMC").

The semiconductor chip 812 may be mounted on the circuit board 810 using a Flip-chip technology. A plurality of contact pads 814 are formed on the circuit board 810.

The contact pad 811 includes a solder bumper 814 formed on a bump land (not shown) extended from a wire 818 in the circuit board 810. The solder bumper 814 is formed at a location corresponding to a pad (not shown) of the semiconductor chip 812. A plurality of terminals are formed on a rear surface of the circuit board 810.

Each terminal of the BCA package may include a ball land 817 extended from the wire 818 and a solder ball 816 formed on the ball land 817.

The solder bumper 814 and the solder ball 816 are electrically connected to each other by the wire 818. The wire 818 may be formed in a single layer or multilayer depending on circuit design. Accordingly, it can be seen from the circuit design how the solder bumper 814 is associated with the solder ball 816.

Referring to FIGS. 27 and 29, the semiconductor chip 822 may be electrically connected to a wire 828 of a circuit board 820 through a bonding wire 829. A plurality of contact pads 824 are formed on the circuit board 820, and each thereof is electrically connected to the wire 828. The semiconductor chip 822 is scaled by a sealant to protect the semiconductor chip 822 from the ambient environment.

A plurality of terminals are formed on a rear surface of the circuit board 820. Each terminal of the BGA package may include a ball land 828 extended from the wire 827 and a solder ball 826 formed on the ball land 828.

The solder bumper 821 and the solder ball 826 are electrically connected to each other by the wire 828. The wire 828 may be formed in a single layer or multilayer depending on circuit design. Accordingly, it can be seen from the circuit design how the solder bumper 824 is associated with the solder ball 826.

Figure 30:
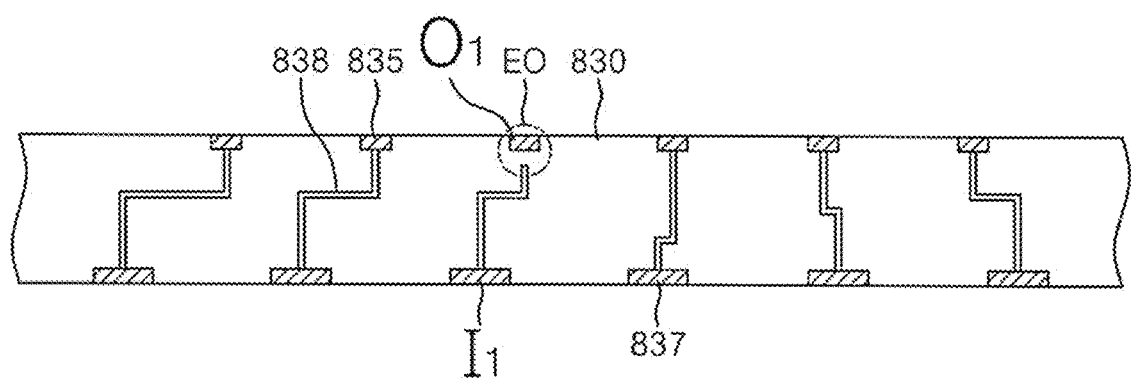
FIGS. 30 and 31 are views illustrating defects of interconnects included in a printed circuit board.
Figure 31:
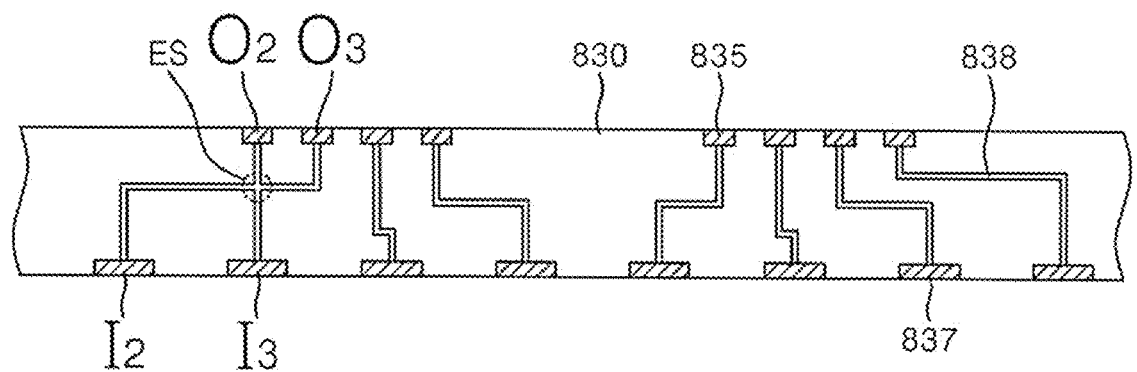

FIGS. 30 and 31 are views illustrating defects of interconnects included in a printed circuit board.

There could be structural defects while wiring is made on a circuit board, such as open circuits and short circuits.

The circuit board 830 may have a disconnection E0 as shown in FIG. 30 and a part abnormally interconnected to a neighboring wire as shown in FIG. 31 by defects having occurred during the manufacturing process of the circuit board 830.

In a normal circuit board 830, the contact pad 835 and the terminal 837 should be electrically connected or insulated to/from each other by the wire 838 depending on circuit design. However, if there is a disconnection E0 in the wire 838, a contact pad O1 and a terminal I1 corresponding to each other are not electrically connected to each other. In addition, if there is an interconnected part ES in the wire 838, lie application of a voltage to a terminal I2 of the circuit board 830 may change voltages applied to another contact pad O3 corresponding to another terminal I3 as well as the contact pad O2 corresponding to the terminal 12.

Figure 32:
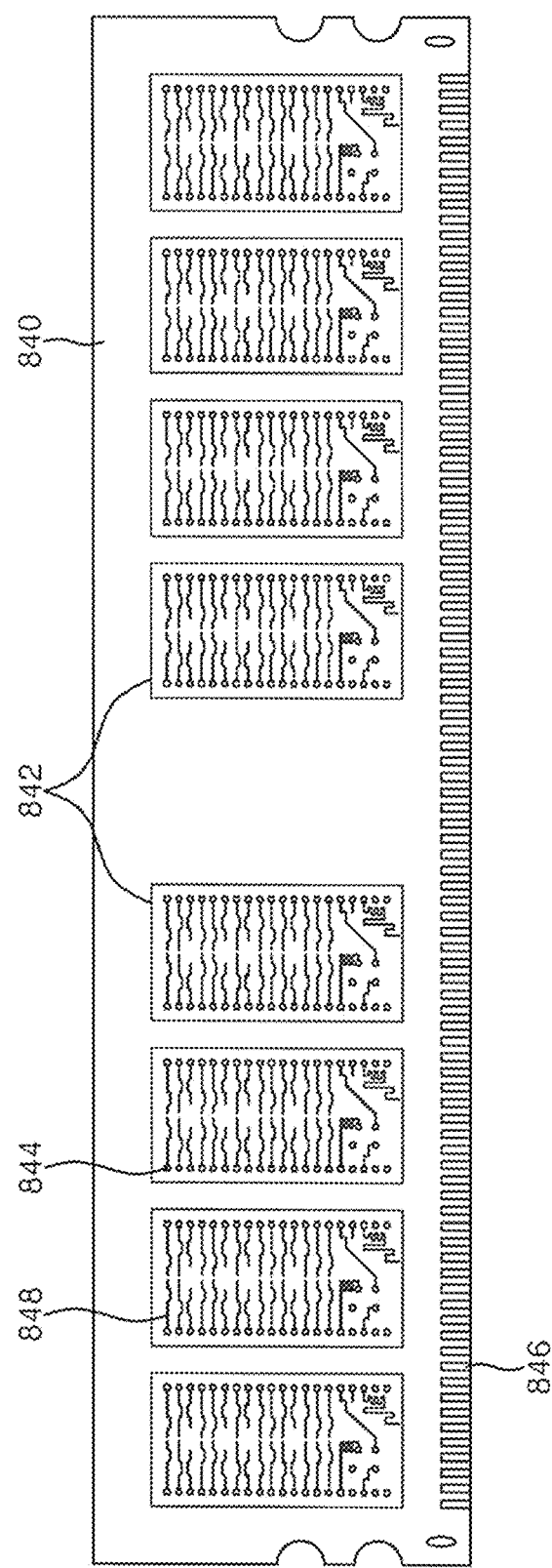
FIG. 32 is a view illustrating another PCB measurable by a testing device according to an exemplary embodiment of the present invention.

FIG. 32 is a view illustrating another PCB measurable by a testing device according to an exemplary embodiment of the present invention.

Referring to FIG. 32 the testing device may test a printed circuit board on which a semiconductor package is mounted, as well as the circuit board for semiconductor package.

The printed circuit board 840 on which the semiconductor package is mounted includes a plurality of package areas 842, and a plurality of contact pads 844 electrically connected to the semiconductor packages are formed on the package areas 842. The contact pads 844 are connected to the terminals 846 through a wiring layer 848 formed on the printed circuit board 840. The wiring layer 848 may be formed on the printed circuit board 840 in a single layer or multilayer.

The terminals 846 are connected to an electronic device, and electricity and signal are supplied from the electronic device to the terminals. It can be seen how the terminals 846 are connected to the contact pads 844 depending on circuit design.

Figure 33:
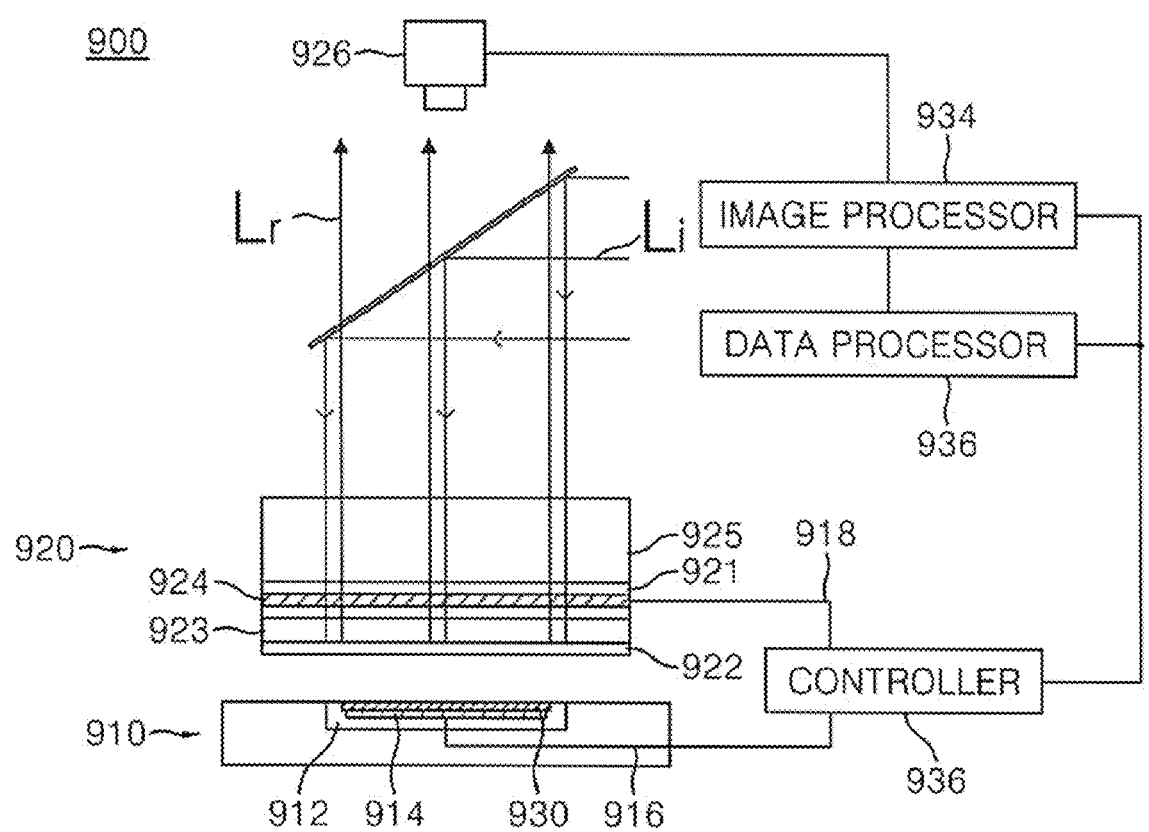
FIG. 33 is a view illustrating a PCB testing device according to an eight exemplary embodiment of the present invention.

FIG. 33 is a view illustrating a PCB testing device according to an eight exemplary embodiment of the present invention.

Referring to FIG. 33, the testing device 900 according to an exemplary embodiment of the present invention includes a stage on which an inspection target 930 is placed and a detector 920 for detecting interconnects in the inspection target 930.

A testing socket 940 on which the inspection target 930 is placed and a test line 916 through which test electricity is supplied to the inspection target 930 may be connected to the stage 910.

The test line 916 is connected to a plurality of test electrodes 914 formed in the testing socket 940. The test electrodes 914 are connected to terminals of the inspection target 930, respectively.

The inspection target 930 may further include the terminals to which external voltages are applied, wires connected to the terminals, and contact pads electrically connected to the terminals through the wires. For example, the inspection target 930 may include a circuit board used for a semiconductor package or a printed circuit board on which the semiconductor package is mounted. Each of the circuit board and the printed circuit board may include a terminal through which an electrical signal is externally supplied, and contact pads, each of which has a size and a pitch relatively small over those of the terminal.

The testing socket 940 may include test electrodes corresponding to the terminals arranged on the inspection target, and the testing socket 940 may be structured to be detachably combined with the stage 910. Accordingly, the testing socket 940 for testing wires may be exchanged into another depending on the kind of the inspection target.

The detector 920 is located before the inspection target 930, and includes a polarizing plate 921, liquid crystal layer 923, and a transparent electrode 924. The liquid crystal layer 923 may be interposed between the transparent electrode 921 and a lower substrate 922. The transparent electrode 924 may be made of a transparent conductive material, and is connected to a common line 918 for applying of a common voltage.

The liquid crystal layer 923 may be aligned to have a prescribed angle with respect to the polarizing plate 921. The liquid crystal molecules contained in the liquid crystal layer 923 rotates by an electric field generated between the transparent electrode 921 and the inspection target 930 to alter the transmittance of light passing through the liquid crystal layer 923 and the polarizing plate 921.

The detector 920 represents the intensity of the electric field and/or presence or absence of the electric field as an optical image using the transmittance. The interconnects of the inspection target 930 may be examined using the optical image.

The polarizing plate 921 is arranged before the liquid crystal layer 923 with respect of the light incident onto the liquid crystal layer 923 to polarize the light.

The liquid crystal molecules may be largely classified into ones with a positive dielectric isotropy and ones with a negative dielectric isotropy. The liquid crystal molecules with a positive dielectric isotropy are arranged parallel to the electric field, and the liquid crystal molecules with a negative dielectric isotropy are arranged perpendicular to the electric field.

The liquid crystal may include nematic liquid crystal that may be driven with a lower voltage. The liquid crystal molecules may be driven in a twisted nematic (TN) mode, a super twisted nematic (STN) mode, an in-plane switching (IPS) mode, a vertical alignment (VA) mode, and an optically compensated bend (OCB) mode.

The present invention uses the transmittance of light according to the polarizing axis of the polarizing plate and the aligning direction of liquid crystal molecules. The present invention may use liquid crystal molecules with a positive dielectric isotropy and liquid crystal molecules with a negative dielectric isotropy by properly adjusting the aligning direction of the liquid crystal molecules and the direction of the polarizing axis.

For example, the liquid crystal molecules with a positive dielectric isotropy used for the present invention may align the liquid crystal molecules vertically to the polarizing direction of the polarizing plate 921. For example, the liquid crystal molecules with a negative dielectric isotropy used for the present invention may align the liquid crystal molecules so that the liquid crystal molecules are pre-tilted in the direction perpendicular to the polarizing direction of the polarizing plate 921.

In a case where no electric fields are generated across the liquid crystal layer 923, the former serves as a normal black and the detector has a low transmittance, and the latter serves as a normal black and the detector has a high transmittance. In a case where an electric field is generated across the liquid crystal layer 923, the former may increase its transmittance because the liquid crystal molecules rotate in the direction parallel to the electric field and the latter may decrease because the liquid crystal molecules rotate in the pre-tilted direction vertical to the electric field.

As shown in FIG. 33, incident light Li may be emitted from an external light source (not shown) to the detector 920. The incident light Li passes through the polarizing plate 921 and the liquid crystal layer 923 and is reflected by a reflecting plate formed on the surface of the lower substrate 922 to be directed outside the detector 920 as an emitting light Lr. The emitting light Lr becomes different in brightness according to the direction of the liquid crystal molecules contained in the liquid crystal layer 923.

On the contrary, the incident light Li may be emitted outwards from the rear surface of the liquid crystal layer 923 via the liquid crystal layer 923. The incident light Li may be supplied from a back light unit formed under the liquid crystal layer 923, and the polarizing plate 921 may be arranged before/behind the liquid crystal layer 923 with respect to the incident light Li, i.e. at the front surface and rear surface of the liquid crystal layer 923.

The testing device according to an exemplary embodiment of the present invention may further include a camera 926 opposite to the detector 920. The camera 926 captures an image represented on the detector 920 and transmits the captured image to the image processor 934.

The terminals of the inspection target 930 are connected to the electrodes of the testing socket 940 to test the inspection target 930. An electric field is generated between the contact pad of the inspection target 930 and the transparent electrode 924 by applying a test voltage across the terminal of the inspection target 930 and a common voltage across the transparent electrode 921.

If the contact pad is connected to the terminal for applying of the test voltage, then an electric field is generated between the contact pad and the transparent electrode 924, and if the contact pad is not connected to the terminal for applying of the test voltage, then no electric field or only a weak electric field is generated between the contact pad and the transparent electrode. If the detector 920 is illuminated with light, the image formed by the electric field between the contact pad and the transparent electrode is represented on the detector 920.

For example, a part of the detector corresponding to the contact pad, to which the test voltage is transferred is represented as white in the detector which is represented as black in its normal state, and a part of the detector corresponding to the contact pad to which the test voltage is transferred is represented as black in the detector which is represented as white in its normal state.

A reference image of a normal inspection target may be obtained by a designed circuit of the inspection target 930. Accordingly, a part omitted from the image represented on the detector may be recognized as disconnection when the image represented on the detector is compared with the reference image. If an image corresponding to the contact pad not connected to the terminal to which the test voltage has been app lied on the designed circuit is represented on the detector, it can be considered as an occurrence of an abnormal short circuit it in the wire of the inspection target 930.

The testing device according to an exemplary embodiment of the present invention includes a controller 132 for applying a common voltage and a test voltage to the transparent electrode 921 and the test electrode 914, respectively. The controller 132 applies the test voltage to the test electrode 914 through the test line 916 and the common voltage to the transparent electrode 9241 through a common line 918.

The voltage applied by the controller 132 has an electric potential between an electric potential of the test electrode 914 and an electric potential of the transparent electrode 924. For example, the controller 132 applies ground voltage to the transparent electrode 924 and applies a positive voltage or negative voltage to the test electrode 914 to be capable of generating an electric field across the liquid crystal layer 923.

The controller 132 applies a test voltage to the plurality of test electrodes 911 simultaneously or sequentially according to a prescribed order, and controls the entire operations of the testing device.

The image captured by the camera 926 is transferred to the image processor 934. The image processor 934 converts the image into digital signals, and amplifies and filters the digital signals. The data processor 936 may detect the type and location of wiring defects in the inspection target from the digital image signals converted by the image processor 934.

Figure 34:
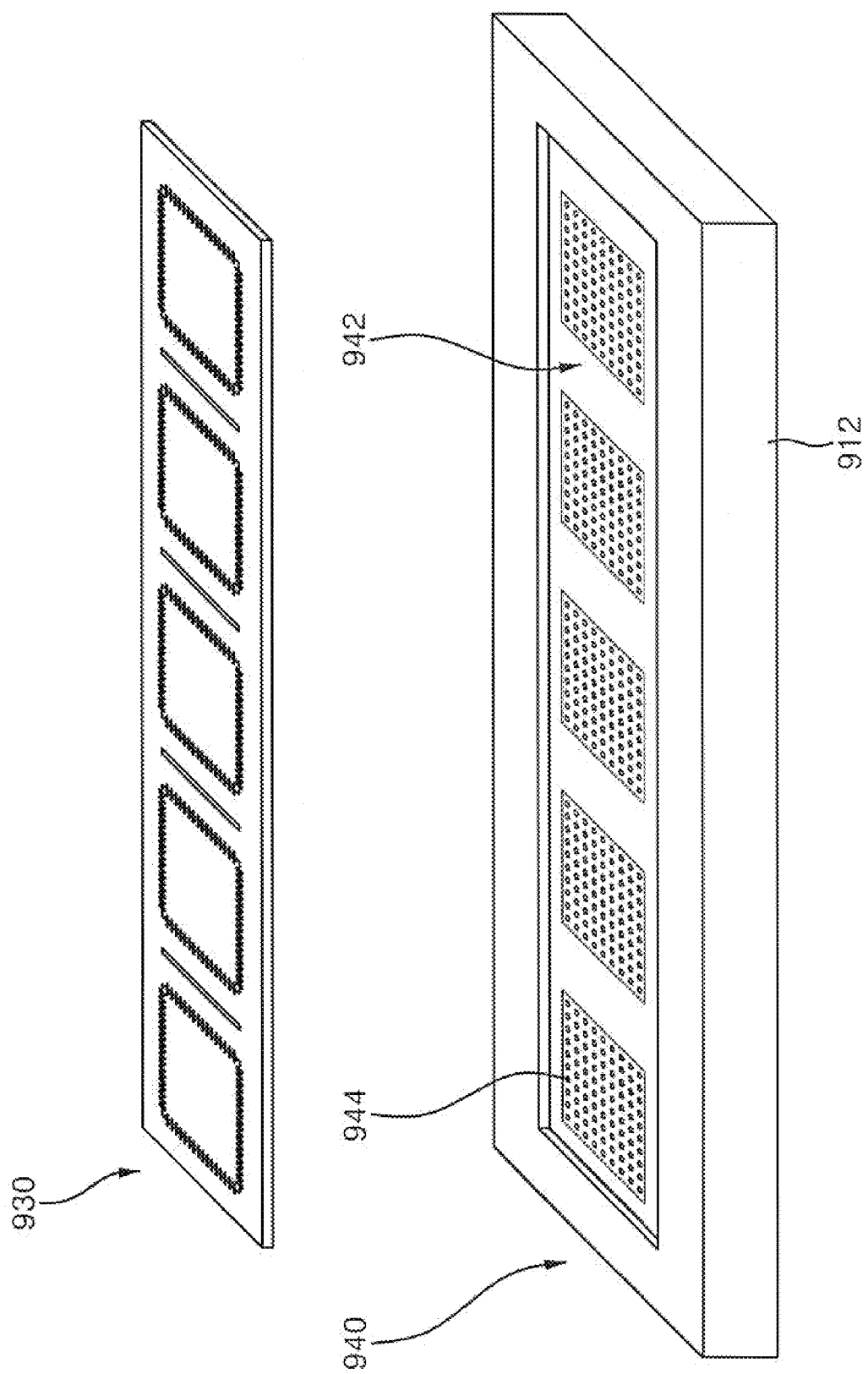
FIG. 34 is a view illustrating a testing socket of the PCB resting device according to the eight exemplary embodiment of the present invention.

FIG. 34 is a view illustrating a testing socket of the PCB testing device according to the eight exemplary embodiment of the present invention.

The PCB testing device may include a testing socket suitable for the structure and terminal structure of the inspection target, which may change in form depending on the inspection target.

Referring to FIG. 34, the testing socket 940 for detecting a BCA circuit board 930 includes a block 912 having a mounting area 942 on which the circuit board 930 is placed, and a plurality of test electrodes 944 formed on the mounting area 942.

The mounting area 942 has a shape corresponding to the circuit board 930. The test electrode 944 is formed at a location corresponding to the terminal of the circuit board 930 and brought in contact with the terminal of the circuit board 930 upon loading of the circuit board 930.

The test electrodes 941 may fail to make a one-to-one correspondence with the terminals formed on the circuit board 912. For example in a case where the pitch between the terminals is standardized in the arrangement of the terminals of the BGA circuit board, the number of the terminals is equal or smaller to/than the number of the electrodes formed at the mounting area 912. Accordingly, the testing socket 940 may be a universal socket with a standardized electrode pitch to test various circuit boards.

Although the testing socket for BGA circuit board has been exemplified, another testing socket on which the printed circuit board is placed for package mounting may also have a similar form. For example, the PCB testing socket may include a block on which the printed circuit board is placed, having test electrodes that correspond to terminals of the printed circuit board for connection to an electric device.

Figure 35:
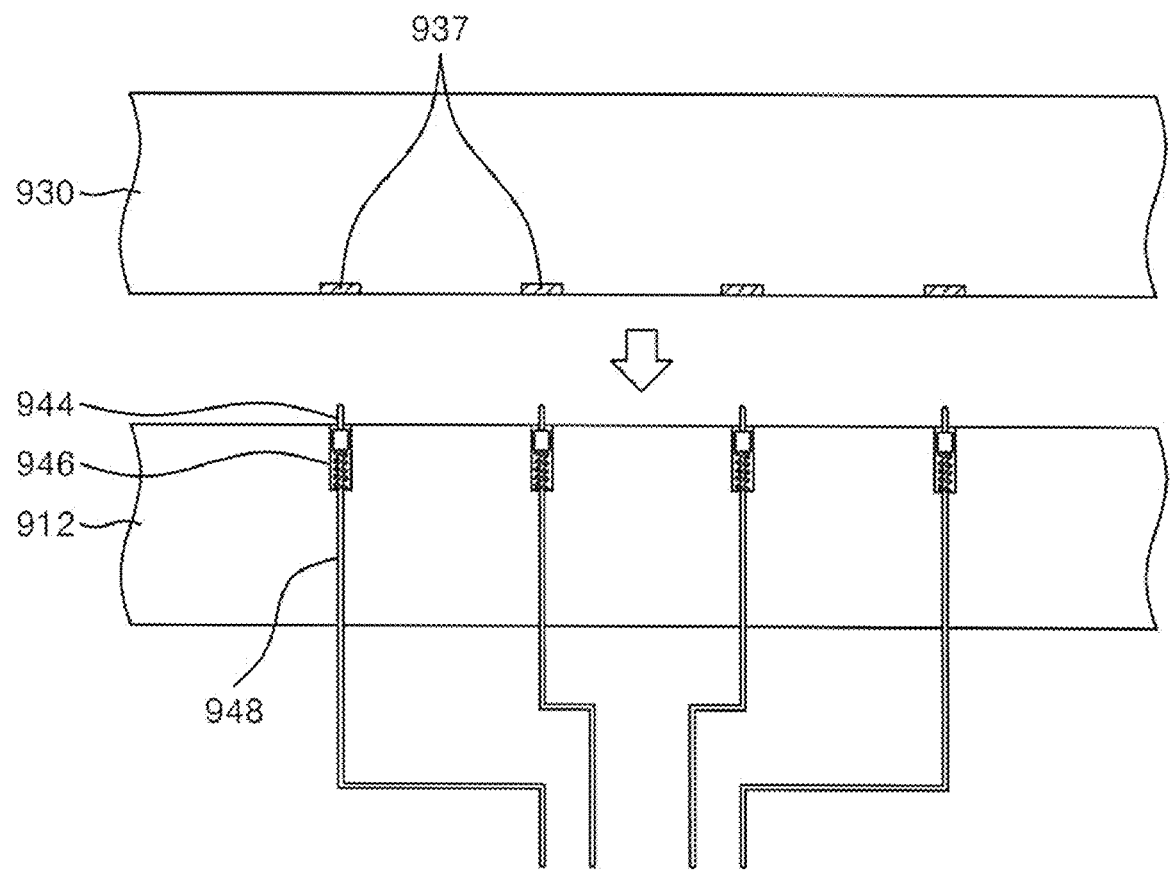
FIGS. 35 and 36 are views illustrating test electrodes of the testing socket according to the eight exemplary embodiment of the present invention.
Figure 36:
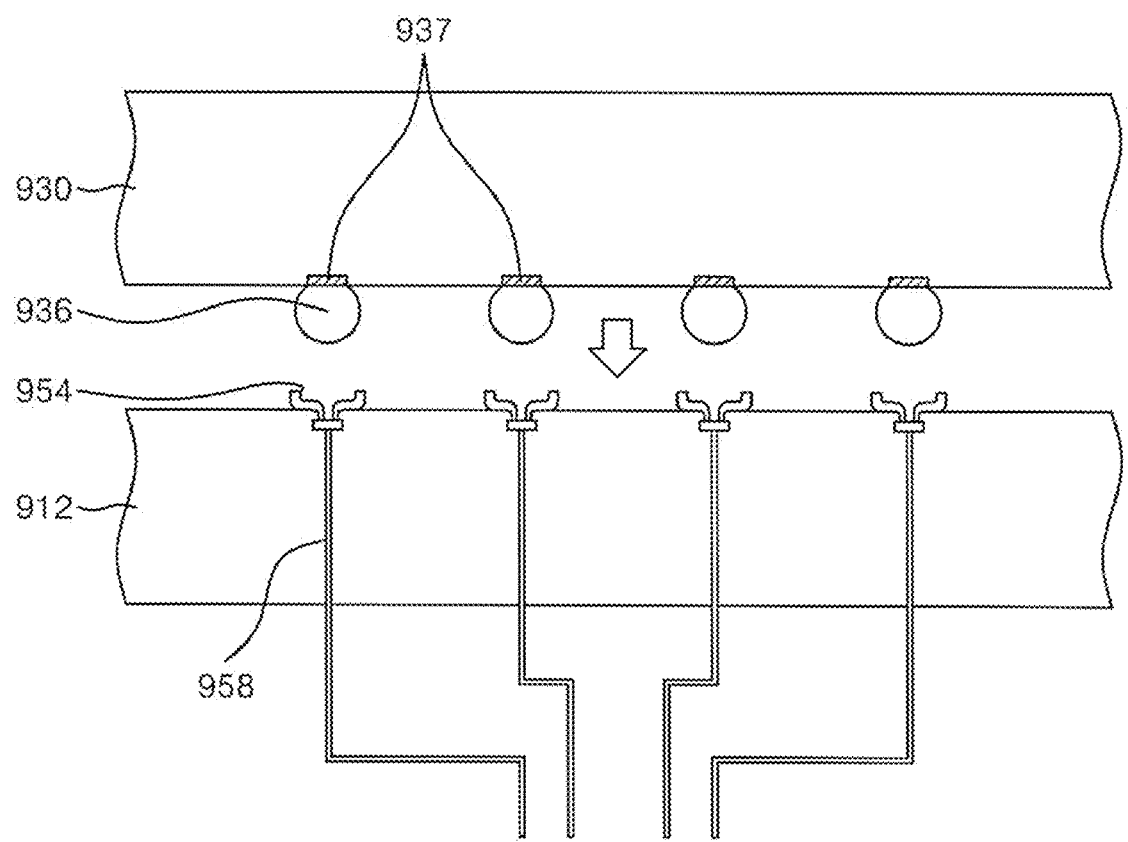

FIGS. 35 and 36 are views illustrating test electrodes of the testing socket according to the eight exemplary embodiment of the present invention.

Referring to FIG. 35, the test electrode may be shaped as a pin contacting the ball land 937 in the circuit board 930. The test electrode may be used to test a circuit board on which no solder balls are formed. The pin 944 may be brought in contact with the ball land exposed on the circuit board.

For example, the test electrode may include a pogo pin that has a pin 944 protruding from a block 912 and a spring that confers elasticity to the pin 944. When the circuit board 930 is loaded to contact the ball land 937, the pin 944 is pressed down inside the block 912 and comes in tight contact with the ball land 937 by the spring. A test voltage is applied to each pin 944 through a test line 948.

Referring to FIG. 36, a testing socket may be used to test the circuit board 930 which has the ball land 937 and the solder ball 936 formed on the ball land 937. The testing socket includes a plurality of test electrodes 954, each of which has a shape of a holder into which the solder ball 936 is inserted.

When the circuit board 930 is loaded, the test electrode 951 may be open and tightly contact the solder ball 936. A test voltage is applied to each test electrode 954 through a test line 958.

Figure 37:
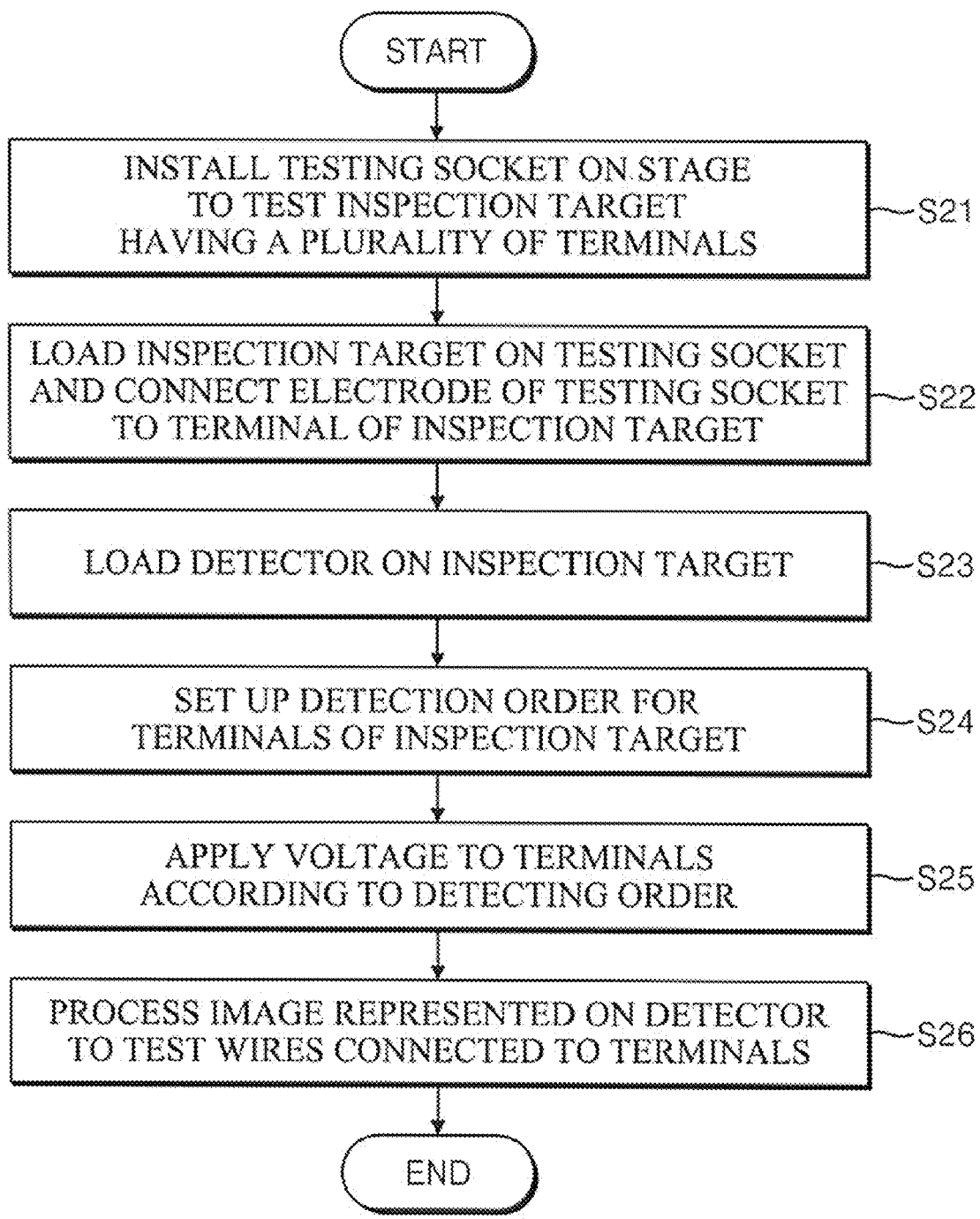
FIG. 37 is a flow chart of illustrating a method of detecting a PCB according to an exemplary embodiment of the present invention.

FIG. 37 is a flow chart of illustrating a method of detecting a PCB according to an exemplary embodiment of the present invention.

Referring to FIG. 37, a testing socket is installed on a stage to test an inspection target having a plurality of terminals (step S21). The inspection target may be a circuit board that has a plurality of contact pads to which elements are connected and a plurality of terminals connected to the contact pads through wires. For example, the circuit board may include a BGA substrate with a contacting pad to which a semiconductor chip is connected or a printed circuit board with a contact pad to which a package is connected. The terminal may include a pad exposed at a side of the circuit board or a solder ball formed on the pad of the BGA substrate.

The inspection target is loaded on the testing socket and the electrode of the testing socket is electrically connected to the terminal of the inspection target (step S22). A plurality of test electrodes are formed on the testing socket and may be connected to the terminals of the circuit board corresponding to the test electrodes.

The detector is loaded on the inspection target (step S23). The detector may be loaded as close to the inspection target as possible to raise the efficiency in detecting electric fields between the detector and the inspection target.

The detection order is set up for the terminals of the inspection target (step S24). A test voltage is applied to the terminals formed on the inspection target according to the detection order.

The detecting order may include an order by which the test voltage is sequentially applied to the terminals or another order by which the test voltage is simultaneously app lied to the terminals contained in one of a plurality of groups of the terminals, where the groups are sequentially selected.

The detecting order may be pre-inputted to the testing device before being selected, and the step S23 may be also performed at any stage of the method shown in FIG. 37.

A voltage is applied to the terminals according to the detecting order (step S25). When the voltage is applied to the terminals an electric field is generated between the contact pad connected to the terminal and the transparent electrode of the detector, and represented as an image on the detector.

The image represented on the detector is processed to test the wires connected to the terminals (step S26). If no electric field is generated between the transparent electrode and the contact pad that are connected to each other on a designed circuit, it is determined there is an open circuit between the terminal to which the test voltage has been applied and the contact pad corresponding to the terminal. If an electric field is generated between the transparent electrode and the contact pad that are not connected to each other on the designed circuit it is determined there is a short circuit between the terminal to which the test voltage has been applied and the contact pad corresponding to the terminal.

As described above, the present invention may detect any defects in the circuit board using an optical image of an electric field according to liquid crystal molecules driven by applying a voltage between transparent electrodes of a detector and terminals each having a large pitch without connecting a prove to contact pads each having a small pitch compared to the terminal.

Figure 38:
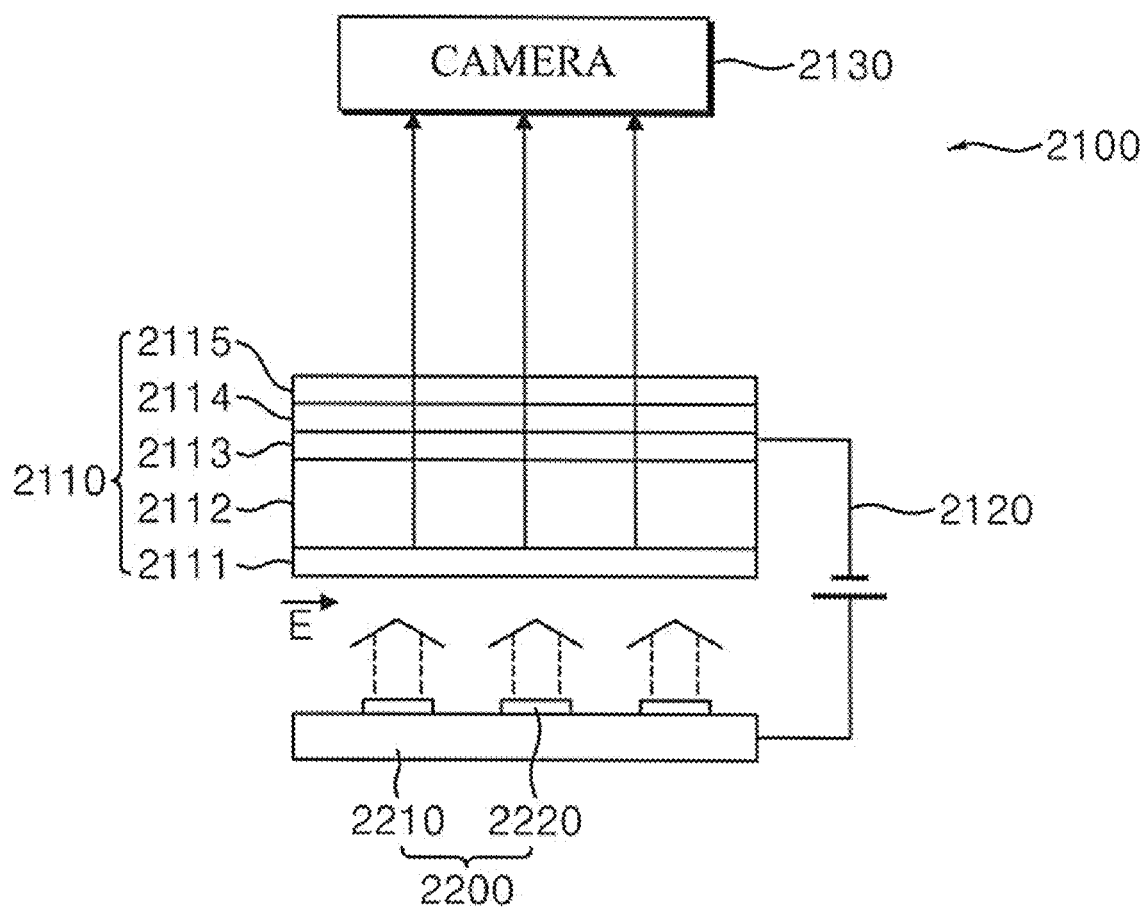
FIG. 38 is a view illustrating a tester testing device according to a ninth exemplary embodiment of the present invention.

FIG. 38 is a view illustrating a tester testing device according to a ninth exemplary embodiment of the present invention.

Referring to FIG. 38, the tester defect detection device 2100 may include a detector 2110, a power supply 2120, and a camera 2130.

A tester 2200 includes a base 2210 and a plurality of probing pins 2220 electrically connected to a product to be arranged on the base 2210 for test.

The detector 2110 may include a liquid crystal layer 2112, a transparent electrode 2113, and a polarizing plate 2115. The liquid crystal layer 2112 may be interposed between a transparent electrode 2114 and a lower substrate 2111. A reflecting plate may be further provided under the liquid crystal layer 2112 to reflect the incident light from the polarizing plate 2115.

The liquid crystal molecules contained in the liquid crystal layer 2112 are aligned at a prescribed angle with respect to the polarizing direction of the polarizing plate 2115 by an alignment layer (not shown). The aligning direction of the liquid crystal molecules may be a parallel direction or a vertical direction with respect to the polarizing direction of the polarizing plate 2115 depending on the kind of liquid crystal molecules.

The liquid crystal may include nematic liquid crystal that may be driven with a lower voltage. The liquid crystal molecules may be driven in a twisted nematic (TN) mode, a super twisted nematic (STN) mode, an in-plane switching (IPS) mode, a vertical alignment (VA) mode, and an optically compensated bend (OCB) mode.

When the probing pin of the tester 200 is detected, a voltage is applied to the transparent electrode 2113 and the probing pin.

More specifically, a power supply 2120 has two electrodes, one of which is connected to the transparent electrode 2113 and the other is directly connected to the probing pin 2220 of the tester 2200 or connected to the probing pin 2220 via a base 2210 in a case where the base 2210 is electrically connected to the probing pin 2220.

The camera 2130, located over the detector 2110, captures an image of the detector 2110 that is changed by driving of the liquid crystal molecules, and converts the acquired image into electrical signals.

The tester testing device 2100 tests any defects on the tester 2200 with a similar principle to that of a liquid crystal display device.

The transparent electrode 2113 of the detector 2110 corresponds to a transparent electrode of a liquid crystal display device, and the probing pins of the tester under test corresponds to pixel electrodes of the liquid crystal display device.

A bias voltage is applied to the transparent electrode 2113, the probing pins 2220, or base 2210 by the power supply 2120 to generate an electric field between the probing pins 2220 and the transparent electrode 2113.

When a voltage is applied between the transparent, electrode 2113 and the probing pins 2220, the liquid crystal molecules contained in the liquid crystal layer 2112 are rearranged by an electric field between the transparent electrode 2113 and the probing pins 2220.

The intensity of the electric field between the transparent electrode 2113 and the probing pins 2220 is in inverse-proportion to the distance between the transparent electrode 2113 and the probing pins 2220, the intensity of light incident onto the detector 2110 is in proportion to the intensity of the electric field, and the brightness of the detector 2110 varies with the intensity of light.

When the liquid crystal molecules driven by the electric field are illuminated with light, the light changes its intensity or wavelength as reaching the polarizing plate 2115 depending on the alignment of the liquid crystal molecules.

For example, when the liquid crystal molecules are aligned vertically with respect to the polarizing direction of the polarizing plate 2115, the liquid crystal molecules rotate in parallel with the direction of electric field to brighten a part of the detector, which is located at a position corresponding to the probing pin 2220. The brightness of the detector may be in proportion to the in tens icy of the electric field.

The light having passed through the polarizing plate 2115 is converted into electrical signals by the camera 2130.

The electrical signals converted by the camera 2130 may be different according to the difference in driving of the liquid crystal molecules, and this difference may be used to determine whether or not there are defects. That is, the location of the probing pin 220 may be found from a location corresponding to the probing pin 2220, which brightens or darkens, and abnormal probing pins may be found from a fact that the location brightens relative to the distance from the transparent electrode 2113 and the probing pin 2220.

Figure 39:
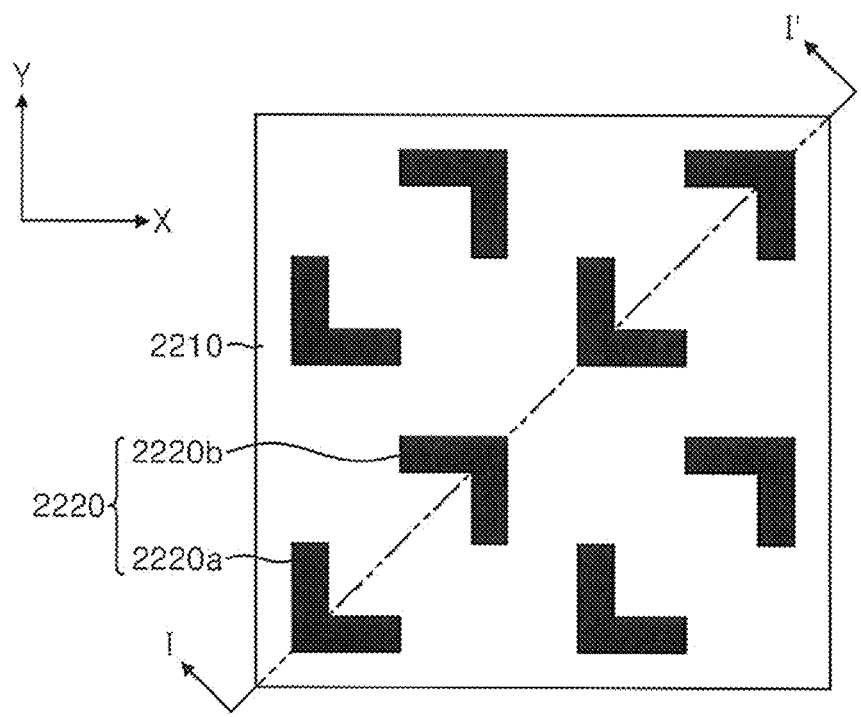
FIGS. 39 and 40 are views illustrating a method of testing a defect in a tester, each of which includes a graph illustrating a simulation result of the method, according to an exemplary embodiment of the present invention, wherein a socket for a BCA testing device has been simulated.
Figure 39:
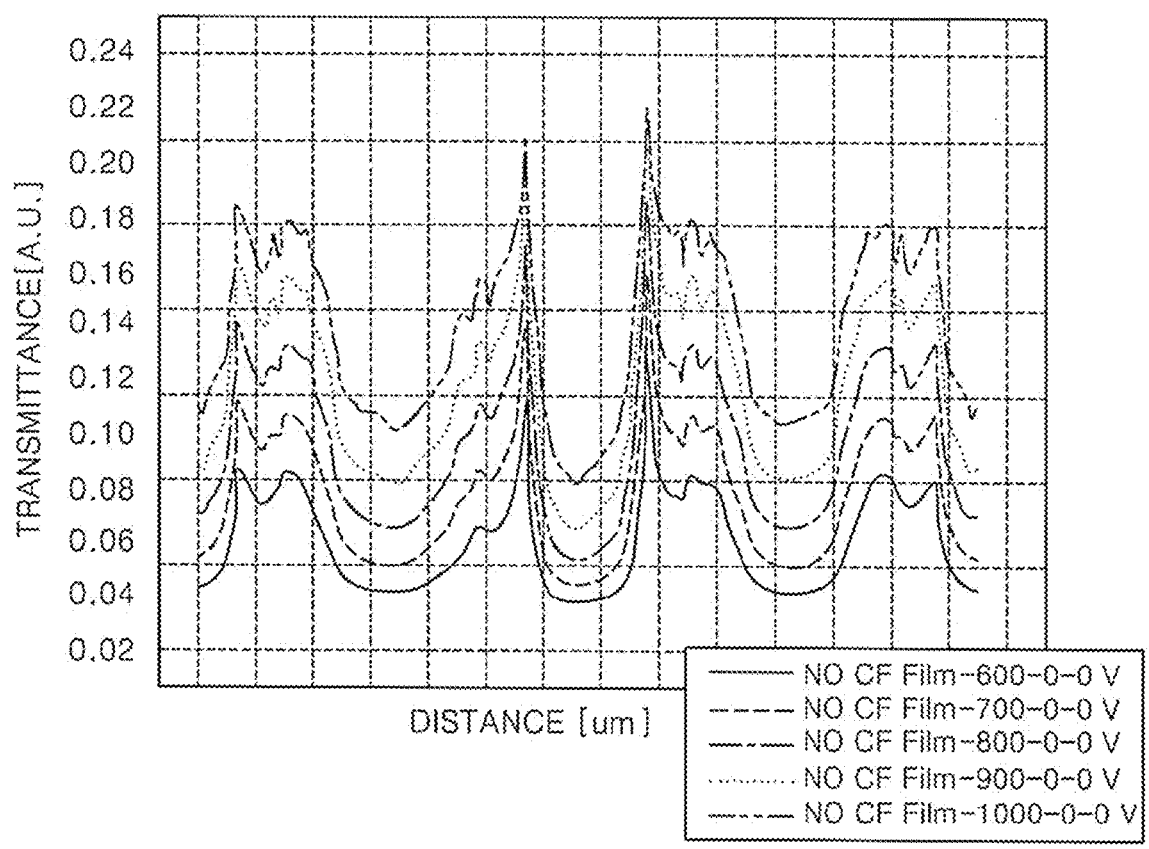
Figure 40:
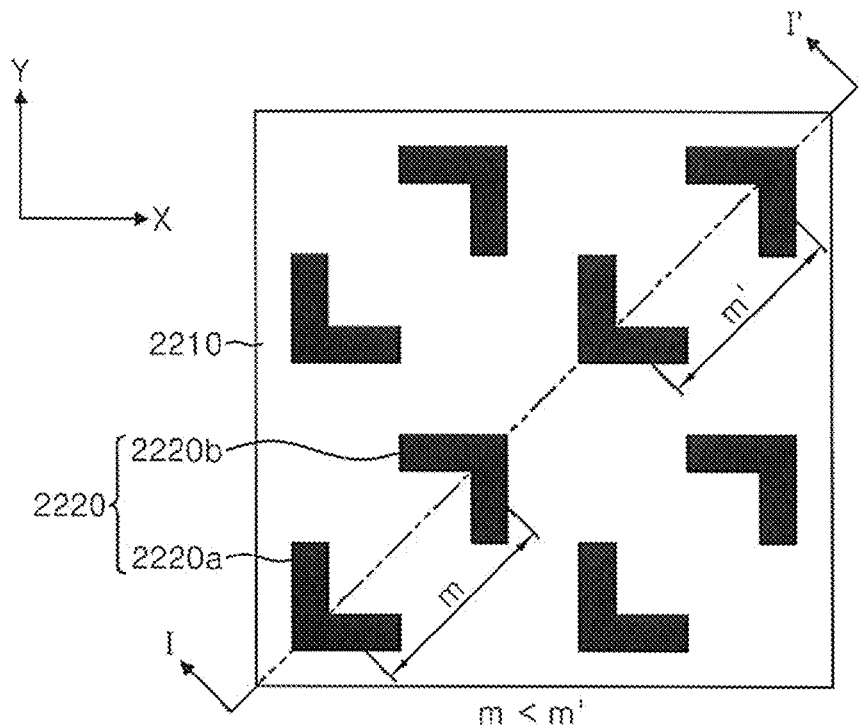
Figure 40:
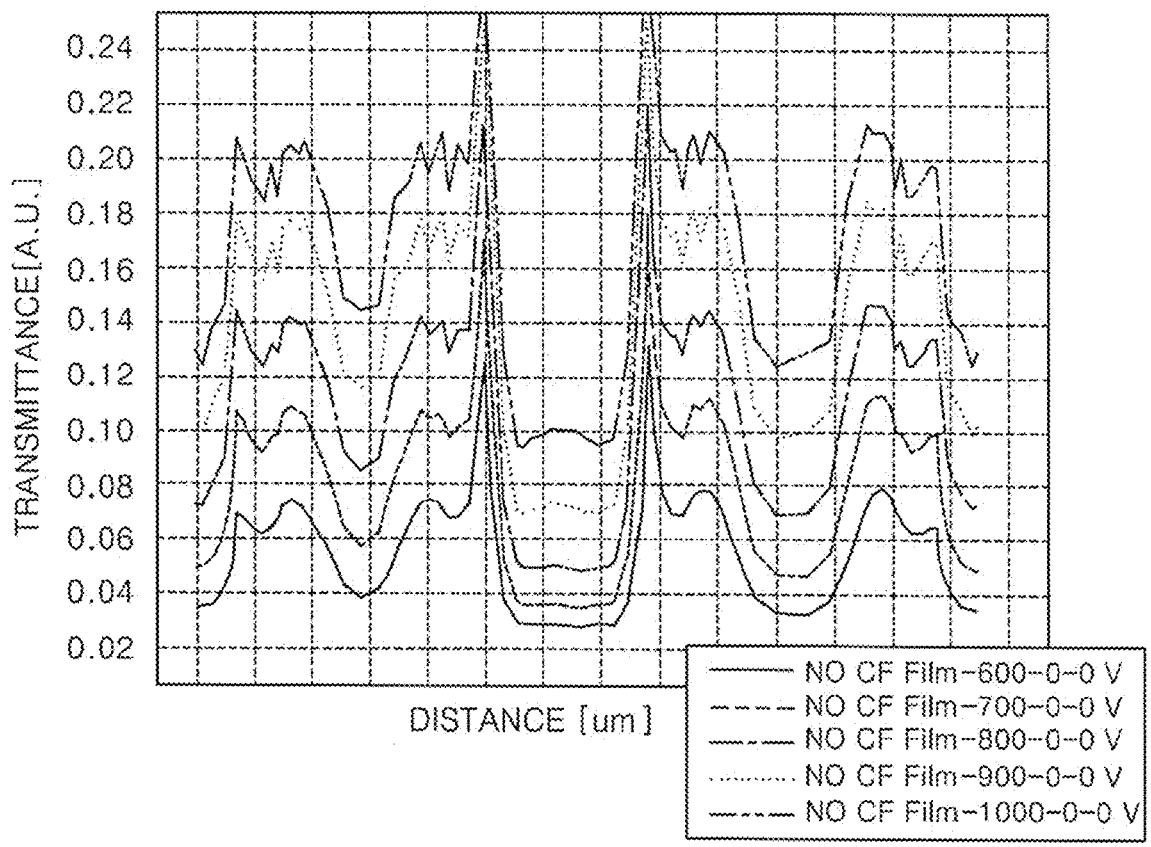

FIGS. 39 and 40 are views illustrating a method of testing a defect in a tester, each of which includes a graph illustrating a simulation result of the method, according to an exemplary embodiment of the present invention where in a socket for a BGA testing device has been simulated, the simulation has been applied to a socket for a BGA testing device.

The simulation shows a relationship of the transmittance with respect to the distance from the probing pin when a bias voltage is applied between the detector 2110 and the tester 2200, ranging from 600V to 21000V.

FIG. 39 shows a case where there is a difference in height between the probing pins arranged a long the line I-I'.

Referring to FIG. 39, the probing pin 2220 consists of a first sub pin 2220a and a second sub pin 2220b. In a case where the second sub pin 2220b is lower in height than the first sub pin 2220a, it can be seen that the transmittance of light passing through the polarizing plate is lowered at the top side of the sub pin 2220b.

That is, in contrast that the sub pin 2220a whose height is normal has a constant transmittance (approximately 0.25 a.u.), the abnormal sub pin 2220b with a lower height has a transmittance (approximately 0.22 a.u.) lower than the sub pin 2220a with a normal height.

The transmittance of the sub pin 2220a shows two peaks and one valley because the electric field is stronger at edges of the sub pins 2220a and 2220b than at its center.

The transmittance between the probing pins 2220 is considerably high (approximately 0.31 a.u.) because interference occurs between the edges facing each other.

FIG. 10 illustrates a case where there is a difference in interval between the first sub pin and the second sub pin arranged a long the line I-I.

Referring to FIG. 40, in a case where an interval (m) between the first sub pin 2220a and the first sub pin 2220b is narrower than a normal interval (m') between the sub pins, it can be seen that a difference may occur in interval between two neighboring peaks of the transmittance.

That is, the interval (m) between two neighboring peaks of the transmittance appearing on the probing pin 221, where the interval between the first sub pin 2220a and the second sub pin 2220b is narrower than the normal interval, is narrower than the interval (m') between two neighboring peaks of the transmittance appearing on the normal probing pin 221.

This is why the liquid crystal molecules feel different in intensity of electric field at a probing pin 2220 including sub pins 2220a and 2220b having the same height or the same interval with the adjacent sub pins and at another probing pin 2220 including sub pins 2220a and 2220b having the different height or different interval which the adjacent sub pins, and therefore, the alignment structure of the liquid crystal molecules may be changed.

Since the upper and lower substrates 2111 and 2114, the liquid crystal layer 2112, and the polarizing plate 2115 that constitute the detector 2110 have a thickness of a few micrometers, the detector 2110 may be deformed by external impacts or environment. To prevent this, the detector 2110 may further include a glass block (not shown). The glass block may be located over the detector 2110.

Figure 41:
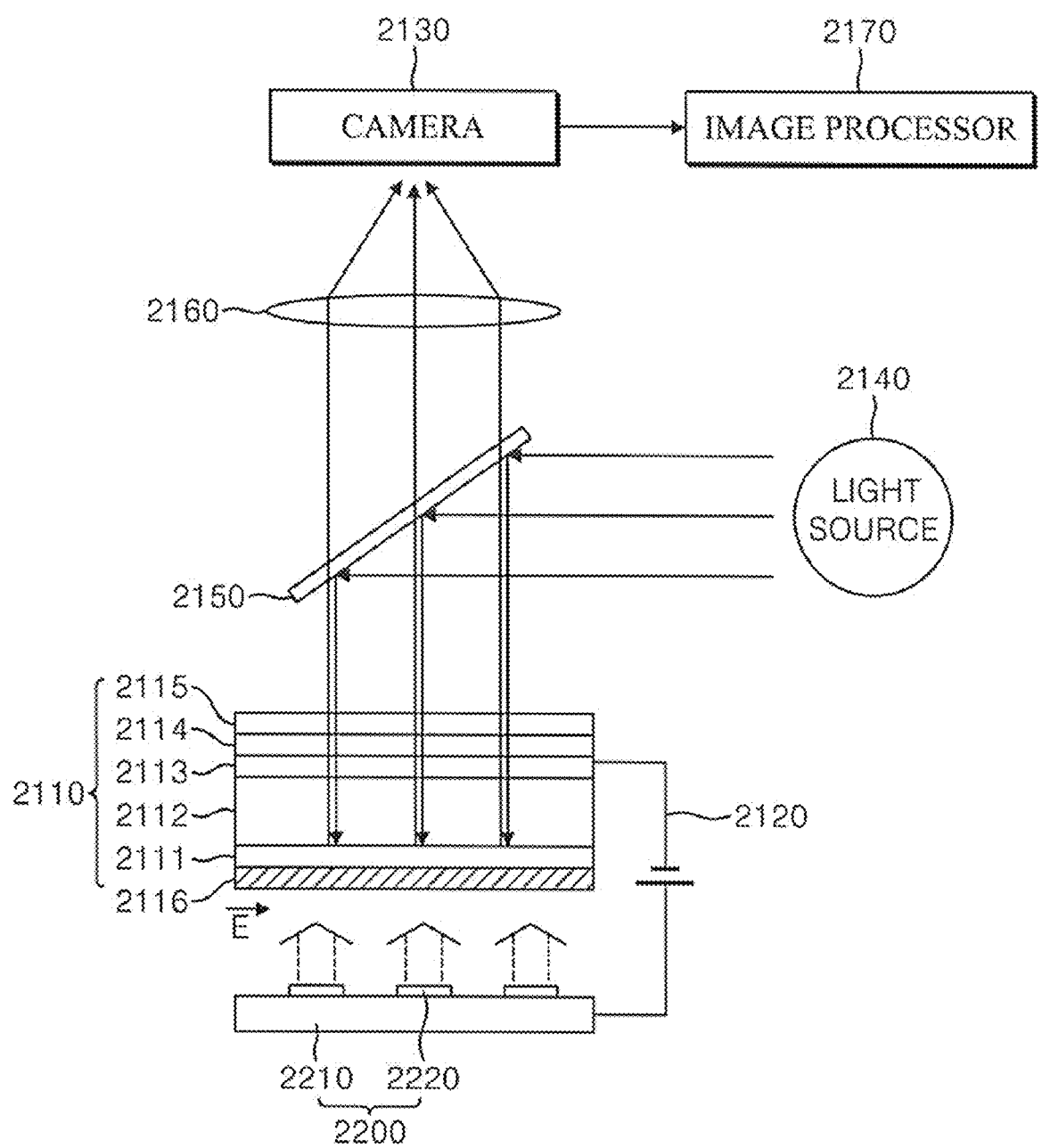
FIG. 41 is a view illustrating a tester testing device according to an eleventh exemplary embodiment of the present invention.

FIG. 41 is a view illustrating a tester testing device according to an eleventh exemplary embodiment of the present invention.

Referring to FIG. 41, a tester testing device 2100 may include a detector 2110, a power supply 2120, a light source 2140, and a camera 2130.

The detector 2110 includes an upper substrate 2114 and a lower substrate 2111.

A liquid crystal layer 2112 is located between the upper substrate 211 and the lower substrate 2111, and a transparent electrode 2113 is located between the upper substrate 2114 and the liquid crystal layer 2112.

One of two electrodes of the power supply 2120 is connected to the detector 2110 and the other is connected to the tester 2200.

More specifically, a first electrode of the power supply 2120 is connected to the transparent electrode 2113 and a second electrode is connected to the contact pins 2220 or base 2210.

The detector 2110 may further include a polarizing plate 2115 on the upper substrate 2114 and a reflecting plate 2116 under the lower substrate 2111.

The light emitted from the light source 21410 passes through the polarizing plate 2115 and the liquid crystal layer 2112, and is reflected by the reflecting plate 2116. The reflected light passes through the liquid crystal layer 2112 and the polarizing plate 2115 to the camera 2130.

The testing device 2100 may include a beam splitter 2150 to separate the path of the light reflected by the detector 2110 from the path of die light incident onto the detector 2110.

The beam splitter 2150 may be designed so that one of the incident light and the reflected light is totally reflected and the other is transmitted.

The beam splitter 2150 may be located over the detector 2110.

The beam splitter 2150 reflects the light emanating from the light source 2140 onto the detector 2110 and directs the light reflected by the detector 2110 toward the camera 2130.

A lens 2160 may be further provided between the detector 2110 and the camera 2130. The camera 2130 may be connected to an image processor 2170 that may convert electrical signals into an image.

The image processor 2170 image-processes an image of the detector 2110 captured by the camera 2130 and determines whether or not there are defects by comparing the image-processed images to each other manually or automatically.

The comparison may be done by comparing the image processed results to each other or a preset normal value.

Figure 42:
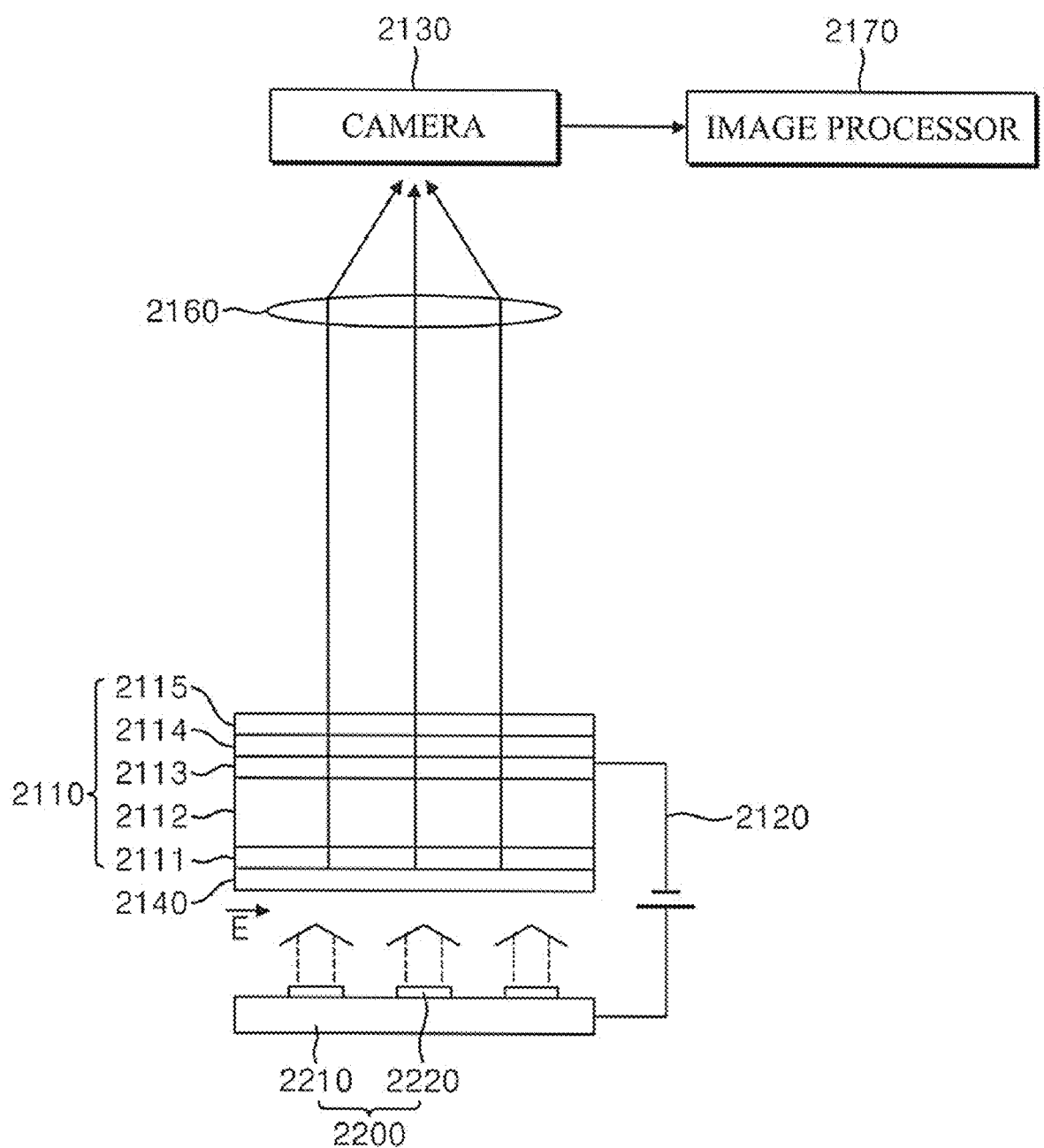
FIG. 42 is a view illustrating a tester testing device according to a twelfth exemplary embodiment of the present invention.

FIG. 42 is a view illustrating a tester testing device according to a twelfth exemplary embodiment of the present invention.

Referring to FIG. 42, the tester testing device 2100 may include a detector 2110, a power supply 2120, a light source 2140, and a camera 2130.

The detector 2110 includes an upper substrate 2114 and a lower substrate 2111.

A liquid crystal layer 2112 is located between the upper substrate 2114 and the lower substrate 2111, and a transparent electrode 2113 is located between the upper substrate 2114 and the liquid crystal layer 2112.

One of two electrodes of the power supply 2120 is connected to the detector 2110 and the other is connected to the tester 2200.

More specifically, a first electrode of the power supply 2120 is connected to the transparent electrode 2113 and a second electrode is connected to the contact pins 2220 or base 2210.

The detector 2110 may further include a polarizing plate 2115 under the liquid crystal layer 2112.

The light source 21140 is located under the detector 2110. Light emitted from the light source 2140 passes through the liquid crystal layer 2112 and the polarizing plate 2115 to the camera 2130.

A lens 2160 may be further provided between the detector 2110 and the camera 2130. The camera 2130 may be connected to an image processor 2170 that may convert electrical signals into an image.

The image processor 2170 image-processes an image of the detector 2110 captured by the camera 2130 and determines whether or not there are defects by comparing the image-processed images to each other manually or automatically. This detection may be done at a time by an electrical method using a number of probing pins, thus make it possible to provide a good repetitive reproduction.

Figure 43:
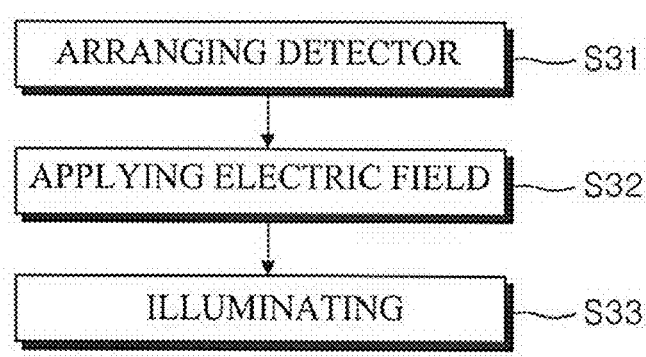
FIG. 43 is a flowchart illustrating a method of testing a defect in a tester according to an exemplary embodiment of the present invention.

FIG. 43 is a flowchart illustrating a method of testing a defect in a tester according to an exemplary embodiment of the present invention.

Referring to FIG. 43, the method may include arranging of a detector (S31), applying of an electric field (S32), and illuminating (S33).

The step (S31) includes arranging a detector including a transparent electrode, a polarizing plate, and a liquid crystal layer over the tester having a plurality of probing pins.

The probing pin may be implemented in a needle type, a blade type, a film type, a hybrid type, a fogo type, and a mems type.

The needle type probing pin may be made using a rhenium tungsten wire as a base member. The blade type probing pin may be made of nickel or beryllium as a base member. The film type probing pin may be made by etching a copper plate or other conductive members placed on a polyimide film. The hybrid type probing pin may be made by inserting a conductive medium into a film type probing pin using a semiconductor process. The fogo type probing pin may be made with a fogo pin using tension. The mews type probing pin may be made using a mems process.

The step (S32) includes applying an electric field between the probing pins and the transparent electrode by connecting the transparent electrode of the detector to the tester via a power supply.

The liquid crystal molecules contained in the liquid crystal layer may rotate at a prescribed angle by the electric field, wherein the rotation angle may be dependent on the state of the probing pins.

The step (S33) includes illuminating the detector to indicate the locating corresponding to the probing pins onto the detector.

In the above process, it can be possible to determine the location of the probing pins, distance between the probing pins and height of the tip of the probing pin from the difference in brightness of light having passed along the rotation angle and detect the distortion of the probing pins from the shape of the indicated part of the detector.

Figure 44:
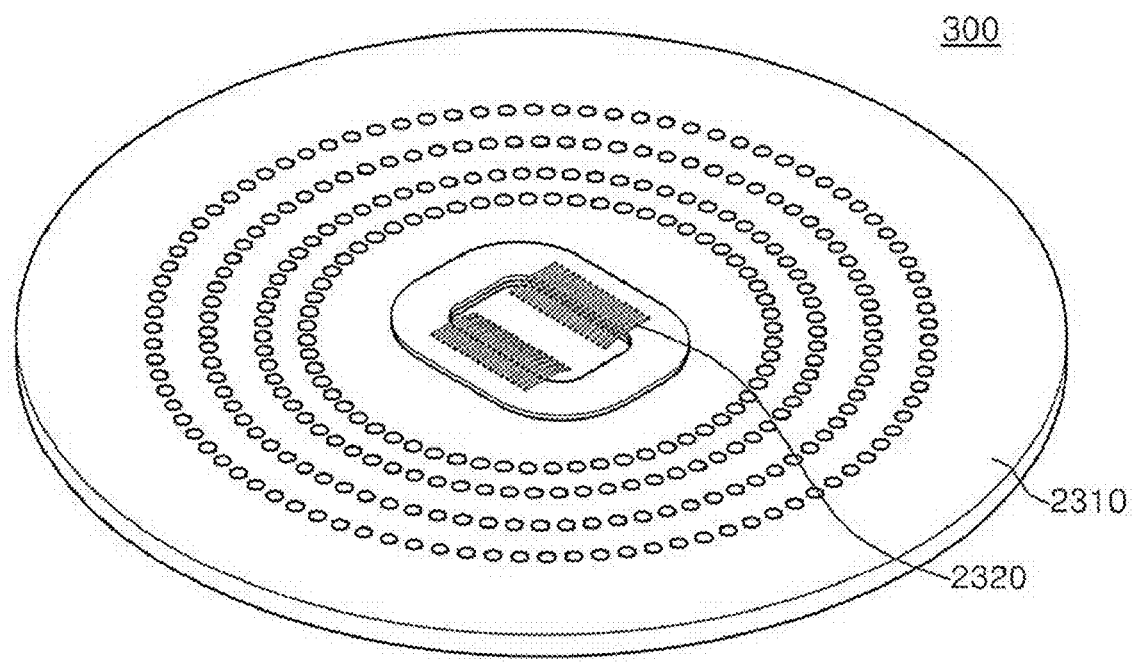
FIGS. 44 to 46 are views illustrating a method of detecting a defect in a semiconductor tester.
Figure 45:
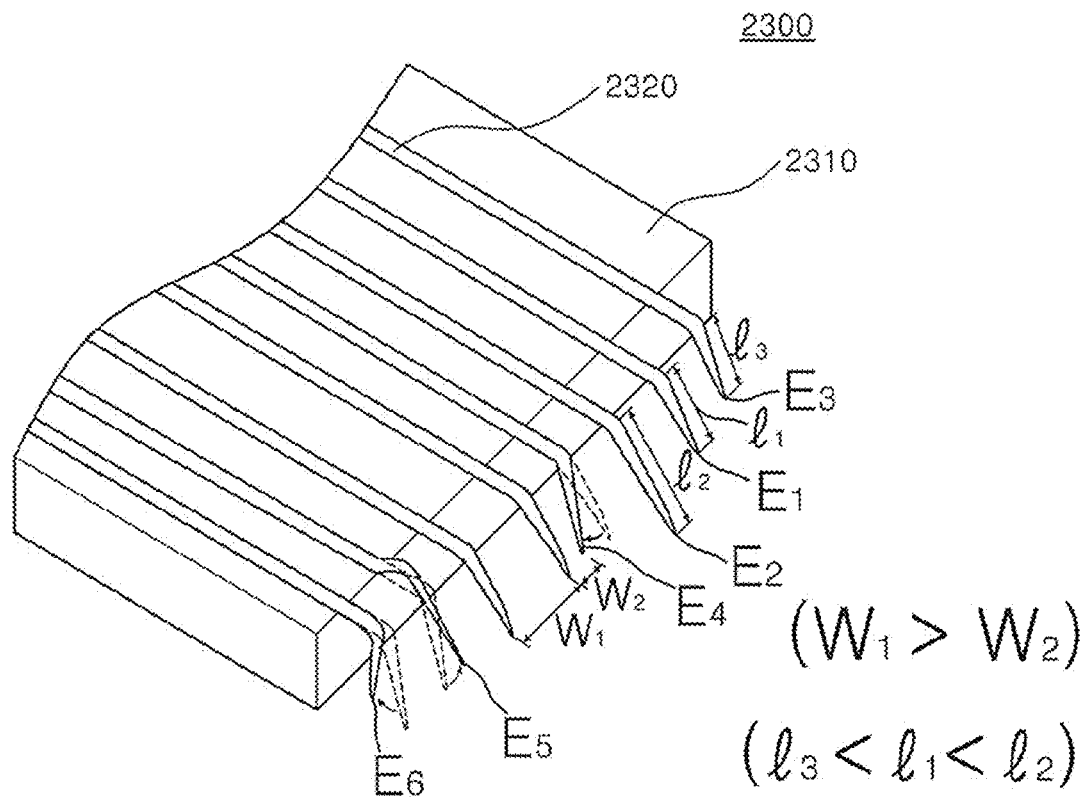
Figure 46:
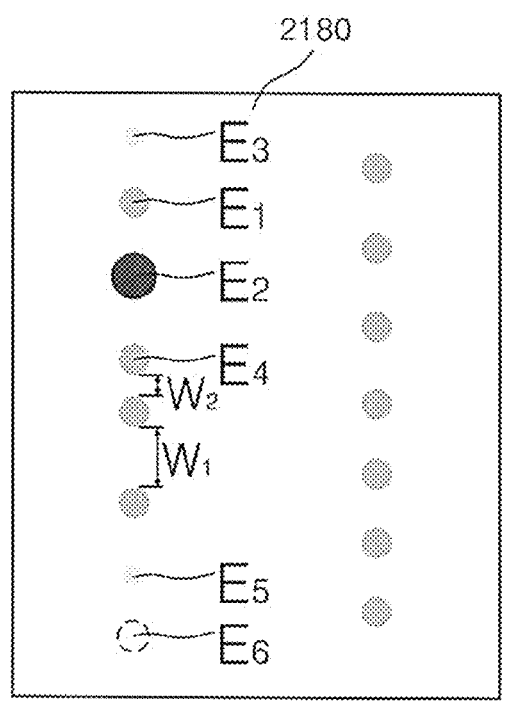

FIGS. 44 to 46 are views illustrating a method of detecting a defect in a semiconductor tester. FIG. 44 is a view illustrating a probe card for semiconductor test. FIG. 45 is a view illustrating defect patterns of the probing pins prepared in the probe card. FIG. 46 is a view illustrating a test result of the probing pins.

Referring to FIG. 44, a plurality of probing pins are arranged opposite to each other on a printed circuit board 2310 as the probe card 2300 for semiconductor test.

An end of the probing pin 2320 is bent toward a side to contact an electrode pad (not shown) of a semiconductor under test.

Referring to FIG. 45, the probing pins are arranged on the printed circuit board 2310 to have a constant interval between them and a constant height. The probing pins 2320 may frequently change in shape during the manufacturing process of the probe card 2300 or other operating processes.

More specifically, some of probing pins 2320 may be deformed to have a shorter interval (W2) or longer interval, or shorter tip (E2) or longer tip (E3) than that of normal probing pins 2320.

In addition, some of the probing pins 2320 are bent in upper and lower direction, so that the bent part may be lifted upward (E5) or lowered downward (E6).

The above types of defects may occur during manufacturing of the probe card 2300. The defects may also occur due to bending or damage of the probing pins 2320 caused by contacting with the electrode pad.

Referring to FIG. 46, the state of the probing pins 2320 may be represented as dots on the screen of the testing device depending on whether the state is normal or abnormal.

Image patterns formed by the abnormal probing pins 2320 may include an abnormality in distance length of tip, and location.

The abnormality in distance means a case where the distance W2 between abnormal probing pins 2320 is larger or smaller than the distance W1 between normal probing pins 2320.

In a case where the distance between the probing pins 2320 is larger than the normal distance, the distance between the dot patterns may appear larger than the normal distance W1, and otherwise smaller W2 than the normal distance W1.

The abnormality in length of tip means some of probing pins 2320 show longer length E2 or shorter length E3 than the normal length E1.

If the length of the probing pin 2320 is longer than the normal length, the intensity of electric field increases between the probing pin 2320 and the liquid crystal layer, and therefore, the color of the pin becomes dark, the dot pattern E2 having broader periphery may appear, and otherwise, the color of the pin becomes light, and the dot pattern E3 having narrower periphery may appear.

The abnormality in location means the bent parts of some of the probing pins are lifted upward E1 or lowered downward E6.

If the probing pins 2320 are lifted upward E5, the area in which the probing pin contacts the electrode pad of the semiconductor is smaller or weaker, so that the dot pattern may have light color or have a narrower periphery.

If the probing pins 2320 are lowered downward, the probing pin anti the electrode pad of the semiconductor fail to contact each other, so that there are no imaged dot patterns.

Figure 47:
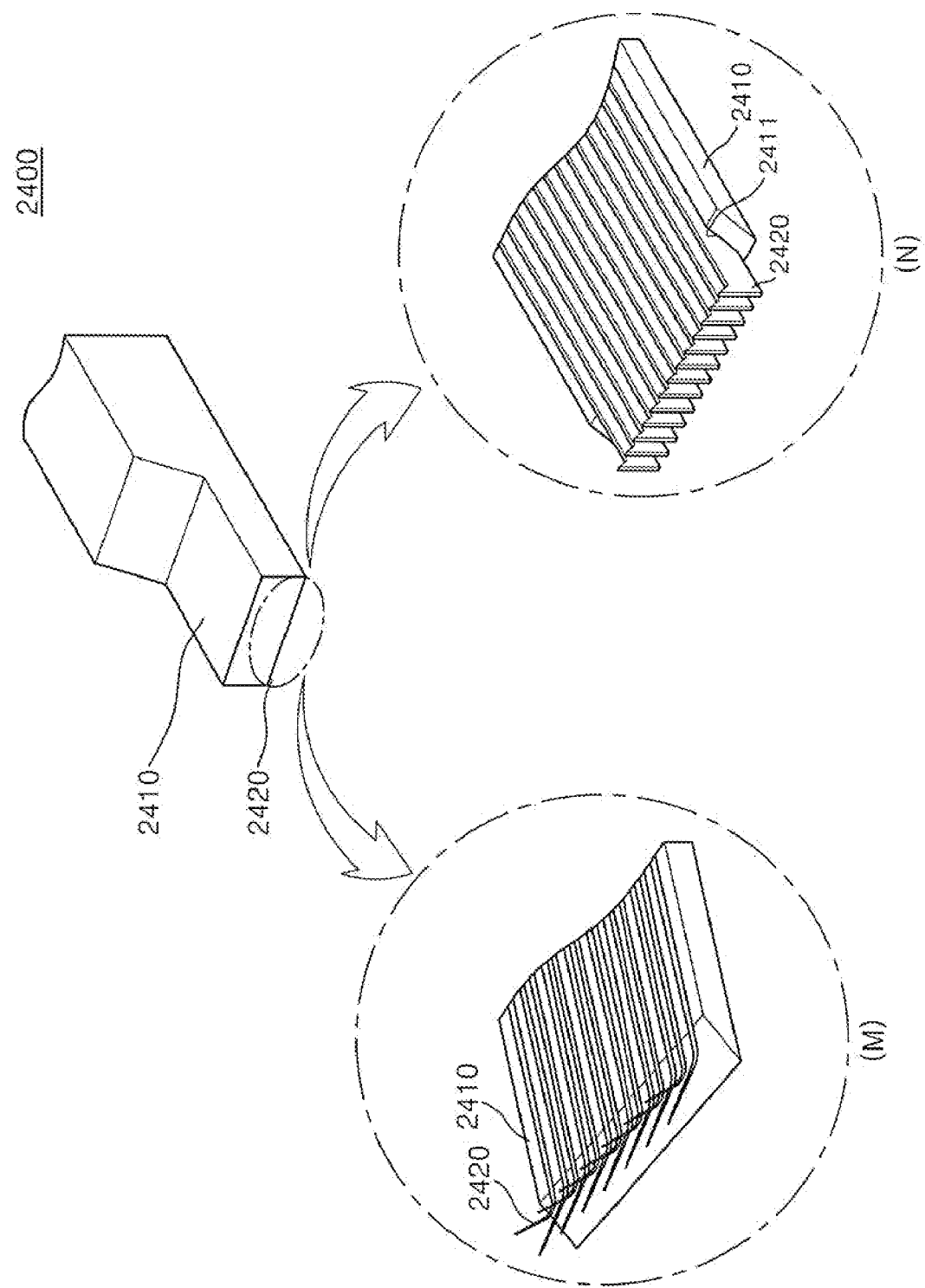
FIGS. 47 to 49 are views illustrating a method of detecting a defect in a display tester.
Figure 48:
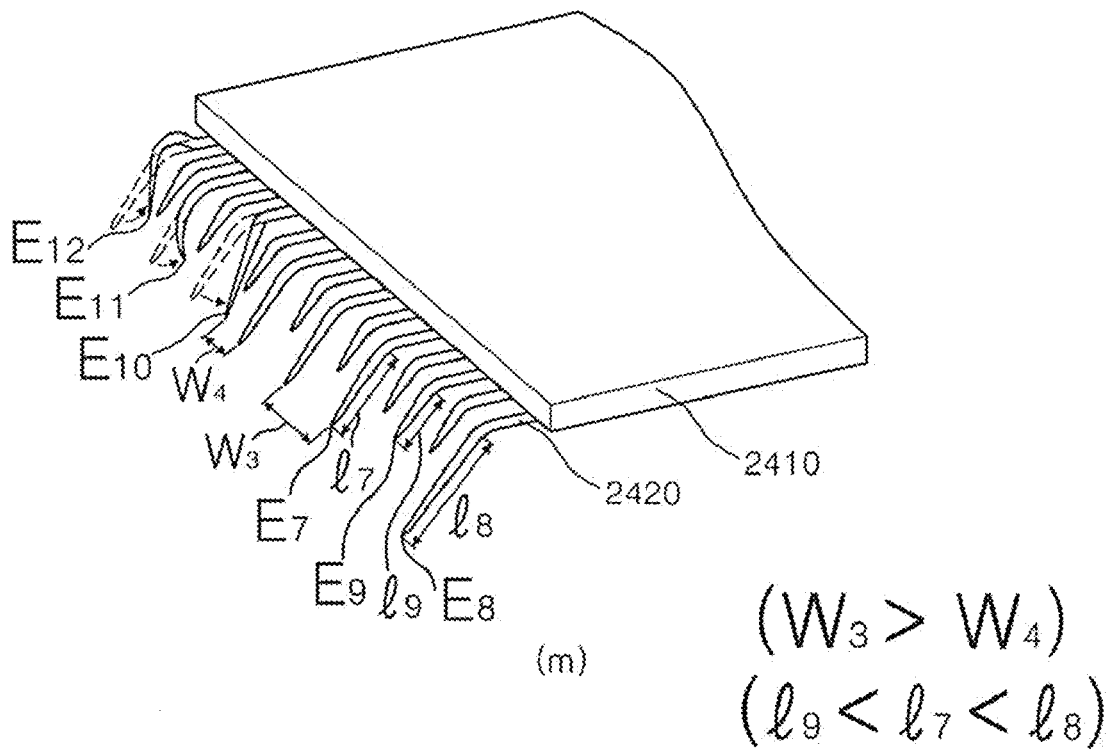
Figure 48:
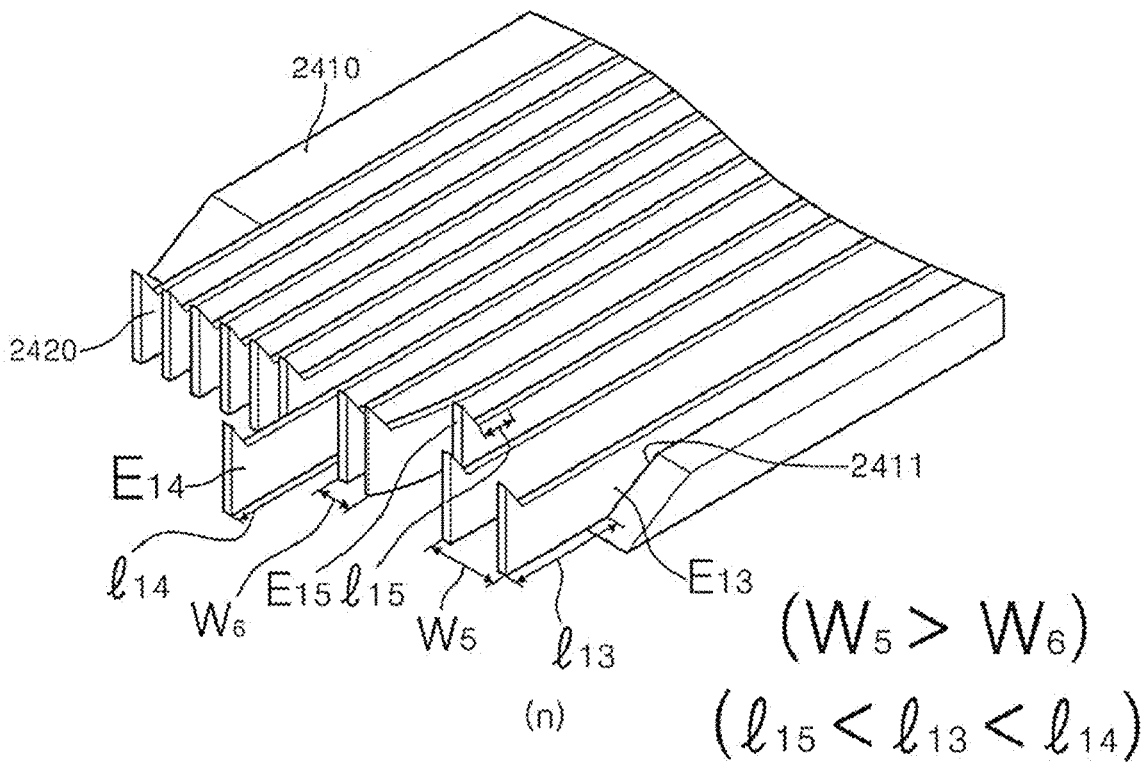
Figure 49:
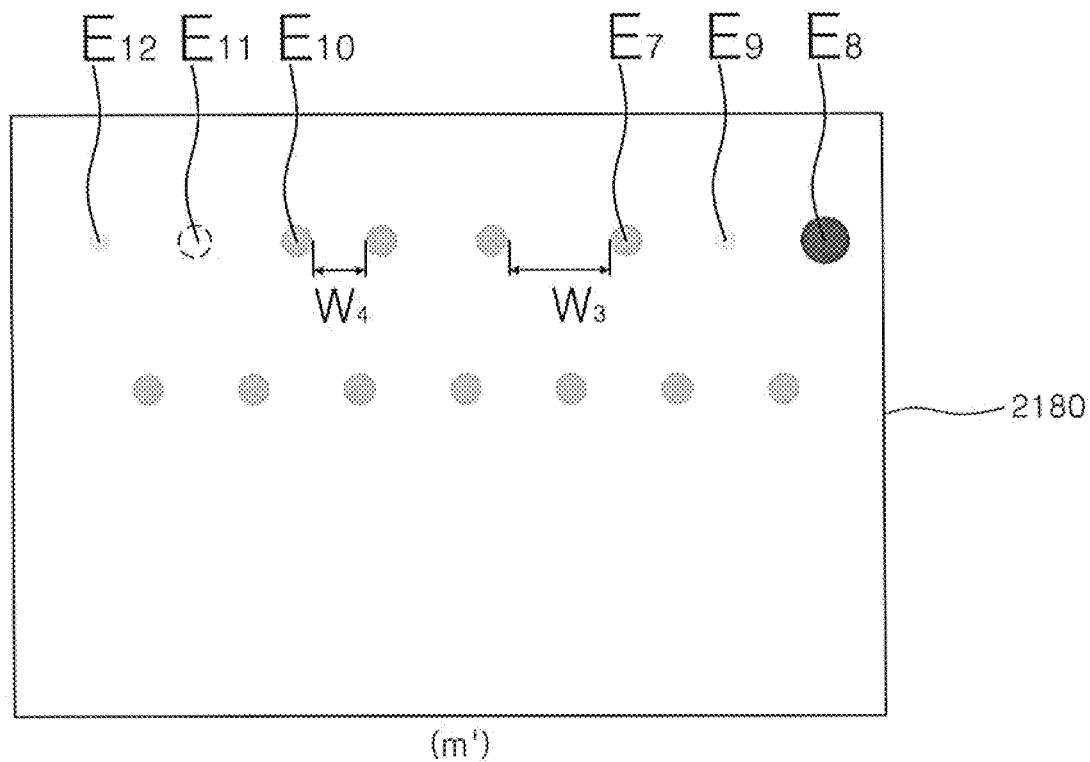
Figure 49:
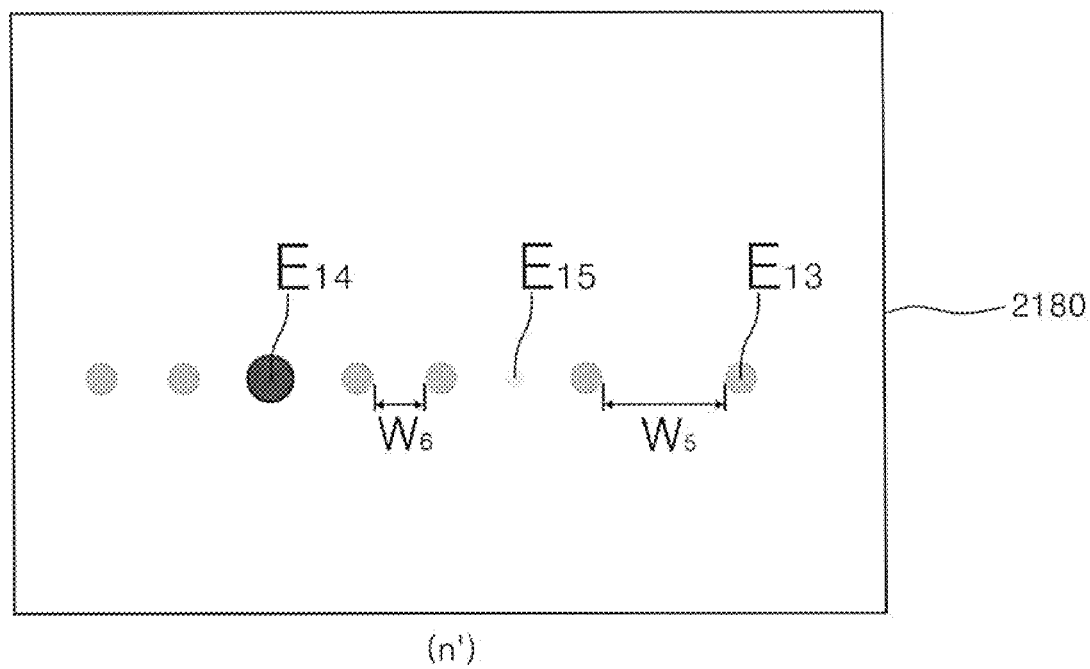

FIGS. 47 to 49 are views illustrating a method of detecting a defect in a display tester. FIG. 47 is a view illustrating a probe on it for testing a displaying device. FIG. 48 is a view illustrating defect patterns of the probing pins prepared in the probe unit. FIG. 49 is a view illustrating a test result of the probing pins.

Referring to FIG. 47, the tester for examining the defects in a displaying device may be a probe unit 2400, which may include a probe block 2410 and a plurality of probing pins 2420 coupled with the probe block 2410.

The probing block may be implemented in a needle type M1 or blade type N. In the needle type probing pin, the probing pins 2420 may be inserted into the slits 2411 arranged at a constant interval.

In the needle type M probing pin, the odd-numbered probing pins may be different in the degree of bending from the even-numbered probing pins 2420 to prevent the probing pin from contacting the adjacent probing pin when the probing pins 2420 are coupled with the an electrode pad (not shown).

The probing pins 2420 may be properly connected to the electrode pad only when the probing pins, respectively, have a constant interval between them and a constant tip height.

Referring to FIG. 48. FIG. 48(*m*) shows defect patterns in a needle type probing pin, and FIG. 48(*n*) shows defect patterns in a blade type probing pin.

The defect patterns in the needle type probing pin may include an abnormality in length, distance, and location.

The abnormality in length may include a case where some of probing pins are lengthened E8 or shortened E9 in length than the normal probing pins.

The abnormality in distance may include a case where the probing pin 2420 is bent horizontally to be close W1 to the adjacent probing pin 2420 or the probing pin 2420 is lengthened.

The abnormality in location may include a case where the bent part of the probing pin is lifted upward E12 or lowered downward E11.

In the blade type n probing pin, the defect pattern may include a case where the probing pin is lengthened E14 or shortened E15 in length than the normal length E13 of the probing pin, or a part of the probing pin which contacts the electrode pad is bent horizontally to be closer W6 to the adjacent probing pin than that W5 of the normal probing pin.

The defect patterns of the probing pin 2420 may occur during the manufacturing process or test period for the displaying device.

Referring to FIG. 49, the state of the probing pins 2420 may appear as dots on the screen of the testing device depending on whether the state is normal or abnormal. FIG. 49(*m'*) shows a needle type of probing pin, and FIG. 49(*n'*) shows a blade type of probing pin.

In both, if some probing pins 2420 are bent to be close to the adjacent probing pin W4 and W6, the distance between the dots may appear closer than the normal state W3 and W5.

In a case where some of the probing pins 2420 are longer E8 and E14 in length than the normal state E7 and E13, the imaged dots may have thicker and broader periphery due to the increase in intensity of the electric field between the probing pin 2420 and the detector.

In a case where some of the probing pins 2420 are shorter E9 and E15 in length than the normal state E7 and E13, the imaged dots may have thicker and broader periphery due to the decrease in intensity of the electric field between the probing pin 2420 and the detector.

In a case where some probing pins 2420 are lifted upward E12, the dot patterns imaged as the probing pins whose length has been shortened E9 may have a dim, narrow periphery.

In a case where other probing pins 2420 are lowered downward E11, no dot patterns may be imaged because the probing pins fail to contact the electrode pad.

The defect patterns and imaged dot patterns of the probing pins 2320 and 21420 have been exemplified only as an example, and not limited thereto.

As mentioned above, it can be possible to test a tester such as a probe card or probe unit before testing a semiconductor or displaying device, thus making it possible to appropriately examine the semiconductor or displaying device.

That is, it can be possible to determine whether or not there is abnormality in distance between the probing pins or height of tip in the probing pins of the probe card or the probe unit.

[Industrial Applicability]

The present invention may be used to determine whether or not there are defects in parts be longing to a variety of electronics, such as pixels in a displaying device, wires in a printed circuit board, wires in a ball grid array package, and solder balls, as well as a tester for testing a semiconductor device and a displaying device.

The invention claimed is:

1. An electro-optical inspecting method using a detector comprising: an upper substrate and a lower substrate; a nematic liquid crystal layer interposed between the upper substrate and the lower substrate; a transparent electrode interposed between the nematic liquid crystal layer and the upper substrate; a polarizing plate located over the nematic liquid crystal layer; and a reflecting plate located under the nematic liquid crystal layer, the method comprising the steps of:

generating an electric field across the liquid crystal layer by applying a voltage between the transparent electrode and a device under test (DUT);

illuminating the detector and acquiring an image of the detector created by light reflected by the detector; and if the image of the detector is created by an abnormal electric field generated between the transparent electrode and the DUT, determining that the image indicates there is a defect on the DUT.

2. An interconnect defect inspecting method using a detector comprising: an upper substrate and a lower substrate; a nematic liquid crystal layer interposed between the upper substrate and the lower substrate; a transparent electrode interposed between the nematic liquid crystal layer and the upper substrate; a polarizing plate located over the nematic liquid crystal layer; and a reflecting plate located under the nematic liquid crystal layer, the method comprising the steps of:

(1) generating an electric field between the detector and a device under test (DUT) to drive liquid crystal molecules in the liquid crystal layer;

(2) illuminating the driven liquid crystal molecules with light;

(3) converting the light having passed through the liquid crystal molecules into an electrical signal; and (4) comparing the electrical signal to determine a wiring defect, wherein the steps (1) to (4) are performed while the detector is moved in a first direction.

3. The interconnect defect inspecting method of claim 2, wherein a part of an interconnect which is determined to have a defect is separated into sub parts, and the steps (1) to (4) are performed again on each of the sub parts.

4. The interconnect defect inspecting method of claim 3, wherein the steps (1) to (4) are performed again on each of the sub parts, while the detector is moved in a second direction perpendicular to the first direction.

5. The interconnect defect inspecting method of claim 2, wherein the step (4) comprises, image-processing the electrical signal into data, and determining there is a defect by comparing the data.

6. The interconnect defect inspecting method of claim 5, wherein said comparing is performed to find some data which have a difference from the other out of the entire data.

7. The interconnect defect inspecting method of claim 5, wherein said comparing is performing with respect to a predetermined reference value.

8. A ball grid array package inspecting method using a detector comprising: an upper substrate and a lower substrate; a nematic liquid crystal layer interposed between the upper substrate and the lower substrate; a transparent electrode interposed between the nematic liquid crystal layer and the upper substrate; a polarizing place located over the nematic liquid crystal layer; and a reflecting plate located under the nematic liquid crystal layer, the method comprising the steps of:
  applying electricity across a probe unit connected between the transparent electrode and a solder bump;
  generating an electric field between the solder bump and the transparent electrode;
  illuminating liquid crystal molecules driven by the electric field with light;
  capturing the light by a camera to convert the light into an electrical signal;
  converting the electrical signal into a digital signal and then an image; and
  determining at least one of a height and a shape of the sold bump from the converted image.

9. The interconnect defect inspecting method of claim 8, wherein
  in said determining at least one of a height and a shape of the sold bump, a measured brightness is recalculated as a height.

10. The interconnect defect inspecting method of claim 8, wherein
  at least one of a short circuit and an open circuit is determined in an interconnect patterned in a printed circuit board through the converted image.

11. The interconnect defect inspecting method of claim 8, wherein
  the solder bump is directly connected to a pad of a semiconductor chip in a flip chip package.

12. A circuit board inspecting method using a detector comprising: an upper substrate and a lower substrate; a nematic liquid crystal layer interposed between the upper substrate and the lower substrate; a transparent electrode interposed between the nematic liquid crystal layer and the upper substrate; a polarizing place located over the nematic liquid crystal layer; and a reflecting plate located under the nematic liquid crystal layer, the method comprising the steps of:
  loading on a testing socket a circuit board, the circuit board having a plurality of contact pads and a plurality of terminals connected to the contact pads via interconnects;
  loading the detector on the circuit board;
  determining a detection order for the terminals of the circuit board and applying a test voltage to the terminals and a common voltage to the transparent electrode; and
  detecting interconnects of the circuit board using the image of the detector displayed by an electric field between the transparent electrode and the contact pads.

13. The interconnect defect inspecting method of claim 12, wherein
  a reference image according to a connecting relation between the terminals and the contact pads is set using a design circuit, wherein
  the image of the detector is compared with the reference image, a part which exists in the reference image but not in the image of the detector is determined to have a short circuit, and
  a part which exists in the image of the detector but not in the reference image is determined to have a short circuit.

14. The interconnect defect inspecting method of claim 13, wherein
  in the detecting order, the test voltage is sequentially applied to the terminals.

15. The interconnect defect inspecting method of claim 13, wherein
  in the detecting order, the terminals are divided into a plurality of groups, and the test voltage is sequentially applied to the groups, wherein the test voltage is simultaneously applied to the terminals contained in each group.

16. The interconnect defect inspecting method of claim 12, wherein
  the circuit board is a BGA board, wherein the interconnects of the circuit board are detected before or after a solder ball is formed on a ball land of the BGA board.

17. The interconnect defect inspecting method of claim 12, wherein
  the circuit board is a printed circuit board on which a semiconductor module is mounted, and the terminal is a connection terminal to connect the printed circuit board to an external device.

18. A tester defect inspecting method using a detector comprising: an upper substrate and a lower substrate; a nematic liquid crystal layer interposed between the upper substrate and the lower substrate; a transparent electrode interposed between the nematic liquid crystal layer and the upper substrate; a polarizing plate located over the nematic liquid crystal layer; and a reflecting plate located under the nematic liquid crystal layer, the method comprising the steps of:
  arranging the detector on a tester having a plurality of probing pins;
  generating an electric field between the probing pins and the transparent electrode to rotate liquid crystal molecules in the nematic liquid crystal layer; and
  displaying on the detector locations corresponding to the probing pins by light passing through the detector.

19. The interconnect defect inspecting method of claim 18, wherein
  a height of the probing pin is measured by a difference in brightness of the detector according to a distance between the transparent electrode and the probing pin.

20. The interconnect defect inspecting method of claim 18, wherein
  a distortion of the probing pin is detected from a shape of what is displayed on the detector.

21. The interconnect defect inspecting method of claim 18, wherein
  the probing pin is one of a socket electrode for examining a semiconductor, a probe of a probe card for examining a semiconductor, and a probe of a probe unit for examining a displaying device, wherein
  a location of a tip of the probing pin is examined using an image displayed on the detector by an electric field between the transparent electrode and the probing pins.

22. The interconnect defect inspecting method of claim 21, wherein
  the probe is implemented in at least one of a needle type, a blade type, and an MEMS type.

23. The interconnect defect inspecting method of claim 21, wherein
  a probing pin is detected, whose tip height is different from another probing pin having a normal tip height using the brightness of an image displayed on the detector.

24. The interconnect defect inspecting method of claim 21, wherein
  a probing pin which is abnormally bent is detected using a shape of the image.

* * * * *